United States Patent
Lomayev et al.

(10) Patent No.: US 11,533,087 B2
(45) Date of Patent: *Dec. 20, 2022

(54) APPARATUS, SYSTEM AND METHOD OF COMMUNICATING A PHYSICAL LAYER PROTOCOL DATA UNIT (PPDU)

(71) Applicant: INTEL IP CORPORATION, Santa Clara, CA (US)

(72) Inventors: Artyom Lomayev, Nizhny Novgorod (RU); Claudio Da Silva, Portland, OR (US); Michael Genossar, Modiin (IL); Alexander Maltsev, Nizhny Novgorod (RU); Carlos Cordeiro, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 37 days.

This patent is subject to a terminal disclaimer.

(21) Appl. No.: 17/028,309

(22) Filed: Sep. 22, 2020

(65) Prior Publication Data

US 2021/0006308 A1 Jan. 7, 2021

Related U.S. Application Data

(63) Continuation of application No. 16/753,343, filed as application No. PCT/US2018/052998 on Sep. 27, 2018.

(Continued)

(51) Int. Cl.
*H04B 7/0456* (2017.01)
*H04B 7/06* (2006.01)
(Continued)

(52) U.S. Cl.
CPC ......... *H04B 7/0456* (2013.01); *H04B 7/0619* (2013.01); *H04B 7/0678* (2013.01);
(Continued)

(58) Field of Classification Search
CPC .. H04B 7/0456; H04B 7/0619; H04B 7/0678; H04B 7/0689; H04L 1/0008;
(Continued)

(56) References Cited

U.S. PATENT DOCUMENTS

| | | |
|---|---|---|
| 3,437,440 A1 | 5/2013 | Zhang et al. |
| 9,100,074 B1 | 8/2015 | Zhang et al. |

(Continued)

FOREIGN PATENT DOCUMENTS

| | | |
|---|---|---|
| WO | 2016/175943 | 11/2016 |
| WO | 2017044420 | 3/2017 |
| WO | WO-2018216922 A1 * | 11/2018 |

OTHER PUBLICATIONS

Office Action for U.S. Appl. No. 16/626,555, dated May 17, 2021, 50 pages.

(Continued)

*Primary Examiner* — Habte Mered
(74) *Attorney, Agent, or Firm* — Shichrur & Co.

(57) ABSTRACT

For example, an EDMG STA may generate an LDPC coded bit stream for a user based on data bits for the user in an EDMG PPDU, the LDPC coded bit stream for the user including a concatenation of a plurality of LDPC codewords, a count of the plurality of LDPC codewords is based at least on a codeword length for the user and on a code rate for the user; generate encoded and padded bits for the user by concatenating the LDPC coded bit stream with a plurality of coded pad zero bits, a count of the coded pad zero bits is based at least on a count of one or more spatial streams for the user and on the count of the plurality of LDPC codewords for the user; and distribute the encoded and padded bits for the user to the one or more spatial streams for the user.

24 Claims, 10 Drawing Sheets

Related U.S. Application Data

(60) Provisional application No. 62/573,797, filed on Oct. 18, 2017, provisional application No. 62/573,802, filed on Oct. 18, 2017, provisional application No. 62/576,796, filed on Oct. 25, 2017, provisional application No. 62/576,805, filed on Oct. 25, 2017, provisional application No. 62/576,811, filed on Oct. 25, 2017, provisional application No. 62/576,818, filed on Oct. 25, 2017.

(51) Int. Cl.
  *H04L 1/00* (2006.01)
  *H04L 5/00* (2006.01)
  *H03M 13/11* (2006.01)

(52) U.S. Cl.
  CPC ......... *H04B 7/0689* (2013.01); *H04L 1/0008* (2013.01); *H04L 1/0061* (2013.01); *H04L 5/0023* (2013.01); *H03M 13/1157* (2013.01)

(58) Field of Classification Search
  CPC ... H04L 1/0061; H04L 5/0023; H04L 1/0071; H04L 1/06; H04L 1/0643; H04L 1/0057; H04L 1/0031; H04L 1/0003; H03M 13/1157
  See application file for complete search history.

(56) References Cited

U.S. PATENT DOCUMENTS

| | | | |
|---|---|---|---|
| 9,749,087 | B2 | 8/2017 | Cordeiro et al. |
| 10,728,070 | B2 | 7/2020 | Kim et al. |
| 11,012,124 | B2 | 5/2021 | Lou et al. |
| 2015/0365263 | A1* | 12/2015 | Zhang ................ H04L 27/2634 375/295 |
| 2016/0249332 | A1 | 8/2016 | Xin et al. |
| 2017/0048095 | A1 | 2/2017 | Sun et al. |
| 2017/0048844 | A1 | 2/2017 | Chen et al. |
| 2017/0078008 | A1 | 3/2017 | Kasher et al. |
| 2017/0127386 | A1 | 5/2017 | Kasher et al. |
| 2017/0202011 | A1 | 7/2017 | Trainin et al. |
| 2017/0207905 | A1 | 7/2017 | Eitan et al. |
| 2017/0257201 | A1* | 9/2017 | Eitan .................... H04W 52/52 |
| 2018/0324695 | A1 | 11/2018 | Trainin et al. |
| 2018/0367650 | A1 | 12/2018 | Motozuka et al. |
| 2019/0182893 | A1 | 6/2019 | Sakamoto et al. |
| 2019/0191331 | A1* | 6/2019 | Park .................... H04W 28/06 |
| 2019/0222229 | A1 | 7/2019 | Montorsi et al. |
| 2019/0260446 | A1 | 8/2019 | Oteri et al. |
| 2019/0288763 | A1 | 9/2019 | Oteri et al. |
| 2019/0305996 | A1 | 10/2019 | Handte et al. |
| 2020/0007211 | A1 | 1/2020 | Liu et al. |
| 2020/0127719 | A1 | 4/2020 | Lomayev et al. |
| 2020/0145137 | A1* | 5/2020 | Handte ................ H04B 7/0617 |
| 2020/0162135 | A1 | 5/2020 | Sun et al. |
| 2020/0252156 | A1 | 8/2020 | Lomayev et al. |
| 2020/0304189 | A1 | 9/2020 | Lomayev et al. |
| 2020/0322008 | A1 | 10/2020 | Lomayev et al. |
| 2020/0322019 | A1 | 10/2020 | Lomayev et al. |
| 2020/0328842 | A1 | 10/2020 | Lomayev et al. |
| 2020/0328843 | A1 | 10/2020 | Lomayev et al. |
| 2020/0358491 | A1 | 11/2020 | Lomayev et al. |
| 2021/0006309 | A1 | 1/2021 | Lomayev et al. |
| 2021/0226723 | A1 | 7/2021 | Lomayev et al. |
| 2021/0226724 | A1 | 7/2021 | Lomayev et al. |
| 2021/0273688 | A1 | 9/2021 | Lou et al. |
| 2021/0328709 | A1* | 10/2021 | Lomayev .................. H04L 1/06 |

OTHER PUBLICATIONS

Office Action for U.S. Appl. No. 16/753,343, dated Dec. 24, 2021, 48 pages.
Office Action for U.S. Appl. No. 16/910,269, dated Aug. 19, 2021, 37 pages.
International Search Report and the Written Opinion for International Application No. PCT/US2018/052998, dated Jan. 17, 2019, 13 pages.
Artyom Lomayev et al., 'Proposed Comment Resolution for CID 1, 2, 23, 525', IEEE 802.11-17/0880r1, Jul. 9, 2017, 12 pages.
Takenori Sakamoto et al., 'EDMG-Header—A Encoding and Modulation for EDMG SC mode A-PPDU', IEEE 802.11-17/1411r2, Sep. 13, 2017, 6 pages.
Artyom Lomayev et al., '30.6.8 OFDM PPDU Transmission', IEEE 802.11-17/1568r0, Oct. 10, 2017, 12 pages.
IEEE Std 802.11™—2016. IEEE Standard for Information technology—Telecommunications and information exchange between systems Local and metropolitan area networks—Specific requirements Part 11: Wireless LAN Medium Access Control (MAC) and Physical Layer (PHY) Specifications, Dec. 7, 2016, 3534 pages.
International Preliminary Report on Patentability for International Application No. PCT/US2018/052998, dated Apr. 30, 2020, 10 pages.
International Search Report and the Written Opinion for International Application No. PCT/US2018/039248, dated Oct. 26, 2018, 13 pages.
Artyom Lomayev et al., '30.5.2 Transmitter Block Diagram for SC Mode', IEEE 802.11-17/0752r2, May 8, 2017, 7 pages.
Artyom Lomayev et al., '29.5.7.27 Encoding', IEEE 802.11-17/0214r1, Feb. 14, 2017, 6 pages.
Artyom Lomayev et al., '30.5.8 Non-EDMG Duplicate Transmission', IEEE 802.11-17/0525r0, Mar. 21, 2017, 6 pages.
International Preliminary Report on Patentability for International Application No. PCT/US2018/039248, dated Jan. 9, 2020, 10 pages.
International Search Report and the Written Opinion for International Application No. PCT/US2018/035792, dated Sep. 27, 2018, 13 pages.
International Preliminary Report on Patentability for International Application No. PCT/US2018/035792, dated Dec. 19, 2019, 10 pages.
Claudio Dasilva, Intel, "64 EDMG control mode", IEEE 802.11-16/01630r0, Dec. 21, 2016, 6 pages.
Artyom Lomayev et al., "30.5.8 Non-EDMG Duplicate Transmission", IEEE 802.11-17/0525r1, Mar. 29, 2017, 6 pages.
Christopher Hansen, Peraso, "Draft text for TX Masks", IEEE 802.11-16/1627r0, Dec. 21, 2016, 6 pages.
International Search Report and the Written Opinion for International Application No. PCT/US2018/037467, dated Nov. 28, 2018, 11 pages.
Artyom Lomayev et al., 'Proposed Comment Resolution for CID 63, 68 in 11 ay', IEEE 802.11-17/0893r2, Jun. 12, 2017, 9 pages.
Claudio Da Silva et al., 'EDMG Control Mode Data Field', IEEE 802.11-17/0277r0, Feb. 27, 2017, 5 pages.
Takenori Sakamoto et al., 'Comment Resolution on EDMG A-PPDU Structure', IEEE 802.11-17/0760r3, May 10, 2017, 9 pages.
International Preliminary Report on Patentability for International Application No. PCT/US2018/037467 dated Jan. 2, 2020, 8 pages.
Notice of Allowance for U.S. Appl. No. 16/624,449, dated May 18, 2020, 19 Pages.
Notice of Allowance for U.S. Appl. No. 16/898,489, dated Aug. 18, 2020, 16 pages.
Notice of Allowance for U.S. Appl. No. 16/624,449, dated Aug. 31, 2020, 16 pages.
Notice of Allowance for U.S. Appl. No. 16/910,243, dated Sep. 3, 2020, 21 pages.
Notice of Allowance for U.S. Appl. No. 16/910,269 dated Dec. 14, 2021, 13 pages.
Notice of Allowance for U.S. Appl. No. 16/911,738, dated Jul. 21, 2021, 37 pages.
Office Action for U.S. Appl. No. 16/940,897, dated Mar. 24, 2022, 85 pages.
Office Action for U.S. Appl. No. 17/213,220, dated Apr. 28, 2022, 53 pages.
Notice of Allowance for U.S. Appl. No. 16/626,555, dated Mar. 17, 2022, 14 pages.

(56) References Cited

OTHER PUBLICATIONS

Notice of Allowance for U.S. Appl. No. 16/626,555, dated Sep. 13, 2021, 10 pages.
Notice of Allowance for U.S. Appl. No. 17/213,222, dated May 12, 2022, 46 pages.
Notice of Allowance for U.S. Appl. No. 17/028,356, dated May 27, 2022, 55 pages.
Office Action for U.S. Appl. No. 16/753,343, dated Jun. 6, 2022, 23 pages.
Notice of Allowance for U.S. Appl. No. 17/356,266, dated Jul. 7, 2022, 49 pages.
Notice of Allowance for U.S. Appl. No. 16/940,897, dated Jul. 7, 2022, 17 pages.

* cited by examiner

APPARATUS, SYSTEM AND METHOD OF COMMUNICATING A PHYSICAL LAYER PROTOCOL DATA UNIT (PPDU)

CROSS REFERENCE

This application claims the benefit of and priority from U.S. Provisional Patent Application No. 62/573,797 entitled "Apparatus, System and Method of Communicating a Physical Layer Protocol Data Unit (PPDU)", filed Oct. 18, 2017, U.S. Provisional Patent Application No. 62/573,802 entitled "Apparatus, System and Method of Communicating a Physical Layer Protocol Data Unit (PPDU)", filed Oct. 18, 2017, U.S. Provisional Patent Application No. 62/576,796 entitled "Apparatus, System and Method of Communicating a Physical Layer Protocol Data Unit (PPDU)", filed Oct. 25, 2017, U.S. Provisional Patent Application No. 62/576,805 entitled "Apparatus, System and Method of Communicating a Physical Layer Protocol Data Unit (PPDU)", filed Oct. 25, 2017, U.S. Provisional Patent Application No. 62/576,811 entitled "Apparatus, System and Method of Communicating a Physical Layer Protocol Data Unit (PPDU)", filed Oct. 25, 2017, and U.S. Provisional Patent Application No. 62/576,818 entitled "Apparatus, System and Method of Communicating a Physical Layer Protocol Data Unit (PPDU)", filed Oct. 25, 2017, the entire disclosures of all of which are incorporated herein by reference.

TECHNICAL FIELD

Embodiments described herein generally relate to communicating a Physical Layer Protocol Data Unit (PPDU).

BACKGROUND

A wireless communication network in a millimeter-wave band may provide high-speed data access for users of wireless communication devices.

BRIEF DESCRIPTION OF THE DRAWINGS

For simplicity and clarity of illustration, elements shown in the figures have not necessarily been drawn to scale. For example, the dimensions of some of the elements may be exaggerated relative to other elements for clarity of presentation. Furthermore, reference numerals may be repeated among the figures to indicate corresponding or analogous elements. The figures are listed below.

DETAILED DESCRIPTION

Figure 1:
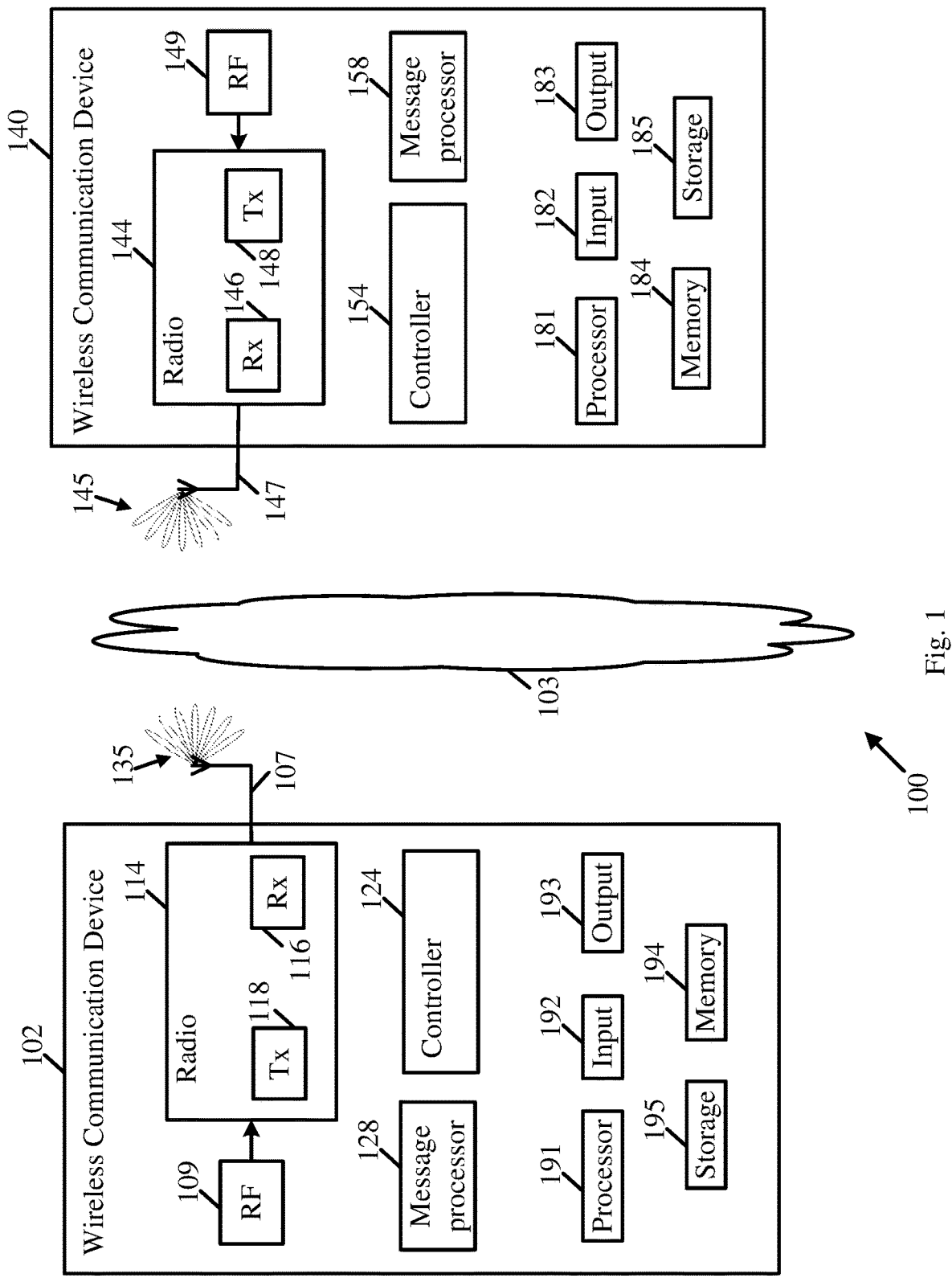
FIG. 1 is a schematic block diagram illustration of a system, in accordance with some demonstrative embodiments.

In the following detailed description, numerous specific details are set forth in order to provide a thorough understanding of some embodiments. However, it will be understood by persons of ordinary skill in the art that some embodiments may be practiced without these specific details. In other instances, well-known methods, procedures, components, units and/or circuits have not been described in detail so as not to obscure the discussion.

Discussions herein utilizing terms such as, for example, "processing", "computing", "calculating", "determining", "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

The terms "plurality" and "a plurality", as used herein, include, for example, "multiple" or "two or more". For example, "a plurality of items" includes two or more items.

References to "one embodiment", "an embodiment", "demonstrative embodiment", "various embodiments" etc., indicate that the embodiment(s) so described may include a particular feature, structure, or characteristic, but not every embodiment necessarily includes the particular feature, structure, or characteristic. Further, repeated use of the phrase "in one embodiment" does not necessarily refer to the same embodiment, although it may.

As used herein, unless otherwise specified the use of the ordinal adjectives "first", "second", "third" etc., to describe a common object, merely indicate that different instances of like objects are being referred to, and are not intended to imply that the objects so described must be in a given sequence, either temporally, spatially, in ranking, or in any other manner.

Some embodiments may be used in conjunction with various devices and systems, for example, a User Equipment (UE), a Mobile Device (MD), a wireless station (STA), a Personal Computer (PC), a desktop computer, a mobile computer, a laptop computer, a notebook computer, a tablet computer, a server computer, a handheld computer, a handheld device, a wearable device, a sensor device, an Internet of Things (IoT) device, a Personal Digital Assistant (PDA) device, a handheld PDA device, an on-board device, an off-board device, a hybrid device, a vehicular device, a non-vehicular device, a mobile or portable device, a consumer device, a non-mobile or non-portable device, a wireless communication station, a wireless communication device, a wireless Access Point (AP), a wired or wireless router, a wired or wireless modem, a video device, an audio device, an audio-video (A/V) device, a wired or wireless network, a wireless area network, a Wireless Video Area Network (WVAN), a Local Area Network (LAN), a Wireless LAN (WLAN), a Personal Area Network (PAN), a Wireless PAN (WPAN), and the like.

Some embodiments may be used in conjunction with devices and/or networks operating in accordance with existing IEEE 802.11 standards (including IEEE 802.11-2016 (*IEEE 802.11-2016, IEEE Standard for Information technology—Telecommunications and information exchange between systems Local and metropolitan area networks— Specific requirements Part* 11*: Wireless LAN Medium Access Control* (*MAC*) *and Physical Layer* (*PHY*) *Specifications*, Dec. 7, 2016); and/or IEEE 802.11ay (*P*802.11*ay/D*1.0 *Draft Standard for Information Technology—Telecommunications and Information Exchange Between Systems—Local and Metropolitan Area Networks—Specific Requirements Part* 11*: Wireless LAN Medium Access Control* (*MAC*) *and Physical Layer* (*PHY*) *Specifications Amendment* 7*: Enhanced Throughput for Operation in License-Exempt Bands Above* 45 *GHz*, November 2017)) and/or future versions and/or derivatives thereof, devices and/or networks operating in accordance with existing WFA Peer-to-Peer (P2P) specifications (*WiFi P2P technical specification, version* 1.7, Jul. 6, 2016) and/or future versions and/or derivatives thereof, devices and/or networks operating in accordance with existing Wireless-Gigabit-Alliance (WGA) specifications (including *Wireless Gigabit Alliance, Inc WiGig MAC and PHY Specification Version* 1.1, April 2011, Final specification) and/or future versions and/or derivatives thereof, devices and/or networks operating in accordance with existing cellular specifications and/or protocols, e.g., 3rd Generation Partnership Project (3GPP), 3GPP Long Term Evolution (LTE) and/or future versions and/or derivatives thereof, units and/or devices which are part of the above networks, and the like.

Some embodiments may be used in conjunction with one way and/or two-way radio communication systems, cellular radio-telephone communication systems, a mobile phone, a cellular telephone, a wireless telephone, a Personal Communication Systems (PCS) device, a PDA device which incorporates a wireless communication device, a mobile or portable Global Positioning System (GPS) device, a device which incorporates a GPS receiver or transceiver or chip, a device which incorporates an RFID element or chip, a Multiple Input Multiple Output (MIMO) transceiver or device, a Single Input Multiple Output (SIMO) transceiver or device, a Multiple Input Single Output (MISO) transceiver or device, a device having one or more internal antennas and/or external antennas, Digital Video Broadcast (DVB) devices or systems, multi-standard radio devices or systems, a wired or wireless handheld device, e.g., a Smartphone, a Wireless Application Protocol (WAP) device, or the like.

Some embodiments may be used in conjunction with one or more types of wireless communication signals and/or systems, for example, Radio Frequency (RF), Infra Red (IR), Frequency-Division Multiplexing (FDM), Orthogonal FDM (OFDM), Orthogonal Frequency-Division Multiple Access (OFDMA), FDM Time-Division Multiplexing (TDM), Time-Division Multiple Access (TDMA), Multi-User MIMO (MU-MIMO), Spatial Division Multiple Access (SDMA), Extended TDMA (E-TDMA), General Packet Radio Service (GPRS), extended GPRS, Code-Division Multiple Access (CDMA), Wideband CDMA (WCDMA), CDMA 2000, single-carrier CDMA, multi-carrier CDMA, Multi-Carrier Modulation (MDM), Discrete Multi-Tone (DMT), Bluetooth®, Global Positioning System (GPS), Wi-Fi, Wi-Max, ZigBee™, Ultra-Wideband (UWB), Global System for Mobile communication (GSM), 2G, 2.5G, 3G, 3.5G, 4G, Fifth Generation (5G), or Sixth Generation (6G) mobile networks, 3GPP, Long Term Evolution (LTE), LTE advanced, Enhanced Data rates for GSM Evolution (EDGE), or the like. Other embodiments may be used in various other devices, systems and/or networks.

The term "wireless device", as used herein, includes, for example, a device capable of wireless communication, a communication device capable of wireless communication, a communication station capable of wireless communication, a portable or non-portable device capable of wireless communication, or the like. In some demonstrative embodiments, a wireless device may be or may include a peripheral that is integrated with a computer, or a peripheral that is attached to a computer. In some demonstrative embodiments, the term "wireless device" may optionally include a wireless service.

The term "communicating" as used herein with respect to a communication signal includes transmitting the communication signal and/or receiving the communication signal. For example, a communication unit, which is capable of communicating a communication signal, may include a transmitter to transmit the communication signal to at least one other communication unit, and/or a communication receiver to receive the communication signal from at least one other communication unit. The verb communicating may be used to refer to the action of transmitting or the action of receiving. In one example, the phrase "communicating a signal" may refer to the action of transmitting the signal by a first device, and may not necessarily include the action of receiving the signal by a second device. In another example, the phrase "communicating a signal" may refer to the action of receiving the signal by a first device, and may not necessarily include the action of transmitting the signal by a second device. The communication signal may be transmitted and/or received, for example, in the form of Radio Frequency (RF) communication signals, and/or any other type of signal.

As used herein, the term "circuitry" may refer to, be part of, or include, an Application Specific Integrated Circuit (ASIC), an integrated circuit, an electronic circuit, a processor (shared, dedicated, or group), and/or memory (shared, dedicated, or group), that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware.

The term "logic" may refer, for example, to computing logic embedded in circuitry of a computing apparatus and/or computing logic stored in a memory of a computing apparatus. For example, the logic may be accessible by a processor of the computing apparatus to execute the computing logic to perform computing functions and/or operations. In one example, logic may be embedded in various types of memory and/or firmware, e.g., silicon blocks of various chips and/or processors. Logic may be included in, and/or implemented as part of, various circuitry, e.g. radio circuitry, receiver circuitry, control circuitry, transmitter circuitry, transceiver circuitry, processor circuitry, and/or the like. In one example, logic may be embedded in volatile memory and/or non-volatile memory, including random access memory, read only memory, programmable memory, magnetic memory, flash memory, persistent memory, and the like. Logic may be executed by one or more processors using memory, e.g., registers, stuck, buffers, and/or the like, coupled to the one or more processors, e.g., as necessary to execute the logic.

Some demonstrative embodiments may be used in conjunction with a WLAN, e.g., a WiFi network. Other embodiments may be used in conjunction with any other suitable wireless communication network, for example, a wireless area network, a "piconet", a WPAN, a WVAN and the like.

Some demonstrative embodiments may be used in conjunction with a wireless communication network communicating over a frequency band above 45 Gigahertz (GHz), e.g., 60 GHz. However, other embodiments may be implemented utilizing any other suitable wireless communication frequency bands, for example, an Extremely High Frequency (EHF) band (the millimeter wave (mmWave) frequency band), e.g., a frequency band within the frequency band of between 20 Ghz and 300 GHz, a frequency band above 45 GHz, a 5G frequency band, a frequency band below 20 GHz, e.g., a Sub 1 GHz (S1G) band, a 2.4 GHz band, a 5 GHz band, a WLAN frequency band, a WPAN frequency band, a frequency band according to the WGA specification, and the like.

The term "antenna", as used herein, may include any suitable configuration, structure and/or arrangement of one or more antenna elements, components, units, assemblies and/or arrays. In some embodiments, the antenna may implement transmit and receive functionalities using separate transmit and receive antenna elements. In some embodiments, the antenna may implement transmit and receive functionalities using common and/or integrated transmit/receive elements. The antenna may include, for example, a phased array antenna, a single element antenna, a set of switched beam antennas, and/or the like.

The phrases "directional multi-gigabit (DMG)" and "directional band" (DBand), as used herein, may relate to a frequency band wherein the Channel starting frequency is above 45 GHz. In one example, DMG communications may involve one or more directional links to communicate at a rate of multiple gigabits per second, for example, at least 1 Gigabit per second, e.g., at least 7 Gigabit per second, at least 30 Gigabit per second, or any other rate.

Some demonstrative embodiments may be implemented by a DMG STA (also referred to as a "mmWave STA (mSTA)"), which may include for example, a STA having a radio transmitter, which is capable of operating on a channel that is within the DMG band. The DMG STA may perform other additional or alternative functionality. Other embodiments may be implemented by any other apparatus, device and/or station.

Reference is made to FIG. 1, which schematically illustrates a system 100, in accordance with some demonstrative embodiments.

As shown in FIG. 1, in some demonstrative embodiments, system 100 may include one or more wireless communication devices. For example, system 100 may include a wireless communication device 102, a wireless communication device 140, and/or one or more other devices.

In some demonstrative embodiments, devices 102 and/or 140 may include a mobile device or a non-mobile, e.g., a static, device.

For example, devices 102 and/or 140 may include, for example, a UE, an MD, a STA, an AP, a PC, a desktop computer, a mobile computer, a laptop computer, an Ultrabook® computer, a notebook computer, a tablet computer, a server computer, a handheld computer, an Internet of Things (IoT) device, a sensor device, a handheld device, a wearable device, a PDA device, a handheld PDA device, an on-board device, an off-board device, a hybrid device (e.g., combining cellular phone functionalities with PDA device functionalities), a consumer device, a vehicular device, a non-vehicular device, a mobile or portable device, a non-mobile or non-portable device, a mobile phone, a cellular telephone, a PCS device, a PDA device which incorporates a wireless communication device, a mobile or portable GPS device, a DVB device, a relatively small computing device, a non-desktop computer, a "Carry Small Live Large" (CSLL) device, an Ultra Mobile Device (UMD), an Ultra Mobile PC (UMPC), a Mobile Internet Device (MID), an "Origami" device or computing device, a device that supports Dynamically Composable Computing (DCC), a context-aware device, a video device, an audio device, an A/V device, a Set-Top-Box (STB), a Blu-ray disc (BD) player, a BD recorder, a Digital Video Disc (DVD) player, a High Definition (HD) DVD player, a DVD recorder, a HD DVD recorder, a Personal Video Recorder (PVR), a broadcast HD receiver, a video source, an audio source, a video sink, an audio sink, a stereo tuner, a broadcast radio receiver, a flat panel display, a Personal Media Player (PMP), a digital video camera (DVC), a digital audio player, a speaker, an audio receiver, an audio amplifier, a gaming device, a data source, a data sink, a Digital Still camera (DSC), a media player, a Smartphone, a television, a music player, or the like.

In some demonstrative embodiments, device 102 may include, for example, one or more of a processor 191, an input unit 192, an output unit 193, a memory unit 194, and/or a storage unit 195; and/or device 140 may include, for example, one or more of a processor 181, an input unit 182, an output unit 183, a memory unit 184, and/or a storage unit 185. Devices 102 and/or 140 may optionally include other suitable hardware components and/or software components. In some demonstrative embodiments, some or all of the components of one or more of devices 102 and/or 140 may be enclosed in a common housing or packaging, and may be interconnected or operably associated using one or more wired or wireless links. In other embodiments, components of one or more of devices 102 and/or 140 may be distributed among multiple or separate devices.

In some demonstrative embodiments, processor 191 and/or processor 181 may include, for example, a Central Processing Unit (CPU), a Digital Signal Processor (DSP), one or more processor cores, a single-core processor, a dual-core processor, a multiple-core processor, a microprocessor, a host processor, a controller, a plurality of processors or controllers, a chip, a microchip, one or more circuits, circuitry, a logic unit, an Integrated Circuit (IC), an Application-Specific IC (ASIC), or any other suitable multipurpose or specific processor or controller. Processor 191 may execute instructions, for example, of an Operating System (OS) of device 102 and/or of one or more suitable applications. Processor 181 may execute instructions, for example, of an Operating System (OS) of device 140 and/or of one or more suitable applications.

In some demonstrative embodiments, input unit 192 and/or input unit 182 may include, for example, a keyboard, a keypad, a mouse, a touch-screen, a touch-pad, a track-ball, a stylus, a microphone, or other suitable pointing device or input device. Output unit 193 and/or output unit 183 may include, for example, a monitor, a screen, a touch-screen, a flat panel display, a Light Emitting Diode (LED) display unit, a Liquid Crystal Display (LCD) display unit, a plasma display unit, one or more audio speakers or earphones, or other suitable output devices.

In some demonstrative embodiments, memory unit 194 and/or memory unit 184 includes, for example, a Random Access Memory (RAM), a Read Only Memory (ROM), a Dynamic RAM (DRAM), a Synchronous DRAM (SD-RAM), a flash memory, a volatile memory, a non-volatile memory, a cache memory, a buffer, a short term memory unit, a long term memory unit, or other suitable memory units. Storage unit 195 and/or storage unit 185 may include, for example, a hard disk drive, a floppy disk drive, a Compact Disk (CD) drive, a CD-ROM drive, a DVD drive, or other suitable removable or non-removable storage units. Memory unit 194 and/or storage unit 195, for example, may store data processed by device 102. Memory unit 184 and/or storage unit 185, for example, may store data processed by device 140.

In some demonstrative embodiments, wireless communication devices 102 and/or 140 may be capable of communicating content, data, information and/or signals via a wireless medium (WM) 103. In some demonstrative embodiments, wireless medium 103 may include, for example, a radio channel, a cellular channel, an RF channel, a WiFi channel, a 5G channel, an IR channel, a Bluetooth (BT) channel, a Global Navigation Satellite System (GNSS) Channel, and the like.

In some demonstrative embodiments, WM 103 may include one or more directional bands and/or channels. For example, WM 103 may include one or more millimeter-wave (mmWave) wireless communication bands and/or channels.

In some demonstrative embodiments, WM 103 may include one or more DMG channels. In other embodiments WM 103 may include any other directional channels.

In other embodiments, WM 103 may include any other type of channel over any other frequency band.

In some demonstrative embodiments, device 102 and/or device 140 may include one or more radios including circuitry and/or logic to perform wireless communication between devices 102, 140 and/or one or more other wireless communication devices. For example, device 102 may include at least one radio 114, and/or device 140 may include at least one radio 144.

In some demonstrative embodiments, radio 114 and/or radio 144 may include one or more wireless receivers (Rx) including circuitry and/or logic to receive wireless communication signals, RF signals, frames, blocks, transmission streams, packets, messages, data items, and/or data. For example, radio 114 may include at least one receiver 116, and/or radio 144 may include at least one receiver 146.

In some demonstrative embodiments, radio 114 and/or radio 144 may include one or more wireless transmitters (Tx) including circuitry and/or logic to transmit wireless communication signals, RF signals, frames, blocks, transmission streams, packets, messages, data items, and/or data. For example, radio 114 may include at least one transmitter 118, and/or radio 144 may include at least one transmitter 148.

In some demonstrative embodiments, radio 114 and/or radio 144, transmitters 118 and/or 148, and/or receivers 116 and/or 146 may include circuitry; logic; Radio Frequency (RF) elements, circuitry and/or logic; baseband elements, circuitry and/or logic; modulation elements, circuitry and/or logic; demodulation elements, circuitry and/or logic; amplifiers; analog to digital and/or digital to analog converters; filters; and/or the like. For example, radio 114 and/or radio 144 may include or may be implemented as part of a wireless Network Interface Card (NIC), and the like.

In some demonstrative embodiments, radios 114 and/or 144 may be configured to communicate over a directional band, for example, an mmWave band, a 5G band, and/or any other band, for example, a 2.4 GHz band, a 5 GHz band, a S1G band, and/or any other band.

In some demonstrative embodiments, radios 114 and/or 144 may include, or may be associated with one or more, e.g., a plurality of, directional antennas.

In some demonstrative embodiments, device 102 may include one or more, e.g., a plurality of, directional antennas 107, and/or device 140 may include on or more, e.g., a plurality of, directional antennas 147.

Antennas 107 and/or 147 may include any type of antennas suitable for transmitting and/or receiving wireless communication signals, blocks, frames, transmission streams, packets, messages and/or data. For example, antennas 107 and/or 147 may include any suitable configuration, structure and/or arrangement of one or more antenna elements, components, units, assemblies and/or arrays. Antennas 107 and/or 147 may include, for example, antennas suitable for directional communication, e.g., using beamforming techniques. For example, antennas 107 and/or 147 may include a phased array antenna, a multiple element antenna, a set of switched beam antennas, and/or the like. In some embodiments, antennas 107 and/or 147 may implement transmit and receive functionalities using separate transmit and receive antenna elements. In some embodiments, antennas 107 and/or 147 may implement transmit and receive functionalities using common and/or integrated transmit/receive elements.

In some demonstrative embodiments, antennas 107 and/or 147 may include directional antennas, which may be steered to one or more beam directions. For example, antennas 107 may be steered to one or more beam directions 135, and/or antennas 147 may be steered to one or more beam directions 145.

In some demonstrative embodiments, antennas 107 and/or 147 may include and/or may be implemented as part of a single Phased Antenna Array (PAA).

In some demonstrative embodiments, antennas 107 and/or 147 may be implemented as part of a plurality of PAAs, for example, as a plurality of physically independent PAAs.

In some demonstrative embodiments, a PAA may include, for example, a rectangular geometry, e.g., including an integer number, denoted M, of rows, and an integer number, denoted N, of columns. In other embodiments, any other types of antennas and/or antenna arrays may be used.

In some demonstrative embodiments, antennas 107 and/or antennas 147 may be connected to, and/or associated with, one or more Radio Frequency (RF) chains.

In some demonstrative embodiments, device 102 may include one or more, e.g., a plurality of, RF chains 109 connected to, and/or associated with, antennas 107.

In some demonstrative embodiments, one or more of RF chains 109 may be included as part of, and/or implemented as part of one or more elements of radio 114, e.g., as part of transmitter 118 and/or receiver 116.

In some demonstrative embodiments, device 140 may include one or more, e.g., a plurality of, RF chains 149 connected to, and/or associated with, antennas 147.

In some demonstrative embodiments, one or more of RF chains 149 may be included as part of, and/or implemented as part of one or more elements of radio 144, e.g., as part of transmitter 148 and/or receiver 146.

In some demonstrative embodiments, device 102 may include a controller 124, and/or device 140 may include a controller 154. Controller 124 may be configured to perform and/or to trigger, cause, instruct and/or control device 102 to perform, one or more communications, to generate and/or communicate one or more messages and/or transmissions, and/or to perform one or more functionalities, operations and/or procedures between devices 102, 140 and/or one or more other devices; and/or controller 154 may be configured to perform, and/or to trigger, cause, instruct and/or control device 140 to perform, one or more communications, to generate and/or communicate one or more messages and/or transmissions, and/or to perform one or more functionalities, operations and/or procedures between devices 102, 140 and/or one or more other devices, e.g., as described below.

In some demonstrative embodiments, controllers 124 and/or 154 may include, or may be implemented, partially or entirely, by circuitry and/or logic, e.g., one or more processors including circuitry and/or logic, memory circuitry and/or logic, Media-Access Control (MAC) circuitry and/or logic, Physical Layer (PHY) circuitry and/or logic, baseband (BB) circuitry and/or logic, a BB processor, a BB memory, Application Processor (AP) circuitry and/or logic, an AP processor, an AP memory, and/or any other circuitry and/or logic, configured to perform the functionality of controllers 124 and/or 154, respectively. Additionally or alternatively, one or more functionalities of controllers 124 and/or 154 may be implemented by logic, which may be executed by a machine and/or one or more processors, e.g., as described below.

In one example, controller 124 may include circuitry and/or logic, for example, one or more processors including circuitry and/or logic, to cause, trigger and/or control a wireless device, e.g., device 102, and/or a wireless station, e.g., a wireless STA implemented by device 102, to perform one or more operations, communications and/or functionalities, e.g., as described herein. In one example, controller 124 may include at least one memory, e.g., coupled to the one or more processors, which may be configured, for example, to store, e.g., at least temporarily, at least some of the information processed by the one or more processors and/or circuitry, and/or which may be configured to store logic to be utilized by the processors and/or circuitry.

In one example, controller 154 may include circuitry and/or logic, for example, one or more processors including circuitry and/or logic, to cause, trigger and/or control a wireless device, e.g., device 140, and/or a wireless station, e.g., a wireless STA implemented by device 140, to perform one or more operations, communications and/or functionalities, e.g., as described herein. In one example, controller 154 may include at least one memory, e.g., coupled to the one or more processors, which may be configured, for example, to store, e.g., at least temporarily, at least some of the information processed by the one or more processors and/or circuitry, and/or which may be configured to store logic to be utilized by the processors and/or circuitry.

In some demonstrative embodiments, at least part of the functionality of controller 124 may be implemented as part of one or more elements of radio 114, and/or at least part of the functionality of controller 154 may be implemented as part of one or more elements of radio 144.

In other embodiments, the functionality of controller 124 may be implemented as part of any other element of device 102, and/or the functionality of controller 154 may be implemented as part of any other element of device 140.

In some demonstrative embodiments, device 102 may include a message processor 128 configured to generate, process and/or access one or messages communicated by device 102.

In one example, message processor 128 may be configured to generate one or more messages to be transmitted by device 102, and/or message processor 128 may be configured to access and/or to process one or more messages received by device 102, e.g., as described below.

In one example, message processor 128 may include at least one first component configured to generate a message, for example, in the form of a frame, field, information element and/or protocol data unit, for example, a MAC Protocol Data Unit (MPDU); at least one second component configured to convert the message into a PHY Protocol Data Unit (PPDU), for example, by processing the message generated by the at least one first component, e.g., by encoding the message, modulating the message and/or performing any other additional or alternative processing of the message; and/or at least one third component configured to cause transmission of the message over a wireless communication medium, e.g., over a wireless communication channel in a wireless communication frequency band, for example, by applying to one or more fields of the PPDU one or more transmit waveforms. In other embodiments, message processor 128 may be configured to perform any other additional or alternative functionality and/or may include any other additional or alternative components to generate and/or process a message to be transmitted.

In some demonstrative embodiments, device 140 may include a message processor 158 configured to generate, process and/or access one or messages communicated by device 140.

In one example, message processor 158 may be configured to generate one or more messages to be transmitted by device 140, and/or message processor 158 may be configured to access and/or to process one or more messages received by device 140, e.g., as described below.

In one example, message processor 158 may include at least one first component configured to generate a message, for example, in the form of a frame, field, information element and/or protocol data unit, for example, a MAC Protocol Data Unit (MPDU); at least one second component configured to convert the message into a PHY Protocol Data Unit (PPDU), for example, by processing the message generated by the at least one first component, e.g., by encoding the message, modulating the message and/or performing any other additional or alternative processing of the message; and/or at least one third component configured to cause transmission of the message over a wireless communication medium, e.g., over a wireless communication channel in a wireless communication frequency band, for example, by applying to one or more fields of the PPDU one or more transmit waveforms. In other embodiments, message processor 158 may be configured to perform any other additional or alternative functionality and/or may include any other additional or alternative components to generate and/or process a message to be transmitted.

In some demonstrative embodiments, message processors 128 and/or 158 may include, or may be implemented, partially or entirely, by circuitry and/or logic, e.g., one or more processors including circuitry and/or logic, memory circuitry and/or logic, Media-Access Control (MAC) circuitry and/or logic, Physical Layer (PHY) circuitry and/or logic, BB circuitry and/or logic, a BB processor, a BB memory, AP circuitry and/or logic, an AP processor, an AP memory, and/or any other circuitry and/or logic, configured to perform the functionality of message processors 128 and/or 158, respectively. Additionally or alternatively, one or more functionalities of message processors 128 and/or 158 may be implemented by logic, which may be executed by a machine and/or one or more processors, e.g., as described below.

In some demonstrative embodiments, at least part of the functionality of message processor 128 may be implemented as part of radio 114, and/or at least part of the functionality of message processor 158 may be implemented as part of radio 144.

In some demonstrative embodiments, at least part of the functionality of message processor 128 may be implemented as part of controller 124, and/or at least part of the functionality of message processor 158 may be implemented as part of controller 154.

In other embodiments, the functionality of message processor 128 may be implemented as part of any other element of device 102, and/or the functionality of message processor 158 may be implemented as part of any other element of device 140.

In some demonstrative embodiments, at least part of the functionality of controller 124 and/or message processor 128 may be implemented by an integrated circuit, for example, a chip, e.g., a System on Chip (SoC). In one example, the chip or SoC may be configured to perform one or more functionalities of radio 114. For example, the chip or SoC may include one or more elements of controller 124, one or more elements of message processor 128, and/or one or more elements of radio 114. In one example, controller 124, message processor 128, and radio 114 may be implemented as part of the chip or SoC.

In other embodiments, controller 124, message processor 128 and/or radio 114 may be implemented by one or more additional or alternative elements of device 102.

In some demonstrative embodiments, at least part of the functionality of controller 154 and/or message processor 158 may be implemented by an integrated circuit, for example, a chip, e.g., a System on Chip (SoC). In one example, the chip or SoC may be configured to perform one or more functionalities of radio 144. For example, the chip or SoC may include one or more elements of controller 154, one or more elements of message processor 158, and/or one or more elements of radio 144. In one example, controller 154, message processor 158, and radio 144 may be implemented as part of the chip or SoC.

In other embodiments, controller 154, message processor 158 and/or radio 144 may be implemented by one or more additional or alternative elements of device 140.

In some demonstrative embodiments, device 102 and/or device 140 may include, operate as, perform the role of, and/or perform one or more functionalities of, one or more STAs. For example, device 102 may include at least one STA, and/or device 140 may include at least one STA.

In some demonstrative embodiments, device 102 and/or device 140 may include, operate as, perform the role of, and/or perform one or more functionalities of, one or more DMG STAs. For example, device 102 may include, operate as, perform the role of, and/or perform one or more functionalities of, at least one DMG STA, and/or device 140 may include, operate as, perform the role of, and/or perform one or more functionalities of, at least one DMG STA.

In other embodiments, devices 102 and/or 140 may include, operate as, perform the role of, and/or perform one or more functionalities of, any other wireless device and/or station, e.g., a WLAN STA, a WiFi STA, and the like.

In some demonstrative embodiments, device 102 and/or device 140 may be configured operate as, perform the role of, and/or perform one or more functionalities of, an access point (AP), e.g., a DMG AP, and/or a personal basic service set (PBSS) control point (PCP), e.g., a DMG PCP, for example, an AP/PCP STA, e.g., a DMG AP/PCP STA.

In some demonstrative embodiments, device 102 and/or device 140 may be configured to operate as, perform the role of, and/or perform one or more functionalities of, a non-AP STA, e.g., a DMG non-AP STA, and/or a non-PCP STA, e.g., a DMG non-PCP STA, for example, a non-AP/PCP STA, e.g., a DMG non-AP/PCP STA.

In other embodiments, device 102 and/or device 140 may operate as, perform the role of, and/or perform one or more functionalities of, any other additional or alternative device and/or station.

In one example, a station (STA) may include a logical entity that is a singly addressable instance of a medium access control (MAC) and physical layer (PHY) interface to the wireless medium (WM). The STA may perform any other additional or alternative functionality.

In one example, an AP may include an entity that contains a station (STA), e.g., one STA, and provides access to distribution services, via the wireless medium (WM) for associated STAs. The AP may perform any other additional or alternative functionality.

In one example, a personal basic service set (PBSS) control point (PCP) may include an entity that contains a STA, e.g., one station (STA), and coordinates access to the wireless medium (WM) by STAs that are members of a PBSS. The PCP may perform any other additional or alternative functionality.

In one example, a PBSS may include a directional multi-gigabit (DMG) basic service set (BSS) that includes, for example, one PBSS control point (PCP). For example, access to a distribution system (DS) may not be present, but, for example, an intra-PBSS forwarding service may optionally be present.

In one example, a PCP/AP STA may include a station (STA) that is at least one of a PCP or an AP. The PCP/AP STA may perform any other additional or alternative functionality.

In one example, a non-AP STA may include a STA that is not contained within an AP. The non-AP STA may perform any other additional or alternative functionality.

In one example, a non-PCP STA may include a STA that is not a PCP. The non-PCP STA may perform any other additional or alternative functionality.

In one example, a non PCP/AP STA may include a STA that is not a PCP and that is not an AP. The non-PCP/AP STA may perform any other additional or alternative functionality.

In some demonstrative embodiments devices 102 and/or 140 may be configured to communicate over a Next Generation 60 GHz (NG60) network, an Enhanced DMG (EDMG) network, and/or any other network. For example, devices 102 and/or 140 may perform Multiple-Input-Multiple-Output (MIMO) communication, for example, for communicating over the NG60 and/or EDMG networks, e.g., over an NG60 or an EDMG frequency band.

In some demonstrative embodiments, devices 102 and/or 140 may be configured to operate in accordance with one or more Specifications, for example, including one or more *IEEE* 802.11 *Specifications*, e.g., an *IEEE* 802.11-2016 *Specification*, an *IEEE* 802.11*ay Specification*, and/or any other specification and/or protocol.

Some demonstrative embodiments may be implemented, for example, as part of a new standard in an mmWave band, e.g., a 60 GHz frequency band or any other directional band, for example, as an evolution of an *IEEE 802.11-2016 Specification and/or an IEEE* 802.11*ad Specification*.

In some demonstrative embodiments, devices 102 and/or 140 may be configured according to one or more standards, for example, in accordance with an *IEEE* 802.11*ay Standard*, which may be, for example, configured to enhance the efficiency and/or performance of an *IEEE* 802.11*ad Specification*, which may be configured to provide Wi-Fi connectivity in a 60 GHz band.

Some demonstrative embodiments may enable, for example, to significantly increase the data transmission rates defined in the *IEEE* 802.11*ad Specification*, for example, from 7 Gigabit per second (Gbps), e.g., up to 30 Gbps, or to any other data rate, which may, for example, satisfy growing demand in network capacity for new coming applications.

Some demonstrative embodiments may be implemented, for example, to allow increasing a transmission data rate, for example, by applying MIMO and/or channel bonding techniques.

In some demonstrative embodiments, devices 102 and/or 140 may be configured to communicate MIMO communications over the mmWave wireless communication band.

In some demonstrative embodiments, device 102 and/or device 140 may be configured to support one or more mechanisms and/or features, for example, channel bonding, Single User (SU) MIMO, and/or Multi-User (MU) MIMO, for example, in accordance with an *IEEE* 802.11*ay Standard* and/or any other standard and/or protocol.

In some demonstrative embodiments, device 102 and/or device 140 may include, operate as, perform a role of, and/or perform the functionality of, one or more EDMG STAs. For example, device 102 may include, operate as, perform a role of, and/or perform the functionality of, at least one EDMG STA, and/or device 140 may include, operate as, perform a role of, and/or perform the functionality of, at least one EDMG STA.

In some demonstrative embodiments, devices 102 and/or 140 may implement a communication scheme, which may include Physical layer (PHY) and/or Media Access Control (MAC) layer schemes, for example, to support one or more applications, and/or increased transmission data rates, e.g., data rates of up to 30 Gbps, or any other data rate.

In some demonstrative embodiments, the PHY and/or MAC layer schemes may be configured to support frequency channel bonding over a mmWave band, e.g., over a 60 GHz band, SU MIMO techniques, and/or MU MIMO techniques.

In some demonstrative embodiments, devices 102 and/or 140 may be configured to implement one or more mechanisms, which may be configured to enable SU and/or MU communication of Downlink (DL) and/or Uplink frames (UL) using a MIMO scheme.

In some demonstrative embodiments, device 102 and/or device 140 may be configured to implement one or more MU communication mechanisms. For example, devices 102 and/or 140 may be configured to implement one or more MU mechanisms, which may be configured to enable MU communication of DL frames using a MIMO scheme, for example, between a device, e.g., device 102, and a plurality of devices, e.g., including device 140 and/or one or more other devices.

In some demonstrative embodiments, devices 102 and/or 140 may be configured to communicate over an NG60 network, an EDMG network, and/or any other network and/or any other frequency band. For example, devices 102 and/or 140 may be configured to communicate DL MIMO transmissions and/or UL MIMO transmissions, for example, for communicating over the NG60 and/or EDMG networks.

Some wireless communication Specifications, for example, the *IEEE* 802.11*ad*-2012 *Specification*, may be configured to support a SU system, in which a STA may transmit frames to a single STA at a time. Such Specifications may not be able, for example, to support a STA transmitting to multiple STAs simultaneously, for example, using a MU-MIMO scheme, e.g., a DL MU-MIMO, or any other MU scheme.

In some demonstrative embodiments, devices 102 and/or 140 may be configured to communicate over a channel bandwidth, e.g., of at least 2.16 GHz, in a frequency band above 45 GHz.

In some demonstrative embodiments, devices 102 and/or 140 may be configured to implement one or more mechanisms, which may, for example, enable to extend a single-channel BW scheme, e.g., a scheme in accordance with the *IEEE* 802.11*ad Specification* or any other scheme, for higher data rates and/or increased capabilities, e.g., as described below.

In one example, the single-channel BW scheme may include communication over a 2.16 GHz channel (also referred to as a "single-channel" or a "DMG channel").

In some demonstrative embodiments, devices 102 and/or 140 may be configured to implement one or more channel bonding mechanisms, which may, for example, support communication over a channel BW (also referred to as a "wide channel", an "EDMG channel", or a "bonded channel") including two or more channels, e.g., two or more 2.16 GHz channels, e.g., as described below.

In some demonstrative embodiments, the channel bonding mechanisms may include, for example, a mechanism and/or an operation whereby two or more channels, e.g., 2.16 GHz channels, can be combined, e.g., for a higher bandwidth of packet transmission, for example, to enable achieving higher data rates, e.g., when compared to transmissions over a single channel. Some demonstrative embodiments are described herein with respect to communication over a channel BW including two or more 2.16 GHz channels, however other embodiments may be implemented with respect to communications over a channel bandwidth, e.g., a "wide" channel, including or formed by any other number of two or more channels, for example, an aggregated channel including an aggregation of two or more channels.

In some demonstrative embodiments, device 102 and/or device 140 may be configured to implement one or more channel bonding mechanisms, which may, for example, support an increased channel bandwidth, for example, a channel BW of 4.32 GHz, a channel BW of 6.48 GHz, a channel BW of 8.64 GHz, and/or any other additional or alternative channel BW, e.g., as described below.

In some demonstrative embodiments, device 102 and/or device 140 may be configured to implement one or more channel bonding mechanisms, which may, for example, support an increased channel bandwidth, for example, a channel BW of 4.32 GHz, e.g., including two 2.16 Ghz channels according to a channel bonding factor of two, a channel BW of 6.48 GHz, e.g., including three 2.16 Ghz channels according to a channel bonding factor of three, a channel BW of 8.64 GHz, e.g., including four 2.16 Ghz channels according to a channel bonding factor of four, and/or any other additional or alternative channel BW, e.g., including any other number of 2.16 Ghz channels and/or according to any other channel bonding factor.

In some demonstrative embodiments, device 102 and/or device 140 may be configured to communicate one or more transmissions over one or more channel BWs, for example, including a channel BW of 2.16 GHz, a channel BW of 4.32 GHz, a channel BW of 6.48 GHz, a channel BW of 8.64 GHz and/or any other channel BW.

In some demonstrative embodiments, introduction of MIMO may be based, for example, on implementing robust transmission modes and/or enhancing the reliability of data transmission, e.g., rather than the transmission rate, compared to a Single Input Single Output (SISO) case. For example, one or more Space Time Block Coding (STBC) schemes utilizing a space-time channel diversity property may be implemented to achieve one or more enhancements for the MIMO transmission.

In some demonstrative embodiments, devices 102 and/or 140 may be configured to generate, process, transmit and/or receive a Physical Layer (PHY) Protocol Data Unit (PPDU) having a PPDU format (also referred to as "EDMG PPDU format"), which may be configured, for example, for communication between EDMG stations, e.g., as described below.

In some demonstrative embodiments, a PPDU, e.g., an EDMG PPDU, may include at least one non-EDMG fields, e.g., a legacy field, which may be identified, decodable, and/or processed by one or more devices ("non-EDMG devices", or "legacy devices"), which may not support one or more features and/or mechanisms ("non-legacy" mechanisms or "EDMG mechanisms"). For example, the legacy devices may include non-EDMG stations, which may be, for example, configured according to an *IEEE* 802.11-2016 *Standard*, and the like. For example, a non-EDMG station may include a DMG station, which is not an EDMG station.

Figure 2:
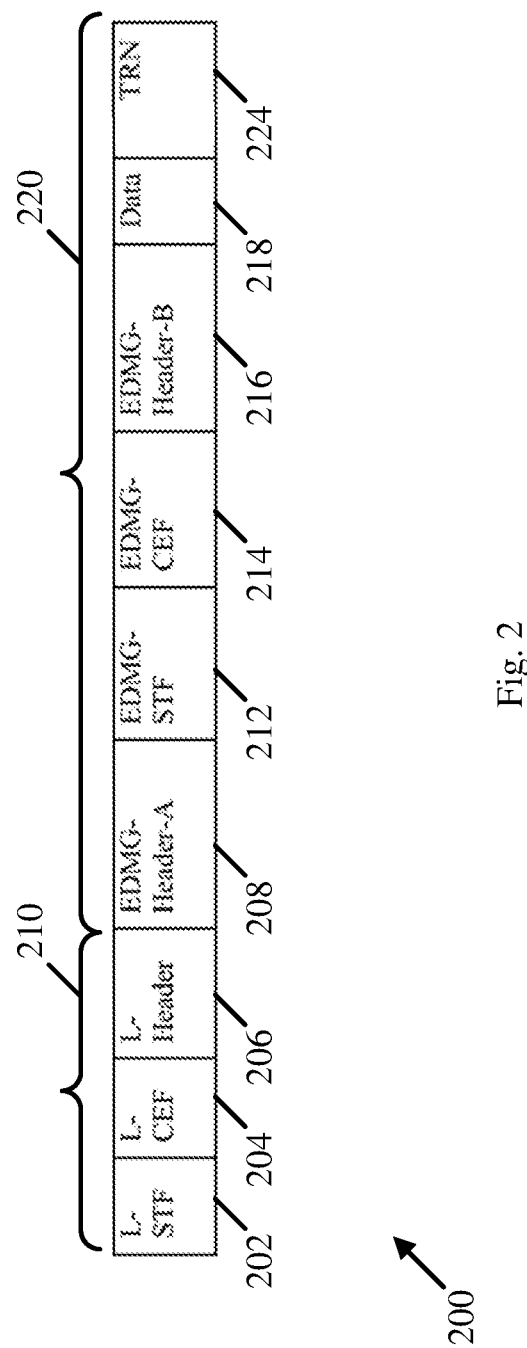
FIG. 2 is a schematic illustration of an Enhanced Directional Multi-Gigabit (EDMG) Physical Layer Protocol Data Unit (PPDU) format, which may be implemented in accordance with some demonstrative embodiments.

Reference is made to FIG. 2, which schematically illustrates an EDMG PPDU format 200, which may be implemented in accordance with some demonstrative embodiments. In one example, devices 102 (FIG. 1) and/or 140 (FIG. 1) may be configured to generate, transmit, receive and/or process one or more EDMG PPDUs having the structure and/or format of EDMG PPDU 200.

In one example, devices 102 (FIG. 1) and/or 140 (FIG. 1) may communicate PPDU 200, for example, as part of a transmission over a channel, e.g., an EDMG channel, having a channel bandwidth including one or more 2.16 GHz channels, for example, including a channel BW of 2.16 GHz, a channel BW of 4.32 GHz, a channel BW of 6.48 GHz, a channel BW of 8.64 GHz, and/or any other channel BW, e.g., as described below.

In some demonstrative embodiments, as shown in FIG. 2, EDMG PPDU 200 may include a non-EDMG portion 210 ("legacy portion"), e.g., as described below.

In some demonstrative embodiments, as shown in FIG. 2, non-EDMG portion 210 may include a non-EDMG (legacy) Short Training Field (STF) (L-STF) 202, a non-EDMG (Legacy) Channel Estimation Field (CEF) (L-CEF) 204, and/or a non-EDMG header (L-header) 206.

In some demonstrative embodiments, as shown in FIG. 2, EDMG PPDU 200, may include an EDMG portion 220, for example, following non-EDMG portion 210, e.g., as described below.

In some demonstrative embodiments, as shown in FIG. 2, EDMG portion 220 may include a first EDMG header, e.g., an EDMG-Header-A 208, an EDMG-STF 212, an EDMG-CEF 214, a second EDMG header, e.g., an EDMG-Header-B 216, a Data field 218, and/or one or more beamforming training fields, e.g., a training (TRN) field 224.

In some demonstrative embodiments, EDMG portion 220 may include some or all of the fields shown in FIG. 2 and/or one or more other additional or alternative fields.

In some demonstrative embodiments, Header B field 216 may be included, for example, in EDMG MU PPDUs, for example, on a per STA basis.

In some demonstrative embodiments, Header B field 216 corresponding to a STA addressed by the EDMG MU PPDU may include, for example, information relating to a transmission of a data unit, for example, a PHY Service Data Unit (PSDU) to the STA.

In some demonstrative embodiments, EDMG Header B field 216 may include for example, 64 bits, e.g., as described below. In other embodiments, the EDMG Header B field 216 may include any other number of bits.

In one example, EDMG Header B field 216 corresponding to the STA may include, for example, at least a scrambler seed field, a PSDU length field, e.g., to indicate a length of the PSDU to the STA, and/or one or more Modulation and Coding Scheme (MCS) fields to indicate one or more MCSs. For example, the Header B field may include first and second MCS fields to indicate MCSs for first and second respective spatial streams.

In other embodiments, EDMG Header B field 216 may include any other additional or alternative fields and/or information.

Referring back to FIG. 1, in some demonstrative embodiments, devices 102 and/or 140 may be configured to generate, transmit, receive and/or process one or more transmissions, e.g., including one or more EDMG PPDUs, e.g., as described below.

In some demonstrative embodiments, for example, devices 102 and/or 140 may be configured to perform one or more operations, and/or functionalities of EDMG STA, which may be configured, for example, to generate, transmit, receive and/or process one or more transmissions, e.g., including one or more EDMG PPDUs, e.g., including one or more fields according to the EDMG PPDU format of FIG. 2.

In some demonstrative embodiments, devices 102 and/or 140 may be configured to generate, transmit, receive and/or process one or more transmissions of PPDUs, for example, EDMG PPDUs, for example, Single Carrier (SC) PPDUs and/or Orthogonal Frequency Divisional Multiplexing (OFDM) PPDUs, e.g., in accordance with an *IEEE* 802.11*ay Specification* and/or any other specification.

In some demonstrative embodiments, devices 102 and/or 140 may be configured to generate, transmit, receive and/or process one or more transmissions of SC PHY PPDUs, for example, EDMG SC PHY PPDUs, for example, according to an EDMG transmission mode for SC PHY, e.g., as described below.

In some demonstrative embodiments, devices 102 and/or 140 may be configured to generate, transmit, receive and/or process one or more transmissions of OFDM PPDUs, for example, EDMG OFDM PPDUs, for example, according to an EDMG transmission mode for OFDM PHY, e.g., as described below.

In some demonstrative embodiments, devices 102 and/or 140 may be configured to generate, transmit, receive and/or process one or more transmissions of the SC PPDUs, for example, according to a transmission mode, which may be configured to support transmission of SC PPDUs over a 2.16 GHz bandwidth, a 4.32 GHz bandwidth, a 6.48 GHz bandwidth, a 8.64 GHz bandwidth, and/or any other bandwidth, for example, using one or more space-time streams and/or one or more transmit chains and/or antennas.

In some demonstrative embodiments, devices 102 and/or 140 may be configured to generate, transmit, receive and/or process one or more transmissions of the OFDM PPDUs, for example, according to a transmission mode, which may be configured to support transmission of OFDM PPDUs over a 2.16 GHz bandwidth, a 4.32 GHz bandwidth, a 6.48 GHz bandwidth, a 8.64 GHz bandwidth, and/or any other bandwidth, for example, using single or multiple space-time streams and/or single or multiple transmit chains and/or antennas.

In some demonstrative embodiments, devices 102 and/or 140 may be configured to implement one or more operations to support and/or enable SC transmission of an EDMG PPDU, for example, an EDMG SC PHY PPDU for SC PHY, e.g., in accordance with an *IEEE 802.11ay Specification*, e.g., as described below.

In some demonstrative embodiments, devices 102 and/or 140 may be configured to implement one or more operations to support and/or enable OFDM transmission of an EDMG PPDU, for example, an EDMG OFDM PPDU for OFDM PHY, e.g., in accordance with an *IEEE 802.11ay Specification*, e.g., as described below.

In some demonstrative embodiments, devices 102 and/or 140 may be configured to implement one or more operations to support SC transmission of an EDMG PPDU, for example, according to a SC PHY EDMG PPDU transmission mode, which may be configured to support a Single User (SU) transmission mode and/or a Multi-User (MU) transmission mode, e.g., as described below.

In some demonstrative embodiments, devices 102 and/or 140 may be configured to generate, transmit, receive and/or process one or more transmissions of an EDMG SC PHY PPDU, for example, using a SU mode or a MU mode, for example, with different types of spatial mapping, e.g., as described below.

In some demonstrative embodiments, devices 102 and/or 140 may be configured to generate, transmit, receive and/or process one or more transmissions of an EDMG OFDM PHY PPDU, for example, using a SU mode or a MU mode, for example, with different types of spatial mapping, e.g., as described below.

In some demonstrative embodiments, processing and/or communication of the EDMG SC PHY PPDU may be defined and/or performed based on one or more of the following parameters, and/or one or more additional or alternative parameters:

TABLE 1

| Symbol | Explanation |
| --- | --- |
| $i_{SS}$ | Spatial stream number |
| $N_{SS\ i_{user}}$ | Total number of spatial streams for $i_{user}$-th user |
| $i_{user}$ | User number |
| $N_{user}$ | Total number of users in a multi user transmission |
| $i_{STS\ i_{user}}$ | Space-time stream number for $i_{user}$-th user |
| $N_{STS\ i_{user}}$ | Total number of space-time streams for $i_{user}$-th user |
| $i_{STS}$ | Space-time stream number over all users |
| $N_{STS}$ | Total number of space-time streams over all users |
| $Length_{i_{user}}$ | PSDU length in octets for $i_{user}$-th user |
| $L_{CW}$ | LDPC codeword length in bits, it can be equal to 468, 504, 624, 672, 936, 1008, 1248, and 1344 |
| $L_{CW\ i_{user}}$ | LDPC codeword length in bits for $i_{user}^{th}$ user |
| $L_{CWD}$ | Number of systematic data bits per LDPC codeword |
| $L_{CWP}$ | Number of parity bits per LDPC codeword |
| $\rho_{i_{user}}$ | Repetition factor for $i_{user}^{th}$ user; is equal to 2 for MCS 1 and equal to 1 for all other MCSs |
| $R_{i_{user}}$ | LDPC code rate for $i_{user}^{th}$ user and can be equal to ½, 5/8, 2/3, ¾, 13/16, 5/6, 7/8 |
| $N_{CW\ i_{user}}$ | Total number of LDPC codewords for $i_{user}^{th}$ user |
| $N_{DATA\_PAD\ i_{user}}$ | Number of pad bits for the $i_{user}^{th}$ user to reach an integer number of LDPC codewords |
| $N_{BLKS\ i_{user}}$ | Total number of SC symbol blocks for the $i_{user}^{th}$ user |
| $N_{BLKS\ min}$ | Minimum number of total SC symbol blocks for BRP PPDU transmission |
| $N_{BLK\_PAD\ i_{user}}$ | Number of pad bits for the $i_{user}^{th}$ user to reach an integer number of SC symbol blocks |
| $N_{CB}$ | Number of contiguous 2.16 GHz channels used for PPDU transmission |
| $N_{CBPB}$ | Number of coded bits per SC symbol block; depends on modulation type and is different for different GI types. |
| $N_{CBPS\ i_{user}i_{SS}}$ | Number of coded bits per symbol (constellation point) for the $i_{user}^{th}$ user and $i_{SS}^{th}$ spatial stream |
| $N_{SPB}$ | Number of symbols (constellation points) per SC symbol block; depends on the GI type, e.g., as defined in Table 56 of an IEEE 802.11ay Specification. |
| $N_{BLKS\ max}$ | Maximum number of SC symbol blocks over all users |
| $N_{PAD\_BLKS\ i_{user}}$ | The number of pad SC symbol blocks for the $i_{user}^{th}$ user that is required to align PPDUs over different users in time |

In some demonstrative embodiments, some or all of the parameters of Table 1 may be implemented, one or more parameters may be defined in a different manner, and/or one or more additional or alternative parameters may be implemented.

In some demonstrative embodiments, devices 102 and/or 140 may be configured to implement one or more operations, functionalities and/or procedures to generate one or more EDMG PPDUs, for example, SU EDMG SC PPDUs and/or MU EDMG SC PPDUs, for example, by processing a payload including one or more data bits, e.g., as described below.

In some demonstrative embodiments, devices 102 and/or 140 may be configured to generate, transmit, receive and/or process one or more EDMG PPDUs, for example, SU EDMG SC PPDUs and/or MU EDMG SC PPDUs, for example, according to an encoding procedure and/or scheme, which may be configured in accordance with a vertical MIMO encoding approach, e.g., as described below.

In some demonstrative embodiments, the vertical MIMO encoding approach may be implemented, for example, instead of and/or to replace one or more operations of, a horizontal MIMO encoding approach, e.g., as described below.

In some demonstrative embodiments, devices 102 and/or 140 may be configured to generate, transmit, receive and/or process one or more EDMG PPDUs, for example, SU EDMG SC PPDUs and/or MU EDMG SC PPDUs, for example, according to an encoding procedure, which may be configured to support and/or enable the generation of EDMG SC PPDUs using a vertical approach, e.g., as described below.

Figure 3:
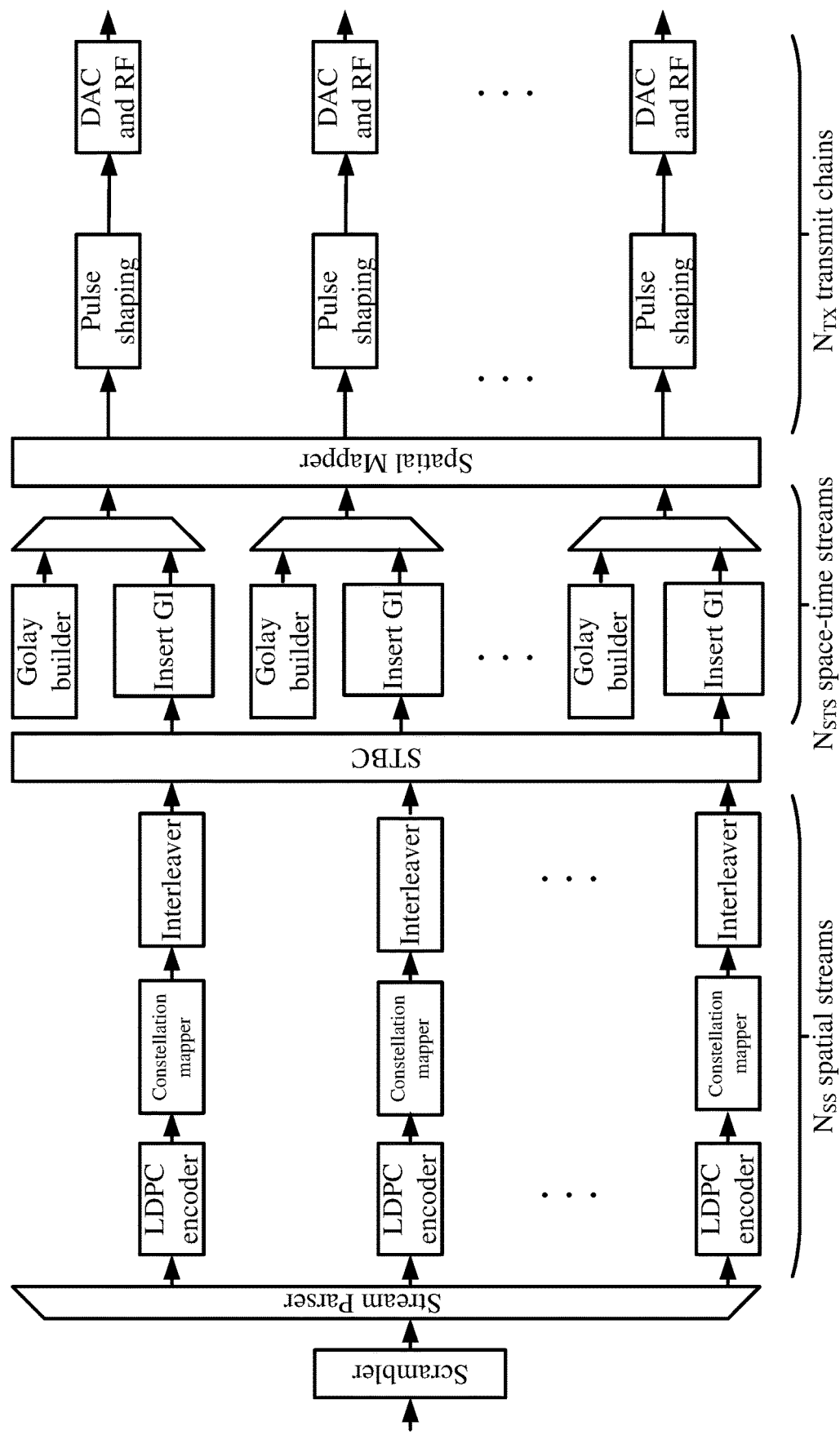
FIG. 3 is a schematic illustration of a Single User (SU) transmitter architecture to illustrate one or more transmitter functionalities, which may be implemented in accordance with some demonstrative embodiments.

Reference is made to FIG. 3, which schematically illustrates an SU transmitter architecture 300 to illustrate one or more transmitter functionalities, which may be implemented in accordance with some demonstrative embodiments.

For example, one or more elements of FIG. 3 may be implemented by a Transmitter to process the EDMG portion of single-user EDMG SC PPDUs.

For example, as shown in FIG. 3, according to a horizontal encoding approach, the generation of SU EDMG SC PPDUs may include processing the payload (data bits), e.g., as follows:

A scrambler scrambles the data to reduce the probability of long sequences of 0s and 1s.

A Stream parser divides the output of scrambler into groups (sequences) of bits, e.g., $N_{SS}$ sequences, that are sent to different Low Density Parity Check (LDPC) encoders and mapping devices. The sequence of the bits sent to a different encoder may be referred to as a spatial stream.

An LDPC encoder encodes the data to enable error correction. It makes bits padding to get an integer number of codewords and SC symbol blocks.

A Constellation mapper maps the sequence of bits in each stream to constellation points.

An Interleaver performs interleaving inside a SC symbol block.

The $N_{SS}$ spatial streams are then converted into $N_{STS}$ space-time streams using a space-time block code (STBC) if STBC is used, and a spatial mapper maps space-time streams to transmit chains, e.g., if MIMO transmission is used.

For example, as shown in FIG. 3, the $N_{SS}$ spatial streams may be converted into a plurality of space time streams, e.g., $N_{STS}$ space-time streams, for example, using an STBC, e.g., if STBC is used, and/or any other space-time encoding, and/or a spatial mapper may be configured to map space-time streams to transmit chains, e.g., if MIMO transmission is used.

For example, the encoding scheme of FIG. 3 may be referred to as a horizontal MIMO encoding scheme, for example, since different streams, e.g., groups of bits, after the stream parser may be encoded independently, e.g., by different and/or independent LDPC encoders.

Figure 4:
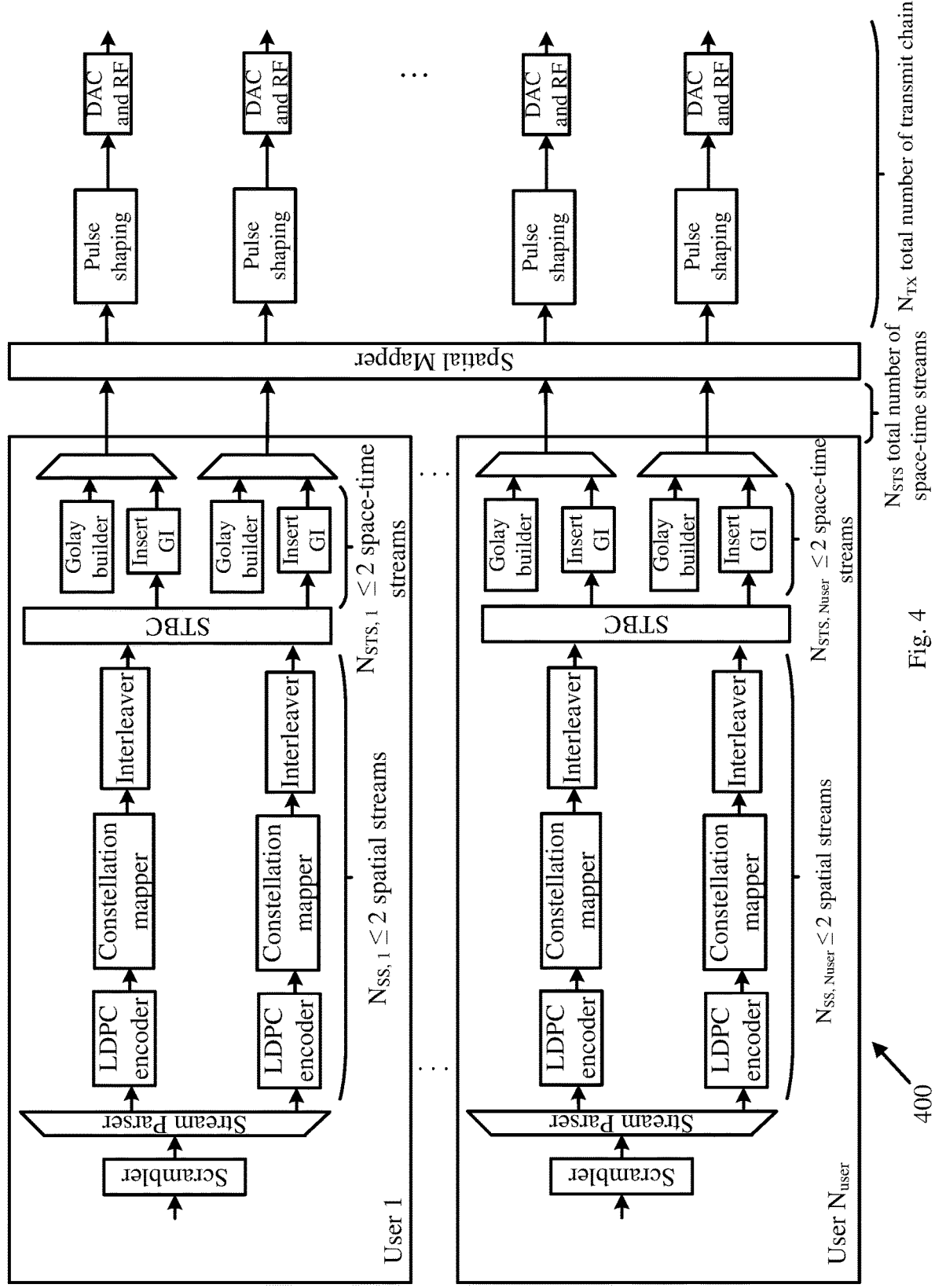
FIG. 4 is a schematic illustration of a Multi User (MU) transmitter architecture to illustrate one or more transmitter functionalities, which may be implemented in accordance with some demonstrative embodiments.

Reference is made to FIG. 4, which schematically illustrates an MU transmitter architecture 400 to illustrate one or more transmitter functionalities, which may be implemented in accordance with some demonstrative embodiments.

For example, one or more elements of FIG. 4 may be implemented by a Transmitter to process the EDMG portion of multi-user EDMG SC PPDUs.

Referring back to FIG. 1, in some demonstrative embodiments, devices 102 and/or 140 may be configured to transmit, receive, and/or process EDMG PPDUs, e.g., SC EDMG PPDUs, according to a MIMO encoding scheme (also referred to as "a vertical encoding scheme"), e.g., as described below.

In some demonstrative embodiments, the MIMO encoding scheme may be configured to perform encoding, e.g., LDPC encoding, after the scrambler and before the stream parser, e.g., as described below.

In some demonstrative embodiments, for example, applying the encoding, e.g., the LDPC encoding, prior to the stream parsing may allow, for example, providing a same code rate, e.g., for all streams, for example, as opposed to the horizontal MIMO encoding which may result in different code rates for different streams.

In some demonstrative embodiments, controller 124 may be configured to cause, trigger, and/or control a wireless station implemented by device 102, e.g., an EDMG STA, to generate an LDPC coded bit stream for a user, for example, based on data bits of a PSDU for the user in an EDMG PPDU, e.g., as described below.

In some demonstrative embodiments, the LDPC coded bit stream for the user may include a concatenation of a plurality of LDPC codewords, e.g., as described below.

In some demonstrative embodiments, a count of the plurality of LDPC codewords may be based, for example, at least on a codeword length for the user and on a code rate for the user, e.g., as described below.

In some demonstrative embodiments, the codeword length may be 672, 1344, 624, or 1248, 504, 1008, 468, or 936, e.g., as described below.

In other embodiments, the codeword length may include any other length.

In some demonstrative embodiments, the code rate may be 7/8, 1/2, 2/3 or 5/6, e.g., as described below.

In other embodiments, the code rate may include any other rate.

In some demonstrative embodiments, controller 124 may be configured to cause, trigger, and/or control the wireless station implemented by device 102 to generate encoded and padded bits for the user, for example, by concatenating the LDPC coded bit stream with a plurality of coded pad zero bits, e.g., as described below.

In some demonstrative embodiments, a count of the coded pad zero bits may be based, for example, at least on a count of one or more spatial streams for the user and on the count of the plurality of LDPC codewords for the user, e.g., as described below.

In some demonstrative embodiments, controller 124 may be configured to cause, trigger, and/or control the wireless station implemented by device 102 to distribute the encoded and padded bits for the user to the one or more spatial streams for the user, e.g., as described below.

In some demonstrative embodiments, controller 124 may be configured to cause, trigger, and/or control the wireless station implemented by device 102 to transmit the EDMG PPDU in a transmission over a channel bandwidth in a frequency band above 45 GHz, the transmission, for example, may be based on the one or more spatial streams for the user, e.g., as described below.

In other embodiments, device 102 may transmit the EDMG PPDU in a transmission over any other additional and/or alternative channel bandwidth.

In some demonstrative embodiments, the EDMG PPDU may include an EDMG SU PPDU, e.g., as described below.

In other embodiments, the EDMG PPDU may include an EDMG MU PPDU, for example, including a plurality user PPDUs to a respective plurality of users, e.g., as described below.

In some demonstrative embodiments, the count of the coded pad zero bits may be based on a count of one or more 2.16 GHz channels in the channel bandwidth for transmission of the EDMG PPDU, for example, EDMG PPDU 200 (FIG. 2), e.g., as described below.

In some demonstrative embodiments, controller 124 may be configured to cause, trigger, and/or control the wireless station implemented by device 102 to generate scrambled data bits, for example, by scrambling the data bits of the PSDU for the user, e.g., as described below.

In some demonstrative embodiments, controller 124 may be configured to cause, trigger, and/or control the wireless station implemented by device 102 to generate scrambled PSDU bits for the user, for example, by scrambling the scrambled data bits concatenated with a plurality of data pad zero bits for the user, e.g., as described below.

In some demonstrative embodiments, a count of the plurality of data pad zero bits for the user may be based, for example, at least on the count of the plurality of LDPC codewords for the user, e.g., as described below.

In some demonstrative embodiments, controller 124 may be configured to cause, trigger, and/or control the wireless station implemented by device 102 to generate the LDPC coded bit stream for the user, for example, by converting the scrambled PSDU bits into the plurality of LDPC codewords according to the codeword length for the user and the code rate for the user, e.g., as described below.

In some demonstrative embodiments, controller 124 may be configured to cause, trigger, and/or control the wireless station implemented by device 102 to generate the encoded and padded bits for the user, for example, by scrambling the LDPC coded bit stream concatenated with the plurality of coded pad zero bits, e.g., as described below.

In some demonstrative embodiments, controller 124 may be configured to cause, trigger, and/or control the wireless station implemented by device 102 to scramble the data bits of the PSDU for the user, for example, using a scrambler sequence, e.g., as described below.

In some demonstrative embodiments, controller 124 may be configured to cause, trigger, and/or control the wireless station implemented by device 102 to scramble the scrambled data bits concatenated with the plurality of data pad zero bits for the user, for example, using a first continuation of the scramble sequence, e.g., as described below.

In some demonstrative embodiments, controller 124 may be configured to cause, trigger, and/or control the wireless station implemented by device 102 to scramble the LDPC coded bit stream concatenated with the plurality of coded pad zero bits, for example, using a second continuation of the scrambler sequence, e.g., as described below.

In some demonstrative embodiments, controller 124 may be configured to cause, trigger, and/or control the wireless station implemented by device 102 to map the one or more spatial streams for the user to one or more space-time streams, e.g., as described below.

In some demonstrative embodiments, the EDMG PPDU may include a SC PPDU, e.g., as described below.

In some demonstrative embodiments, controller 124 may be configured to cause, trigger, and/or control the wireless station implemented by device 102 to, when the EDMG PPDU includes a SC PPDU, determine the count of the coded pad zero bits based on a count of SC symbol blocks for the user, e.g., as described below.

In some demonstrative embodiments, the count of SC symbol blocks for the user may be based, for example, at least on the count of one or more spatial streams for the user and the count of the plurality of LDPC codewords for the user, e.g., as described below.

In some demonstrative embodiments, controller 124 may be configured to cause, trigger, and/or control the wireless station implemented by device 102 to determine the count of SC symbol blocks for the user, for example, based on a count of symbols per SC symbol block, and a count of coded bits per symbol per spatial stream for the user, e.g., as described below.

Figure 5:
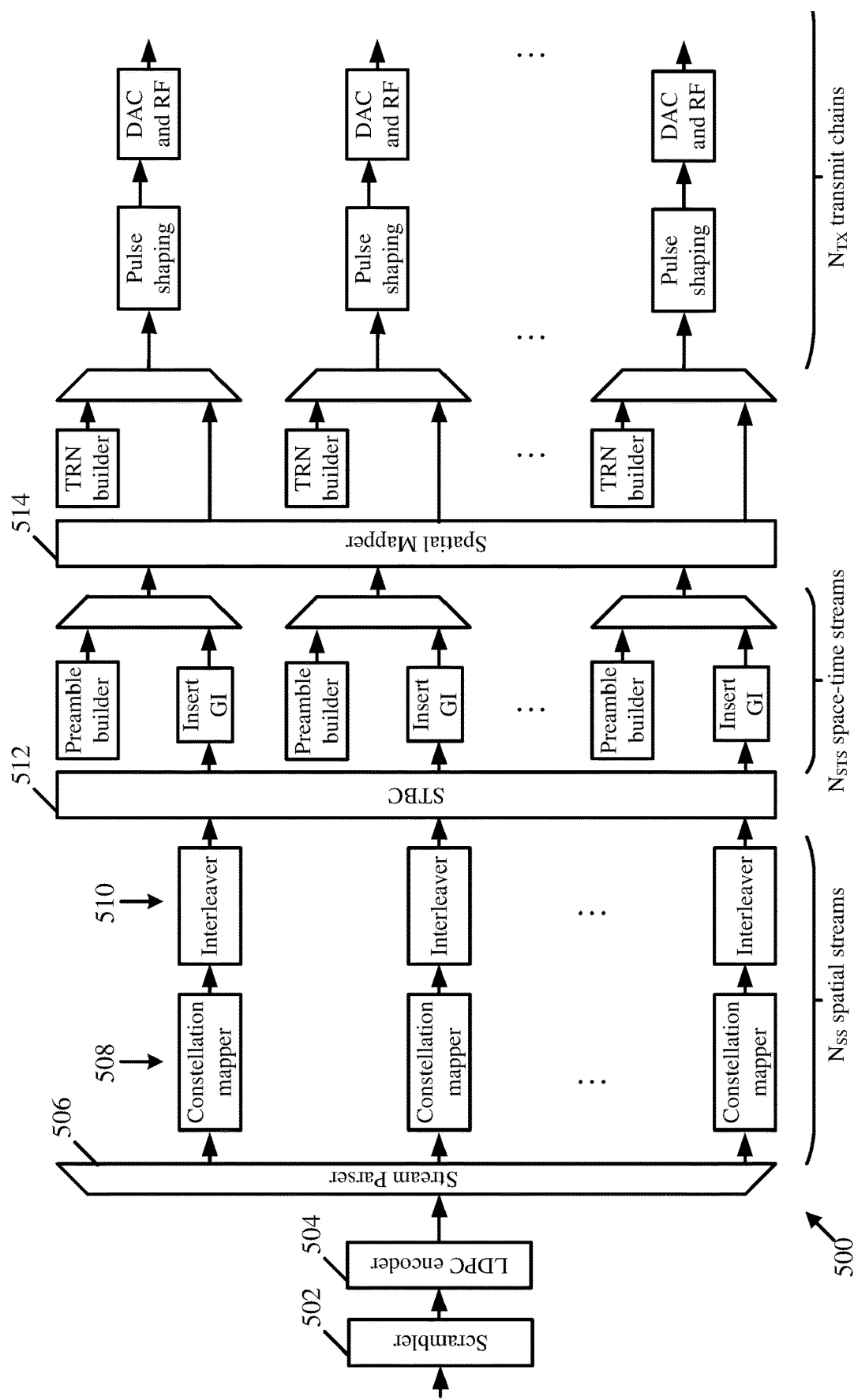
FIG. 5 is a schematic illustration of an SU transmitter architecture according to an encoding scheme, in accordance with some demonstrative embodiments.

Reference is made to FIG. 5, which schematically illustrates an SU transmitter architecture 500 according to an SU encoding scheme, in accordance with some demonstrative embodiments.

In some demonstrative embodiments, for example, devices 102 and/or 140 (FIG. 1) may be configured implement one or more elements of transmitter architecture 500, for example, to process an EDMG portion of single-user EDMG SC PPDUs, e.g., according to a vertical encoding scheme.

For example, transmitter 118 (FIG. 1) may be configured to implement one or more elements and/or functionalities of transmitter architecture 500.

For example, transmitter 118 (FIG. 1) may include circuitry and/or logic configured to perform one or more functionalities and/or operations of one or more elements of transmitter architecture 500.

In some demonstrative embodiments, one or more elements and/or blocks of transmitter architecture 500 may be configured, for example, for SU EDMG SC PPDU transmission, e.g., as described below.

In some demonstrative embodiments, one or more elements and/or blocks of transmitter architecture 500 may be configured, for example, to generate a SU EDMG SC PPDU.

In some demonstrative embodiments, for example, as shown in FIG. 5, payload (data bits) of single-user EDMG SC PPDUs may be processed according to a vertical MIMO encoding procedure, e.g., as described below.

In some demonstrative embodiments, as shown in FIG. 5, a scrambler 502 may be configured to scramble the data, for example, to reduce the probability of long sequences of 0s and 1s.

In some demonstrative embodiments, as shown in FIG. 5, an encoder 504, e.g., an LDPC encoder or any other encoder, may be configured to encode the data, for example, before stream parsing, for example, to enable error correction.

In some demonstrative embodiments, LDPC encoder 504 may implement bit padding, for example, to provide an integer number of codewords and/or SC symbol blocks.

In some demonstrative embodiments, as shown in FIG. 5, a stream parser 506 may be configured to divide the output of LDPC encoder 504 into groups of bits (spatial streams), e.g., $N_{SS}$ spatial streams, which may be sent to a plurality of mappers (e.g., mapping devices), for example, a plurality of constellation mappers 508. The sequence of the bits sent to a mapping device may be referred to as a spatial stream.

In some demonstrative embodiments, as shown in FIG. 5, constellation mapper 508 may be configured to map the sequence of bits in a respective stream to constellation points (complex numbers).

In some demonstrative embodiments, as shown in FIG. 5, an interleaver 510 may be configured to perform interleaving inside a SC symbol block, e.g., as described below.

In some demonstrative embodiments, as shown in FIG. 5, the $N_{SS}$ spatial streams may be converted into a plurality of space time streams, e.g., $N_{STS}$ space-time streams, for example, using a space-time block code (STBC) 512, e.g., if STBC is used, and/or any other space-time encoding, and/or a spatial mapper 514 may be configured to map space-time streams to transmit chains, e.g., if MIMO transmission is used.

Figure 6:
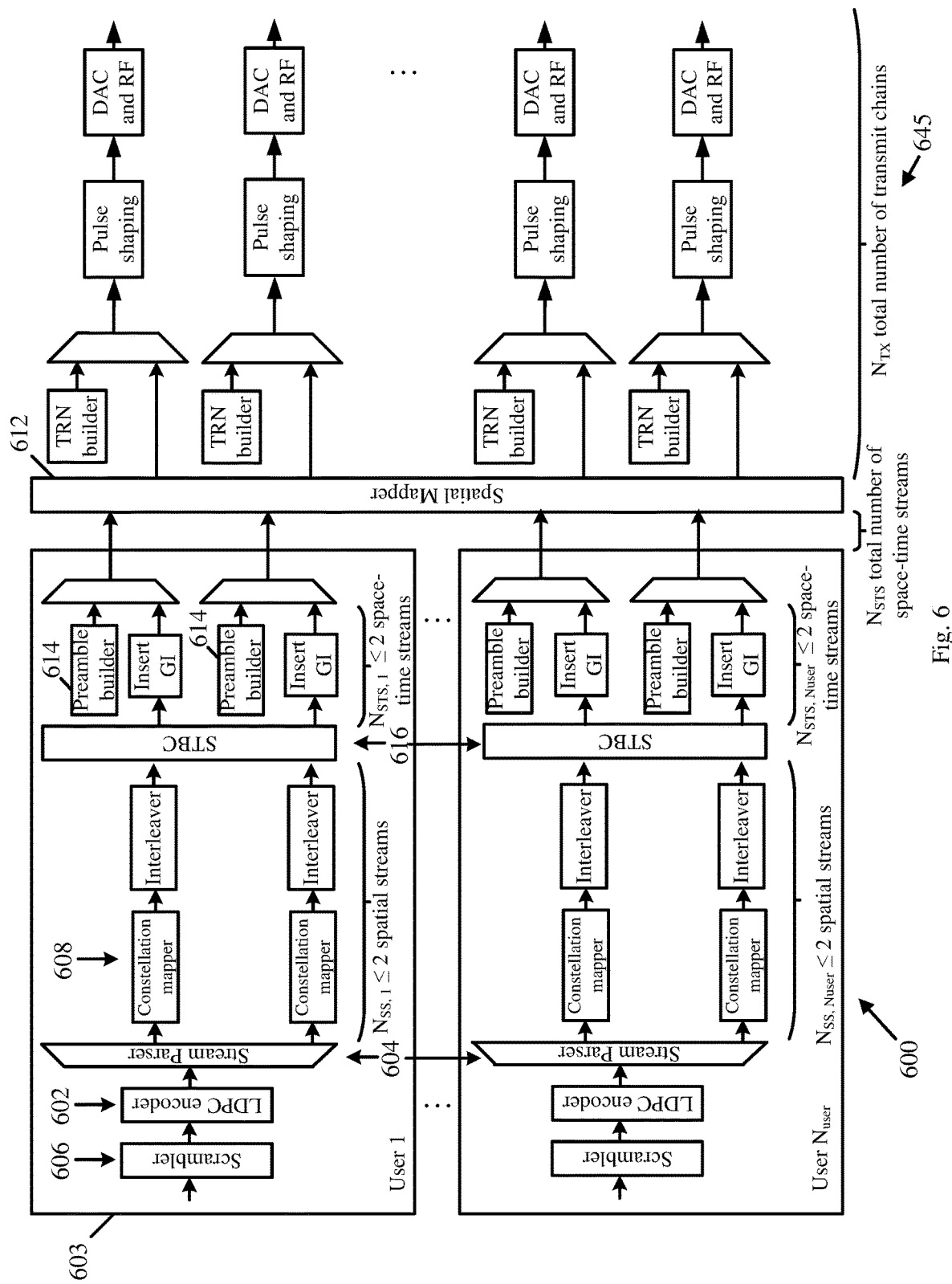
FIG. 6 is a schematic illustration of an MU transmitter architecture according to an encoding scheme, in accordance with some demonstrative embodiments.

Reference is made to FIG. 6, which schematically illustrates an MU transmitter architecture 600 according to an MU encoding scheme, in accordance with some demonstrative embodiments.

In some demonstrative embodiments, for example, devices 102 and/or 140 (FIG. 1) may be configured implement one or more elements of MU transmitter architecture 600, for example, to process an EDMG portion of multi-user EDMG SC PPDUs, e.g., according to a vertical encoding scheme.

For example, transmitter 118 (FIG. 1) may be configured to implement one or more elements and/or functionalities of transmitter architecture 600.

For example, transmitter 118 (FIG. 1) may include circuitry and/or logic configured to perform one or more functionalities and/or operations of one or more elements of transmitter architecture 600.

In some demonstrative embodiments, one or more elements and/or blocks of transmitter architecture 600 may be configured, for example, for MU EDMG SC PPDU transmission, e.g., as described below.

In some demonstrative embodiments, one or more elements and/or blocks of transmitter architecture 600 may be configured, for example, to generate an MU EDMG SC PPDU.

For example, as shown in FIG. 6, transmitter architecture 600 may include a plurality of processing modules 603 to process a respective plurality of EDMG PPDU portions to be transmitted to a respective plurality of users.

For example, as shown in FIG. 6, a processing module 603, e.g., each processing module 603, to process an EDMG PPDU portion of the plurality of EDMG PPDU portions may include a scrambler 606 to generate scrambled bits by scrambling bits of a header B field and a data field in the EDMG portion; an encoder 602 to encode the plurality of scrambled bit streams into a respective plurality of encoded bit streams, e.g., according to an LDPC code; a stream parser 604 divide the output of encoder 602 into spatial streams; one or more, e.g., a plurality of, constellation mappers 608 to map the plurality of encoded bit streams into a respective plurality of streams of constellation points according to a constellation scheme; an STBC encoder 616 to spread constellation points from the plurality of spatial streams into a plurality of space-time streams; and/or a preamble builder 614 to build symbols of one or more fields in the EDMG PPDU portion over the plurality of space-time streams, e.g., as described above.

In some demonstrative embodiments, as shown in FIG. 6, transmitter architecture 600 may include a spatial mapper 612 to map outputs of the plurality processing modules 603 to a plurality of transmit chains 645.

In some demonstrative embodiments, transmitter architecture 600 may include some or all of the elements shown in FIG. 6 and/or one or more elements may be optional and/or implemented in some configurations. For example, the STBC encoder may optionally be included, for example, when STBC is to be supported, e.g., as described above. For example, the interleaver may be included, for example, for one or more modulation schemes.

Referring back to FIG. 1, in some demonstrative embodiments, devices 102 and/or 140 may be configured to implement one or more operations and/or functionalities of an encoding procedure, which may support and/or enable the generation of EDMG SC PPDUs using a vertical encoding scheme, for example, according to the scheme of FIG. 5 and/or FIG. 6, e.g., as described below.

In some demonstrative embodiments, the encoding procedure may be configured for a SC mode EDMG SU PSDU and/or SC mode EDMG MU PSDU, e.g., per user basis encoding.

In some demonstrative embodiments, an LDPC encoding, which may be configured to employ codeword lengths of $L_{CW}$=468, 504, 624, 672, 936, 1008, 1248, and/or 1344, and/or code rates of R=1/2, 5/8, 2/3, 3/4, 13/16, 5/6, and/or 7/8, may be implemented, e.g., as described below. In other embodiments, any other additional or alternative encoding configurations, codeword lengths and/or code rates may be implemented.

In some demonstrative embodiments, devices 102 and/or 140 may be configured to generate, transmit, receive, and/or process one or more EDMG PPDUs, e.g., EDMG SC PPDUs, according to an encoding scheme, e.g., a vertical encoding scheme, which may include encoding data bits, for example, scrambled data bits, e.g., scrambled PHY Service Protocol Data Unit (PSDU) bits, for example, prior to stream parsing, e.g., as described below.

In some demonstrative embodiments, device 102 may be configured to implement an LDPC encoding process, for example, to encode data bits for a user, e.g., as described below.

In some demonstrative embodiments, device 102 may be configured to generate a sequence of scrambled bits based on data bits for a user, e.g., as described below.

In some demonstrative embodiments, the sequence of scrambled bits may include scrambled data bits and scrambled data padding bits, e.g., as described below.

In some demonstrative embodiments, the number of data padding bits may be determined, for example, prior to stream parsing, e.g., based on the length of the data bits, e.g., for a user, the codeword length for the user, and/or the code rate for the user, e.g., as described below.

In some demonstrative embodiments, device 102 may be configured to encode the sequence of scrambled bits into codewords, e.g., into LDPC codewords, e.g., as described below.

In some demonstrative embodiments, device 102 may be configured to generate a coded bit stream based on the codewords, e.g., by concatenating the LDPC codewords, e.g., as described below.

In some demonstrative embodiments, device 102 may be configured to generate a sequence of encoded padded bits, for example, based on the coded bit stream and coded pad bits, e.g., as described below.

In some demonstrative embodiments, device 102 may be configured to determine a number of the coded pad bits, for example, based on a number of spatial streams to be implemented e.g., for the user, e.g., as described below.

In some demonstrative embodiments, device 102 may be configured to determine the number of coded pad bits, for example, based on a number of codewords to be implemented for the user, e.g., as described below.

In some demonstrative embodiments, device 102 may be configured to determine the number of coded pad bits, for example, based on a sum of a plurality of numbers of coded bits per symbol block corresponding to a plurality of spatial streams, e.g., to be implemented for the user, e.g., as described below.

In some demonstrative embodiments, device 102 may be configured to distribute the sequence of encoded and padded bits over the spatial streams, e.g., as described below.

In some demonstrative embodiments, device 102 may be configured to map a sequence of bits in a spatial stream to constellation points, e.g., modulated complex symbols, e.g., as described below.

In some demonstrative embodiments, device 102 may be configured to implement an LDPC encoding process, for example, to encode data bits for a user, e.g., as described below.

In some demonstrative embodiments, an LDPC encoding process for an $i_{user}$-th user may include one or more operations, e.g., as follows:

a) Compute the number of data pad bits $$N_{DATA\_PAD_{i_{user}}},$$

using the number of LDPC codewords $N_{CW_{i_{user}}}$, e.g., as follows:

$$N_{CW_{i_{user}}} = \left\lceil \frac{Length_{i_{user}} \cdot 8}{L_{CW_{i_{user}}} \cdot \frac{R_{i_{user}}}{\rho_{i_{user}}}} \right\rceil$$

$$N_{DATA\_PAD_{i_{user}}} = N_{CW_{i_{user}}} \cdot L_{CW_{i_{user}}} \cdot \left(\frac{R_{i_{user}}}{\rho_{i_{user}}}\right) - Length_{i_{user}} \cdot 8$$

The scrambled PSDU is concatenated with $$N_{DATA\_PAD_{i_{user}}}$$

zero bits. They are scrambled using the continuation of the scrambler sequence that scrambled the PSDU input bits.

b) Convert the scrambled PSDU bits to LDPC codewords, e.g., as follows:
  a. If $\rho=1$ and $L_{CW}=672, 1344$:
    i. The output stream of scrambler is broken into the blocks of length $L_{CWD}=L_{CW} \times R$ bits such that the m-th data word is $$b^{(m)}=(b_1^{(m)}, b_2^{(m)}, \ldots, b_{L_{CWD}}^{(m)}), m \leq N_{CW_{i_{user}}}$$

ii. To each data word, parity bits $p^{(m)}=(p_1^{(m)}, p_2^{(m)}, \ldots, p_{L_{CWP}}^{(m)})$, $L_{CWP}=L_{CW}-L_{CWD}$, are added to create the codeword $c^{(m)}=(b^{(m)}, p^{(m)})$, $m \leq N_{CW_{i_{user}}}$ such that $H \cdot (c^{(m)})^T = 0$ b. If $\rho=1$ and $L_{CW}=624$, R=7/8:
  i. The output stream of scrambler is broken into the blocks of length 546 bits such that the m-th data word is $$b^{(m)}=(b_1^{(m)}, b_2^{(m)}, \ldots, b_{546}^{(m)}), m \leq N_{CW_{i_{user}}}$$

ii. To each data word, parity bits $p^{(m)}=(p_1^{(m)}, p_2^{(m)}, \ldots, p_{L_{126}}^{(m)})$ are added to create the codeword $c^{(m)}=(b^{(m)}, p^{(m)})$, $m \leq N_{CW_{i_{user}}}$ such that $H \cdot (c^{(m)})^T = 0$, parity bits are computed applying $L_{CW}=672$, R=13/16 LDPC matrix iii. Finally, the first 48 parity bits are discarded (punctured) to create the output codeword $$c^{(m)}=(b_1^{(m)}, b_2^{(m)}, \ldots, b_{546}^{(m)}, p_{49}^{(m)}, p_{50}^{(m)}, \ldots, p_{126}^{(m)}), m \leq N_{CW_{i_{user}}}$$

c. If $\rho=1$ and $L_{CW}=1248$, R=7/8:
  i. The output stream of scrambler is broken into the blocks of length 1092 bits such that the m-th data word is $$b^{(m)}=(b_1^{(m)}, b_2^{(m)}, \ldots, b_{1092}^{(m)}), m \leq N_{CW_{i_{user}}}$$

ii. To each data word, parity bits $p^{(m)}=(p_1^{(m)}, p_2^{(m)}, \ldots p_{L_{252}}^{(m)})$ are added to create the codeword $c^{(m)}=(b^{(m)}, p^{(m)})$, $m \leq N_{CW_{i_{user}}}$ such that $H \cdot (c_{(m)})^T = 0$, parity bits are computed applying $L_{CW}=1344$, R=13/16 LDPC matrix iii. Finally, the first 96 parity bits are discarded (punctured) to create the output codeword $c^{(m)} (b_1^{(m)}, b_2^{(m)}, \ldots, b_{1092}^{(m)}, p_{97}^{(m)}, p_{98}^{(m)}, \ldots, p_{252}^{(m)}), m \leq N_{CW_{i_{user}}}$ d. If $\rho=2$ and $L_{CW}=672$, R=1/2:
  i. The output stream of scrambler is broken into the blocks of length 168 bits such that the m-th data word is $$b^{(m)}=(b_1^{(m)}, b_2^{(m)}, \ldots, b_{168}^{(m)}), m \leq N_{CW_{i_{user}}}$$

ii. To each data word, zero bits $0^{(m)}=(0_1^{(m)}, 0_2^{(m)}, \ldots, 0_{168}^{(m)})$ and parity bits $p^{(m)}=(p_1^{(m)}, p_2^{(m)}, \ldots p_{168}^{(m)})$ are added to create the codeword $c^{(m)}=(b^{(m)}, 0^{(m)}, p^{(m)})$, $m \leq N_{CW_{i_{user}}}$ such that $H \cdot (c^{(m)})^T = 0$ iii. Finally, the zero bits are replaced with word $b^{(m)}$ repetition XORed by Pseudo Noise (PN) sequence that is generated from the LFSR used for MCS 1 scrambling. The LFSR is initialized to all ones initial seed value and reinitialized to the same seed after every codeword.

e. If $\rho=2$ and $L_{CW}=1344$, R=1/2:
  i. The output stream of scrambler is broken into the blocks of length 336 bits such that the m-th data word is $$b^{(m)}=(b_1^{(m)}, b_2^{(m)}, \ldots, b_{336}^{(m)}), m \leq N_{CW_{i_{user}}}$$

ii. To each data word, zero bits $0^{(m)}=(0_1^{(m)}, 0_2^{(m)}, \ldots, 0_{336}^{(m)})$ and parity bits $p^{(m)}=(p_1^{(m)}, p_2^{(m)}, \ldots, p_{336}^{(m)})$ are added to create the codeword $c^{(m)}=(b^{(m)}, 0^{(m)}, p^{(m)})$, $m \leq N_{CW_{i_{user}}}$ such that $H \cdot (c^{(m)})^T = 0$ iii. Finally, the zero bits are replaced with word $b^{(m)}$ repetition XORed by PN sequence that is generated from the LF SR used for MCS 1 scrambling. The LFSR is initialized to all ones initial seed value and reinitialized to the same seed after every codeword.

f. If ρ=1 and $L_{CW}$=504, R=2/3:
  i. The output stream of scrambler is broken into the blocks of length 336 bits such that the m-th data word is $b^{(m)}=(b_1^{(m)},b_2^{(m)},\ldots,b_{336}^{(m)}), m \leq N_{CW\ i_{user}}$ ii. To each data word, zero bits $0^{(m)}=(0_1^{(m)}, 0_2^{(m)}, \ldots, 0_{168}^{(m)})$ and parity bits $p^{(m)}=(p_1^{(m)}, p_2^{(m)}, \ldots, p_{168}^{(m)})$ are added to create the codeword $c^{(m)}=(b^{(m)}, 0^{(m)}, p^{(m)})$, $m \leq N_{CW\ i_{user}}$ such that $H \cdot (c_{(m)})^T = 0$, parity bits are computed applying $L_{CW}$=672, R=3/4 LDPC matrix iii. Finally, the zero bits are discarded to create the output codeword $c^{(m)}=(b^{(m)}, p^{(m)})$, $m \leq N_{CW\ i_{user}}$ g. If ρ=1 and $L_{CW}$=1008, R=2/3:
  i. The output stream of scrambler is broken into the blocks of length 672 bits such that the m-th data word is $b^{(m)}=(b_1^{(m)},b_2^{(m)},\ldots,b_{672}^{(m)}), m \leq N_{CW\ i_{user}}$ ii. To each data word, zero bits $0^{(m)}=(0_1^{(m)}, 0_2^{(m)}, \ldots, 0_{336}^{(m)})$ and parity bits $p^{(m)}=(p_1^{(m)}, p_2^{(m)}, \ldots, p_{336}^{(m)})$ are added to create the codeword $c^{(m)}=(b^{(m)}, 0^{(m)}, p^{(m)})$, $m \leq N_{CW\ i_{user}}$ such that $H \cdot (c^{(m)})^T = 0$, parity bits are computed applying $L_{CW}$=1344, R=3/4 LDPC matrix iii. Finally, the zero bits are discarded to create the output codeword $c^{(m)}=(b^{(m)}, p^{(m)})$, $m \leq N_{CW\ i_{user}}$ h. If ρ=1 and $L_{CW}$=504, R=5/6:
  i. The output stream of scrambler is broken into the blocks of length 420 bits such that the m-th data word is $b^{(m)}=(b_1^{(m)},b_2^{(m)},\ldots,b_{420}^{(m)}), m \leq N_{CW\ i_{user}}$ ii. To each data word, zero bits $0^{(m)}=(0_1^{(m)}, 0_2^{(m)}, \ldots, 0_{168}^{(m)})$ and parity bits $p^{(m)}=(p_1^{(m)}, p_2^{(m)}, \ldots, p_{84}^{(m)})$ are added to create the codeword $c^{(m)}=(b^{(m)}, 0^{(m)}, p^{(m)})$, $m \leq N_{CW\ i_{user}}$ such that $H \cdot (c^{(m)})^T = 0$, parity bits are computed applying for $L_{CW}$=672, R=7/8 LDPC matrix iii. Finally, the zero bits are discarded to create the output codeword $c^{(m)}=(b^{(m)}, p_{(m)})$, $m \leq N_{CW\ i_{user}}$ i. If ρ=1 and $L_{CW}$=1008, R=5/6:
  i. The output stream of scrambler is broken into the blocks of length 840 bits such that the m-th data word is $b^{(m)}=(b_1^{(m)},b_2^{(m)},\ldots,b_{840}^{(m)}), m \leq N_{CW\ i_{user}}$ ii. To each data word, zero bits $0^{(m)}=(0_1^{(m)}, 0_2^{(m)}, \ldots, 0_{336}^{(m)})$ and parity bits $p^{(m)}$ $(p_1^{(m)}, p_2^{(m)}, \ldots, p_{168}^{(m)})$ are added to create the codeword $c^{(m)}=(b^{(m)}, 0^{(m)}, p^{(m)})$, $m \leq N_{CW\ i_{user}}$ such that $H \cdot (c_{(m)})^T = 0$, parity bits are computed applying $L_{CW}$=1344, R=7/8 LDPC matrix iii. Finally, the zero bits are discarded to create the output codeword $c^{(m)}=(b^{(m)}, p^{(m)})$, $m \leq N_{CW\ i_{user}}$ j. If ρ=1 and $L_{CW}$=468, R=5/6:
  i. The output stream of scrambler is broken into the blocks of length 390 bits such that the m-th data word is $b^{(m)}=(b_1^{(m)},b_2^{(m)},\ldots,b_{390}^{(m)}), m \leq N_{CW\ i_{user}}$ ii. To each data word, zero bits $0^{(m)}=(0_1^{(m)}, 0_2^{(m)}, \ldots, 0_{168}^{(m)})$ and parity bits $p^{(m)}=(p_1^{(m)}, p_2^{(m)}, \ldots, p_{126}^{(m)})$ are added to create the codeword $c^{(m)}=(b^{(m)}, 0^{(m)}, p^{(m)})$, $m \leq N_{CW\ i_{user}}$ such that $H \cdot (c_{(m)})^T = 0$, parity bits are computed applying $L_{CW}$=672, R=13/16 LDPC matrix iii. Finally, the zero bits are discarded and the first 48 parity bits are discarded (punctured) to create the output codeword $c^{(m)}=(b_1^{(m)},b_2^{(m)},\ldots,b_{390}^{(m)},p_{49}^{(m)},p_{50}^{(m)},\ldots,p_{126}^{(m)}), m \leq N_{CW\ i_{user}}$ k. If ρ=1 and $L_{CW}$=936, R=5/6:
  i. The output stream of scrambler is broken into the blocks of length 780 bits such that the m-th data word is $b^{(m)}=(b_1^{(m)},b_2^{(m)},\ldots,b_{780}^{(m)}), m \leq N_{CW\ i_{user}}$ ii. To each data word, zero bits $0^{(m)}=(0_1^{(m)}, 0_2^{(m)}, \ldots, 0_{312}^{(m)})$ and parity bits $p^{(m)}=(p_1^{(m)}, p_2^{(m)}, \ldots, p_{252}^{(m)})$ are added to create the codeword $c^{(m)}=(b^{(m)}, 0^{(m)}, p^{(m)})$, $m \leq N_{CW\ i_{user}}$ such that $H \cdot (c_{(m)})^T = 0$, parity bits are computed applying $L_{CW}$=1344, R=13/16 LDPC matrix iii. Finally, the zero bits are discarded and the first 96 parity bits are discarded (punctured) to create the output codeword $c^{(m)}=(b_1^{(m)},b_2^{(m)},\ldots,b_{780}^{(m)},p_{97}^{(m)},p_{98}^{(m)},\ldots,p_{252}^{(m)}), m \leq N_{CW\ i_{user}}$ In some embodiments, the scrambled PSDU bits may be converted to LDPC codewords based on one or more, e.g., some or all, of the operations and/or parameters described above. In other embodiments, the scrambled PSDU bits may be converted to encoded codewords based on any other additional or alternative, encoding procedure, encoding scheme, parameters and/or operations.

c) Concatenate LDPC codewords one after the other to create the coded bits stream $\left(c^{(1)}, c^{(2)}, \ldots, c^{(N_{CW\ i_{user}})}\right).$ d) Compute the number of coded pad bits, $N_{BLK\_PAD_{i_{user}}},$ using the number of SC symbol blocks, $N_{BLKS_{i_{user}}}$, e.g., as follows:

$$N_{BLKS_{i_{user}}} = \left\lceil \frac{N_{CW_{i_{user}}} \cdot L_{CW_{i_{user}}}}{N_{SPB} \cdot N_{CB} \sum_{i_{SS}=1}^{N_{SS_{i_{user}}}} N_{CBPS_{i_{user}\ i_{SS}}}} \right\rceil$$

If BRP PPDU and $N_{BLKS_{i_{user}}} < N_{BLKS\ min}$, then $N_{BLKS_{i_{user}}} = N_{BLKS\ min}$ If STBC applied and $N_{BLKS_{i_{user}}}$ is odd, then $N_{BLKS_{i_{user}}} = N_{BLKS_{i_{user}}} + 1$ $N_{BLK\_PAD_{i_{user}}} =$ $$N_{BLKS_{i_{user}}} \cdot N_{SPB} \cdot N_{CB} \cdot \sum_{i_{SS}=1}^{N_{SS_{i_{user}}}} N_{CBPS_{i_{user}\ i_{SS}}} - N_{CW_{i_{user}}} \cdot L_{CW_{i_{user}}}$$

Concatenate coded bits with $$N_{BLK\_PAD_{i_{user}}}$$

zero bits. They are scrambled using the continuation of the scrambler sequence that scrambled the PSDU bits and data pad bits at the step a).

e) Distribute the encoded and padded bits over the $N_{SSi_{user}}$ spatial streams on the group basis with the number of $N_{CBPSi_{user} \, i_{SS}}$ bits in the group. The first group of bits comes to the first spatial stream, the second group of bits comes to the second spatial stream, and so on. The procedure may be repeated, for example, when the maximum number of spatial streams $N_{SSi_{user}}$ is reached. The procedure may end, for example, when all PSDU encoded bits including $$N_{BLK\_PAD_{i_{user}}}$$

pad bits are distributed over the $N_{SSi_{user}}$ spatial streams. For example, for each user, if STBC coding is applied, then a single spatial stream $N_{SSi_{user}}=1$ is mapped to two space-time streams $N_{SSi_{user}}=2$. Otherwise, a one-to-one mapping of $N_{SSi_{user}}$ spatial streams to $N_{SSi_{user}}$ space-time streams shall be applied.

In some demonstrative embodiments, the value of $N_{BLKSmin}$ may be defined on a per user basis, for example, in a Requested Beam Refinement Protocol (BRP) SC Blocks field within a responder's EDMG Capabilities element, and/or in any other message and/or field.

In some demonstrative embodiments, for example, if the Requested BRP SC Blocks field is not included in the EDMG Capabilities element, then $N_{BLKSmin}$ may be set to a predefined value, for example, $N_{BLKSmin}$=aBRPminSCblocks, or any other value.

In some demonstrative embodiments, device 102 may be configured to encode the PSDU bits of a SC EDMG PPDU according to an encoding procedure including some or all of the operations of the LDPC encoding procedure described above and/or one or more additional or alternative operations, parameters, and/or procedures.

In some demonstrative embodiments, device 102 may be configured to interleave symbols of a SC symbol block in the spatial stream, e.g., as described below.

In some demonstrative embodiments, device 102 may be configured to implement an interleaving scheme, which may be configured to support a vertical encoding approach, e.g., as described above with reference to FIGS. 5 and/or 6.

In some demonstrative embodiments, device 102 may be configured to implement an interleaving scheme, which may be configured to be implemented with an encoding procedure according to the vertical encoding approach, e.g., as described below.

In some demonstrative embodiments, the interleaving scheme may be configured based on one or more parameters and/or operations implemented by the encoding procedure, e.g., as described below.

In some demonstrative embodiments, the interleaving scheme may be configured to interleave modulated complex symbols within a SC symbol block, for example, based on one or more, e.g., different, modulation parameters, e.g., as described below.

In some demonstrative embodiments, controller 124 may be configured to cause, trigger, and/or control the wireless station implemented by device 102 to interleave a plurality of symbols in a SC symbol block for a spatial stream of one or more spatial streams, for example, based at least on a count of 2.16 GHz channels in a channel bandwidth for transmission of the EDMG PPDU, and on a count of the one or more spatial streams, e.g., as described below.

In some demonstrative embodiments, controller 124 may be configured to cause, trigger, and/or control the wireless station implemented by device 102 to generate a permuted SC symbol block, for example, by permuting the SC symbol block according to an array of permutation indexes, e.g., as described below.

In some demonstrative embodiments, the array of permutation indexes may be based, for example, on a first permutation parameter and a second permutation parameter, e.g., as described below.

In some demonstrative embodiments, the first and second permutation parameters may be based, for example, at least on the count of 2.16 GHz channels in the channel bandwidth, e.g., as described below.

In some demonstrative embodiments, the second permutation parameter may be based on the first permutation parameter, e.g., as described below.

In some demonstrative embodiments, controller 124 may be configured to cause, trigger, and/or control the wireless station implemented by device 102 to permute the SC symbol block, denoted $d_{in}^{(i_{SS},q)}$, corresponding to a SC symbol block number q in an $i_{SS}$-th spatial stream, into a permuted SC symbol block, denoted $d_{out}^{(i_{SS},q)}$, e.g., as follows:

$$d_{out}^{(i_{SS},q)} = \left(d_{idx(0)}^{(i_{SS},q)}, d_{idx(1)}^{(i_{SS},q)}, \ldots, d_{idx((N_{SPB} \times N_{CB})-1)}^{(i_{SS},q)}\right) \quad (1)$$

wherein:

$$d_{in}^{(i_{SS},q)} = \left(d_0^{(i_{SS},q)}, d_1^{(i_{SS},q)}, \ldots, d_{N_{SPB} \times N_{CB}-1}^{(i_{SS},q)}\right)$$

wherein $N_{SFB} \times N_{CB}$ denotes a count of symbols per SC symbol block for the count of 2.16 GHz channels in the channel bandwidth, denoted $N_{CB}$, and idx( ) denotes a permutation index in the array of permutation indexes.

In some demonstrative embodiments, the array of permutation indexes, denoted idx, may be defined, e.g., as follows:

$$idx(j \times N_x + i) = N_y \times i + j, \quad (2)$$

where $i = 0, 1, \ldots, N_x - 1$ and $j = 0, 1, \ldots, N_y - 1$ $$x = \left(N_{SPB} \times N_{CB} \times \sum_{i_{SS}=1}^{N_{SSi_{user}}} N_{CBPSi_{user} i_{SS}}\right) / L_{CWi_{user}}$$

wherein:

$x \leq 3 \times N_{CB}: N_x = 2 \times N_{CB}$ $3 \times N_{CB} < x \leq 6 \times N_{CB}: N_x = 4 \times N_{CB}$ $6 \times N_{CB} < x \leq 12 \times N_{CB}: N_x = 8 \times N_{CB}$ $12 \times N_{CB} < x \leq 24 \times N_{CB} : N_x = 16 \times N_{CB}$ $x > 24 \times N_{CB} : N_x = 32 \times N_{CB}$ wherein:

$N_y = (N_{SPB} \times N_{CB})/N_x$ wherein $N_{SPB} \times N_{CB}$ denotes a count of symbols per SC symbol block for the count of 2.16 GHz channels in the channel bandwidth, denoted $N_{CB}$, $N_{SSi_{user}}$ denotes a count of spatial streams for an $i_{user}$-th user, $N_{CBPSi_{user} \ i_{SS}}$ denotes a count of coded bits per symbol for the $i_{user}$-th user and an $i_{SS}$-th spatial stream, and $L_{CW \ i_{user}}$ denotes an LDPC codeword length for the $i_{user}$-th user.

In some demonstrative embodiments, the SC symbol block may include 16 Quadrature Amplitude Modulation (QAM) symbols or 64-QAM symbols, e.g., as described below.

In some demonstrative embodiments, device 102 may be configured to implement an interleaver design, which may be used with an encoding procedure to support the generation of EDMG SC PPDUs using a vertical encoding scheme, e.g., as described below.

In some demonstrative embodiments, device 102 may be configured to implement an interleaver, e.g., interleaver 510 (FIG. 5), which may be defined for one or more modulation schemes, e.g., as described below.

In some demonstrative embodiments, device 102 may be configured to implement an interleaver, e.g., interleaver 510 (FIG. 5), which may be defined for one or more QAM schemes and/or one or more Non-Uniform Constellation (NUC) schemes, e.g., as described below.

In some demonstrative embodiments, device 102 may be configured to implement an interleaver, e.g., interleaver 510 (FIG. 5), which may be defined for π/2-16-QAM, π/2-64-QAM, and/or π/2-64-NUC modulations, and/or any other modulation.

In some demonstrative embodiments, interleaver 510 (FIG. 5) may be configured to support a modulation scheme, which may be based on a number of spatial streams per a user, e.g., as described below.

In one example, for $N_{SSi_{user}} = 1$, interleaver 510 (FIG. 5) shall be applied for π/2-64-QAM, and/or π/2-64-NUC modulations only.

In another example, for $N_{SSi_{user}} > 1$, interleaver 510 (FIG. 5) shall be applied for spatial streams with π/2-16-QAM, π/2-64-QAM, and/or π/2-64-NUC modulations.

In other embodiments, interleaver 510 (FIG. 5) may be configured to support any other additional and/or alternative QAM schemes, NUC schemes and/or any other modulation schemes, and/or any other additional or alternative parameters.

In some demonstrative embodiments, interleaver 510 (FIG. 5) may be configured to perform interleaving of modulated complex symbols inside a SC symbol block, e.g., as described below.

In some demonstrative embodiments, interleaver 510 (FIG. 5) may be configured to perform the interleaving inside a SC symbol block, for example, according to one or more interleaving parameters, which may be based on one or more parameters of the encoding procedure, e.g., as described below.

In some demonstrative embodiments, one or more interleaving parameters of interleaver 510 (FIG. 5) may depend on the parameters $N_{SPB}$, $N_{CB}$, $N_{SSi_{user}}$, $L_{CW \ i_{user}}$, and/or $N_{CBPSi_{user} \ i_{SS}}$, e.g., as described below. In other embodiments, one or more additional or alternative parameters may be implemented.

In some demonstrative embodiments, interleaver 510 (FIG. 5) may be configured to interleave symbols of a SC symbol block to generate a permuted SC symbol block, for example, according to a plurality of permutation indexes, e.g., as described below.

In some demonstrative embodiments, a permuted symbol in the permuted SC symbol block may include a symbol of the SC symbol block having an index corresponding to a permutation index of the permuted symbol, e.g., as described below.

In some demonstrative embodiments, interleaver 510 (FIG. 5) may be configured to determine the permutation index, for example, based on one or more parameters of the encoding procedure, e.g., as described below.

In some demonstrative embodiments, interleaver 510 (FIG. 5) may be configured to determine the permutation index, for example, based on the parameters $N_{SPB}$, $N_{CB}$, $N_{SSi_{user}}$, $L_{CW \ i_{user}}$, and/or $N_{CBPSi_{user} \ i_{SS}}$, e.g. as described below.

In some demonstrative embodiments, interleaver 510 (FIG. 5) may be configured to determine the permutation index, for example, based on a number of symbols per SC symbol block, e.g., as described below.

In some demonstrative embodiments, interleaver 510 (FIG. 5) may be configured to determine the permutation index, for example, based on a number of contiguous channels to be used for PPDU transmission, as described below.

In some demonstrative embodiments, interleaver 510 (FIG. 5) may be configured to determine the permutation index, for example, based on a codeword length, e.g., per user, as described below.

In some demonstrative embodiments, interleaver 510 (FIG. 5) may be configured to determine the permutation index, for example, based on a number of spatial streams, e.g., per user, as described below.

In some demonstrative embodiments, interleaver 510 (FIG. 5) may be configured to determine the permutation index based on a sum of a plurality of numbers of coded bits per symbol block corresponding to a plurality of spatial streams, e.g., per user, as described below.

In other embodiments, one or more additional or alternative parameters may be implemented.

In some demonstrative embodiments, an input to the interleaver scheme may include a SC symbol block $d_{in}^{(q)}$, e.g., of a length $N_{SPB} \times N_{CB}$, which may include, for example, a plurality of symbols, for example, composed of π/2-16-QAM, π/2-64-QAM, or π/2-64-NUC symbols.

For example, the SC symbol block $d_{in}^{(q)}$ may include a block $d_{in}^{(q)} = (d_0^{(q)}, d_1^{(q)}, \ldots, d_{N_{SPB} \times N_{CB}-1}^{(q)})$, wherein q denotes a SC symbol block number, e.g., q=0, 1, ..., $N_{BLKS \ i_{user}} - 1$.

In some demonstrative embodiments, the interleaver scheme may be configured to provide an output including a permuted SC symbol block, e.g., of the same length as the SC symbol block $d_{in}^{(q)}$.

In some demonstrative embodiments, the permuted SC symbol block may be defined, e.g., as follows:

$$d_{out}^{(q)} = (d_{idx(0)}^{(q)}, d_{idx(1)}^{(q)}, \ldots, d_{idx(N_{SPB} \times N_{CB}-1)}^{(q)})$$

wherein idx denotes an array of permutation indexes.

In some demonstrative embodiments, the array of permutation indexes idx may be constructed, e.g., according to Equation (2), and/or any other permutation array.

In other embodiments, any other additional or alternative parameters may be used, and/or any other definition of the permutation index may be defined.

In some demonstrative embodiments, device 102 may be configured to encode the PSDU bits of a SC EDMG PPDU according to an encoding procedure, which may be configured for channel aggregation, e.g., as described below.

In some demonstrative embodiments, devices 102 and/or 140 may be configured to support communication according to a channel aggregation scheme, for example, supporting the aggregation of two 2.16 GHz channels and/or two 4.32 GHz channels. In other embodiments, any other additional or alternative number of channels and/or any other additional or alternative channel widths may be supported for channel aggregation.

In some demonstrative embodiments, an encoding procedure, e.g., the vertical MIMO encoding procedure described above, may be extended to support channel aggregation, e.g., as follows:

- The scrambler, e.g., scrambler 502 (FIG. 5), may be configured to scramble the data to reduce the probability of long sequences of 0s and 1s.
- The encoder, e.g., LDPC encoder 504 (FIG. 5), may be configured to encode the data to enable error correction. It makes bits padding to get an integer number of codewords and SC symbol blocks.
- The stream parser, e.g., stream parser 506 (FIG. 5), may divide the output of LDPC encoder into the groups of bits. Each group of bits is called a spatial stream.
- The different spatial streams obtained after the stream parser may be mapped to one of the aggregated channels.
- The number of spatial streams in each channel may be the same or different.
- Each spatial stream may be sent to different mapping devices.
- The constellation mapper, e.g., constellation mapper 508 (FIG. 5), may map the sequence of bits in each stream to constellation points (complex numbers).
- The interleaver, e.g., interleaver 510 (FIG. 5), may perform interleaving inside a SC symbol block.
- For each aggregated channel, the $N_{SS}$ spatial streams may be converted into $N_{STS}$ space-time streams using a space-time block code (STBC), for example, STBC 512 (FIG. 5), e.g., if STBC is used, and/or a spatial mapper, e.g., spatial mapper 514 (FIG. 5), may map space-time streams to transmit chains, e.g., if MIMO transmission is used.

In some demonstrative embodiments, for example, in the channel aggregation case, all streams in both aggregated channels may have the same code rate; and/or different streams in each aggregated channel could use different modulation schemes, e.g., similar to the procedure described above for single-user and/or multi-user cases.

In some demonstrative embodiments, devices 102 and/or 140 may be configured to generate, transmit, receive, and/or process one or more EDMG PPDUs, e.g., EDMG SC PPDUs, according to an encoding scheme, e.g., a vertical encoding scheme, which may include encoding data bits, for example, scrambled data bits, e.g., scrambled PSDU bits, for example, prior to stream parsing, e.g., as described below.

In some demonstrative embodiments, devices 102 and/or 140 may be configured to encode the PSDU bits of a EDMG SC PPDU, for example, according to an encoding procedure, which may be configured for channel aggregation, e.g., as described below.

In some demonstrative embodiments, for example, devices 102 and/or 140 may be configured to encode the PSDU bits of the EDMG SC PPDU according to an encoding scheme, which may be configured for transmission over an aggregated channel bandwidth including a plurality of channels, e.g., as described below.

In some demonstrative embodiments, devices 102 and/or 140 may be configured to support communication according to a channel aggregation scheme, for example, supporting the aggregation of two 2.16 GHz channels and/or two 4.32 GHz channels. In other embodiments, any other additional or alternative number of channels and/or any other additional or alternative channel widths may be supported for channel aggregation.

In some demonstrative embodiments, vertical MIMO encoding procedure described above, may be extended to support channel aggregation, e.g., as described below.

In some demonstrative embodiments, an encoding scheme for channel aggregation may be configured such that spatial streams to be transmitted over different aggregated channels may have the same code rate.

In some demonstrative embodiments, an encoding procedure may be configured to support the generation of EDMG SC PPDUs using a vertical approach for the case when the PPDU is to be transmitted over aggregated channels, for example, such that streams to be transmitted in different channels may have different coding rates, e.g., as described below.

In some demonstrative embodiments, the encoding procedure may define a SC mode EDMG SU PSDU or MU PSDU per user basis encoding, e.g., as described below.

In some demonstrative embodiments, the encoding procedure may include an LDPC encoding, which may employ codeword lengths of $L_{CW}$=468, 504, 624, 672, 936, 1008, 1248, and/or 1344, and/or code rates of R=1/2, 5/8, 2/3, 3/4, 13/16, 5/6, and/or 7/8. In other embodiments, any other encoding scheme, code rates, and/or codeword lengths may be implemented.

In some demonstrative embodiments, for example, for 2.16+2.16 GHz and/or 4.32+4.32 GHz channel bandwidth configurations, a channel $i_{ch}$=1 may correspond to a channel containing a primary 2.16 GHz channel, and/or a channel $i_{ch}$=2 may correspond to a channel containing the secondary 2.16 GHz channels.

In some demonstrative embodiments, processing and/or communication of the EDMG SC PHY PPDU may be defined and/or performed based on one or more of the following parameters, and/or one or more additional or alternative parameters:

TABLE 2

| Symbol | Explanation |
| --- | --- |
| $i_{SS}$ | Spatial stream number |
| $N_{SS\ i_{user}}$ | Total number of spatial streams for $i_{user}$-th user |
| $i_{user}$ | User number |
| $N_{user}$ | Total number of users in a multi user transmission |

TABLE 2-continued

| Symbol | Explanation |
|---|---|
| $i_{STS\ i_{user}}$ | Space-time stream number for $i_{user}$-th user |
| $N_{STS\ i_{user}}$ | Total number of space-time streams for $i_{user}$-th user |
| $i_{STS}$ | Space-time stream number over all users |
| $N_{STS}$ | Total number of space-time streams over all users |
| $Length_{i_{user}}$ | PSDU length in octets for $i_{user}$-th user |
| $Length_{i_{user}i_{ch}}$ | PSDU length in octets for $i_{user}$-th user and $i_{ch}$-th channel* |
| $L_{CW}$ | LDPC codeword length in bits, it can be equal to 468, 504, 624, 672, 936, 1008, 1248, and 1344, and/or another length |
| $L_{CW\ i_{user}i_{ch}}$ | LDPC codeword length in bits for $i_{user}^{th}$ user and $i_{ch}$-th channel* |
| $L_{CWD}$ | Number of systematic data bits per LDPC codeword |
| $L_{CWP}$ | Number of parity bits per LDPC codeword |
| $\rho_{i_{user}i_{ch}}$ | Repetition factor for $i_{user}^{th}$ user and $i_{ch}$-th channel*; is equal to 2 for MCS 1 and equal to 1 for all other MCSs, and/or any other value |
| $R_{i_{user}i_{SS}}$ | LDPC code rate for $i_{user}^{th}$ user and $i_{ch}^{th}$ channel*; can be equal to ½, 5/8, 2/3, ¾, 13/16, 5/6, 7/8, and/or any other value |
| $N_{CW\ i_{user}i_{ch}}$ | Total number of LDPC codewords for $i_{user}^{th}$ user and $i_{ch}^{th}$ channel* |
| $N_{DATA\_PAD\ i_{user}i_{ch}}$ | Number of pad bits for the $i_{user}^{th}$ user and $i_{ch}^{th}$ channel* to reach an integer number of LDPC codewords |
| $N_{BLKS\ i_{user}}$ | Total number of SC symbol blocks for the $i_{user}^{th}$ user |
| $N_{BLKS\ i_{user}i_{ch}}$ | Total number of SC symbol blocks for the $i_{user}^{th}$ user and $i_{ch}^{th}$ channel* |
| $N_{BLKS\ min}$ | Minimum number of total SC symbol blocks for BRP PPDU transmission |
| $N_{BLK\_PAD\ i_{user}i_{ch}}$ | Number of pad bits for the $i_{user}^{th}$ user and $i_{ch}^{th}$ channel* to reach an integer number of SC symbol blocks |
| $N_{CB}$ | Number of contiguous 2.16 GHz channels used for PPDU transmission |
| $N_{CBPB}$ | Number of coded bits per SC symbol block; depends on modulation type and is different for different GI types. |
| $N_{CBPS\ i_{user}i_{SS}}$ | Number of coded bits per symbol (constellation point) for the $i_{user}^{th}$ user and $i_{SS}^{th}$ spatial stream |
| $N_{SPB}$ | Number of symbols (constellation points) per SC symbol block; may depend on the GI type. |
| $N_{BLKS\ max}$ | Maximum number of SC symbol blocks over all users |
| $N_{PAD\_BLK\ i_{user}}$ | The number of pad SC symbol blocks for the $i_{user}^{th}$ user that is required to align PPDUs over different users in time |

In some demonstrative embodiments, some or all of the parameters of Table 2 may be implemented, one or more parameters may be defined in a different manner, and/or one or more additional or alternative parameters may be implemented.

In some demonstrative embodiments, device 102 may be configured to generate a plurality of sequences of scrambled bits based on data bits of a PSDU, the plurality of sequences of scrambled bits corresponding to a plurality of channels of an aggregated channel bandwidth, e.g., as described below.

In some demonstrative embodiments, device 102 may be configured to distribute data bits for a user to a plurality of data bit sequences corresponding to a respective plurality of channels to be aggregated for transmission to the user.

For example, device 102 may be configured to distribute data bits for a user to first and second data bit sequences corresponding to first and second respective channels to be aggregated for transmission to the user, for example, according to an 2.16+2.16 GHz and/or an 4.32+4.32 GHz channel bandwidth configuration e.g., as described below.

In some demonstrative embodiments, controller 124 may be configured to cause, trigger, and/or control the wireless station implemented by device 102 to generate a plurality of sequences of scrambled bits, for example, based on data bits of a PSDU, e.g., as described below.

In some demonstrative embodiments, the plurality of sequences of scrambled bits may correspond to a plurality of channels of an aggregated channel bandwidth, e.g., as described below.

In some demonstrative embodiments, controller 124 may be configured to cause, trigger, and/or control the wireless station implemented by device 102 to encode the plurality of sequences of scrambled bits into a plurality of sequences of encoded bits, e.g., as described below.

In some demonstrative embodiments, controller 124 may be configured to cause, trigger, and/or control the wireless station implemented by device 102 to generate a plurality of sequences of encoded padded bits, for example, based on the plurality of sequences of encoded bits, e.g., as described below.

In some demonstrative embodiments, device 102 may generate a sequence of encoded padded bits, for example, by padding a sequence of encoded bits with coded pad bits, e.g., as described below.

In some demonstrative embodiments, controller 124 may be configured to cause, trigger, and/or control the wireless station implemented by device 102 to distribute the plurality of sequences of encoded padded bits to a plurality of spatial streams, e.g., as described below.

In some demonstrative embodiments, controller 124 may be configured to cause, trigger, and/or control the wireless station implemented by device 102 to transmit a SC transmission, for example, based on the plurality of spatial streams over the aggregated channel bandwidth in a frequency band above 45 GHz, e.g., as described below.

In some demonstrative embodiments, device 102 may be configured to generate a plurality of sequences of scrambled bits, for example, based on the plurality of sequences of data bits for the user, e.g., as described below.

In some demonstrative embodiments, a sequence of scrambled bits may include scrambled data bits and scrambled data padding bits, e.g., as described below.

In some demonstrative embodiments, the number of data padding bits may be determined, for example, prior to stream parsing, e.g., based on the length of the sequence of data bits, e.g., for a user for a channel, the codeword length for the user for the channel, and/or a code rate for the user for the channel, e.g., as described below.

In some demonstrative embodiments, device 102 may be configured to encode the plurality of sequences of scrambled bits into a plurality of sequences of encoded bits, e.g., as described below.

In some demonstrative embodiments, device 102 may be configured to encode a sequence of scrambled bits into codewords, e.g., into LDPC codewords, e.g., as described below.

In some demonstrative embodiments, controller 124 may be configured to cause, trigger, and/or control the wireless station implemented by device 102 to encode a sequence of scrambled bits into a plurality of LDPC codewords, and to generate the sequence of encoded bits, for example, based on the plurality of LDPC codewords, e.g., as described below.

In some demonstrative embodiments, device 102 may be configured to generate a plurality of coded bit streams, for example, based on the codewords in the plurality of encoded sequences for the plurality of channels, e.g., as described below.

In some demonstrative embodiments, device 102 may be configured to generate a coded bit stream for a channel based on the codewords in an encoded sequence of the channel, e.g., by concatenating the LDPC codewords in the encoded sequence, e.g., as described below.

In some demonstrative embodiments, device 102 may be configured to generate a plurality of sequences of encoded padded bits based on the plurality of coded bit streams, e.g., as described below.

In some demonstrative embodiments, device 102 may be configured to generate a sequence of encoded padded bits for a channel, for example, based on the coded bit stream for the channel and coded pad bits, e.g., as described below.

In some demonstrative embodiments, device 102 may be configured to distribute the plurality of sequences of encoded and padded bits over the spatial streams, e.g., as described below.

In some demonstrative embodiments, device 102 may be configured to implement an LDPC encoding process, for example, to encode data bits for a user, e.g., as described below.

In some demonstrative embodiments, an LDPC encoding process for an $i_{user}$-th user may include one or more operations, e.g., as follows:

a) For 2.16+2.16 GHz and/or 4.32+4.32 GHz channel bandwidth configurations, divide the input PSDU length $Length_{i_{user}}$ between the $Length_{i_{user}\ i_{ch}=1}$ and $Length_{i_{user}\ i_{ch}=2}$, e.g., as follows:

$$Length_{i_{user} i_{ch}=1} = \left\lceil \frac{Length_{i_{user}} \cdot \left(\frac{R_{i_{user} i_{ch}=1}}{\rho_{i_{user} i_{ch}=1}}\right) \cdot M_{i_{user} i_{ch}=1}}{\left(\frac{R_{i_{user} i_{ch}=1}}{\rho_{i_{user} i_{ch}=1}}\right) \cdot M_{i_{user} i_{ch}=1} + \left(\frac{R_{i_{user} i_{ch}=2}}{\rho_{i_{user} i_{ch}=2}}\right) \cdot M_{i_{user} i_{ch}=2}} \right\rceil$$

-continued $$M_{i_{user} i_{ch}=1} = \sum_{i_{SS}=1}^{N_{SS_{i_{user}}}/2} N_{CBPS\ i_{user}\ i_{SS}}$$

$$M_{i_{user} i_{ch}=2} = \sum_{i_{SS}=N_{SS_{i_{user}}}/2+1}^{N_{SS_{i_{user}}}} N_{CBPS\ i_{user}\ i_{SS}}$$

$$Length_{i_{user} i_{ch}=2} = Length_{i_{user}} - Length_{i_{user} i_{ch}=1}$$

where $Length_{i_{user}\ i_{ch}=1}$ is allocated to the channel containing the primary 2.16 GHz channel and $Length_{i_{user}\ i_{ch}=2}$ is allocated to the channel containing the secondary 2.16 GHz channels.

For 2.16 GHz, 4.32 GHz, 6.48 GHz, and/or 8.64 GHz channel bandwidth configurations (e.g., when channel aggregation is not used), define the $Length_{i_{user}\ i_{ch}=1}=Length_{i_{user}}$, $Length_{i_{user}\ i_{ch}=2}=0$.

b) Compute the number of data pad bits for $i_{ch}$-th channel $$N_{DATA\_PAD\ i_{user} i_{ch}},$$

using the number of LDPC codewords $N_{CW\ i_{user}\ i_{ch}}$, e.g., as follows:

$$N_{CW\ i_{user} i_{ch}} = \left\lceil \frac{Length_{i_{user} i_{ch}} \cdot 8}{L_{CW\ i_{user} i_{ch}} \cdot \frac{R_{i_{user} i_{ch}}}{\rho_{i_{user} i_{ch}}}} \right\rceil, i_{ch} = 1,2$$

$$N_{DATA\_PAD\ i_{user} i_{ch}} =$$

$$N_{CW\ i_{user} i_{ch}} \cdot L_{CW\ i_{user} i_{ch}} \cdot \left(\frac{R_{i_{user} i_{ch}}}{\rho_{i_{user} i_{ch}}}\right) - Length_{i_{user} i_{ch}} \cdot 8, i_{ch} = 1,2$$

The scrambled PSDU for $i_{ch}$-th channel is concatenated with $$N_{DATA\_PAD\ i_{user} i_{ch}}$$

zero bits. They are scrambled using the continuation of the scrambler sequence that scrambled the PSDU input bits. The zero bits for $i_{ch}=1$ channel are scrambled first and the zero bits for $i_{ch}=2$ channel are scrambled second.

c) For each $i_{ch}$-th channel convert the scrambled PSDU bits to LDPC codewords, e.g., as follows:

a. If $\rho=1$ and $L_{CW}=672, 1344$:

i. The output stream of scrambler is broken into the blocks of length $L_{CWD}=L_{CW}\lambda R$ bits such that the m-th data word is $$b^{(m)}=(b_1^{(m)},b_2^{(m)},\ldots,b_{L_{CWD}}^{(m)}), m \leq N_{CW\ i_{user}\ i_{ch}}$$

ii. To each data word, parity bits $p^{(m)}=(p_1^{(m)}, p_2^{(m)},\ldots,p_{L_{CWP}}^{(m)})$, $L_{CWP}=L_{CW}-L_{CWD}$, are added to create the codeword $c^{(m)}=(b^{(m)},p^{(m)})$, $m \leq N_{CW\ i_{user}\ i_{ch}}$ such that $H \cdot (c_{(m)})^T=0$ b. If $\rho=1$ and $L_{CW}=624$, R=7/8:
  i. The output stream of scrambler is broken into the blocks of length 546 bits such that the m-th data word is $b^{(m)}=(b_1^{(m)}, b_2^{(m)}, \ldots, b_{546}^{(m)}), m \leq N_{CW\ i_{user}\ i_{ch}}$ ii. To each data word, parity bits $p^{(m)}=(p_1^{(m)}, p_2^{(m)}, \ldots, p_{L_{126}}^{(m)})$ are added to create the codeword $c^{(m)}=(b^{(m)}, p^{(m)})$, $m \leq N_{CW\ i_{user}\ i_{ch}}$ such that $H \cdot (c_{(m)})^T=0$, parity bits are computed applying $L_{CW}=672$, R=13/16 LDPC matrix
  iii. Finally, the first 48 parity bits are discarded (punctured) to create the output codeword $c^{(m)}=(b_1^{(m)}, b_2^{(m)}, \ldots, b_{546}^{(m)}, p_{49}^{(m)}, p_{50}^{(m)}, \ldots, p_{126}^{(m)}), m \leq N_{CW\ i_{user}\ i_{ch}}$ c. If $\rho=1$ and $L_{CW}=1248$, R=7/8:
  i. The output stream of scrambler is broken into the blocks of length 1092 bits such that the m-th data word is $b^{(m)}=(b_1^{(m)}, b_2^{(m)}, \ldots, b_{1092}^{(m)}), m \leq N_{CW\ i_{user}\ i_{ch}}$ ii. To each data word, parity bits $p^{(m)}=(p_1^{(m)}, p_2^{(m)}, \ldots, p_{L_{252}}^{(m)})$ are added to create the codeword $c^{(m)}=(b^{(m)}, p^{(m)})$, $m \leq N_{CW\ i_{user}\ i_{ch}}$ such that $H \cdot (c_{(m)})^T=0$, parity bits are computed applying $L_{CW}=1344$, R=13/16 LDPC matrix
  iii. Finally, the first 96 parity bits are discarded (punctured) to create the output codeword $c^{(m)}=(b_1^{(m)}, b_2^{(m)}, \ldots, b_{1092}^{(m)}, p_{97}^{(m)}, p_{98}^{(m)}, \ldots, p_{252}^{(m)}), m \leq N_{CW\ i_{user}\ i_{ch}}$ d. If $\rho=2$ and $L_{CW}=672$, R=1/2:
  i. The output stream of scrambler is broken into the blocks of length 168 bits such that the m-th data word is $b^{(m)}=(b_1^{(m)}, b_2^{(m)}, \ldots, b_{168}^{(m)}), m \leq N_{CW\ i_{user}\ i_{ch}}$ ii. To each data word, zero bits $0^{(m)}=(0_1^{(m)}, 0_2^{(m)}, \ldots, 0_{168}^{(m)})$ and parity bits $p^{(m)}=(p_1^{(m)}, p_2^{(m)}, \ldots, p_{168}^{(m)})$ are added to create the codeword $c^{(m)}=(b^{(m)}, 0^{(m)}, p^{(m)})$, $m \leq N_{CW\ i_{user}\ i_{ch}}$ such that $H \cdot (c_{(m)})^T=0$
  iii. Finally, the zero bits are replaced with word $b^{(m)}$ repetition XORed by PN sequence that is generated from the LF SR used for MCS 1 scrambling. The LFSR is initialized to all ones initial seed value and reinitialized to the same seed after every codeword.

e. If $\rho=2$ and $L_{CW}=1344$, R=1/2:
  i. The output stream of scrambler is broken into the blocks of length 336 bits such that the m-th data word is $b^{(m)}=(b_1^{(m)}, b_2^{(m)}, \ldots, b_{336}^{(m)}), m \leq N_{CW\ i_{user}\ i_{ch}}$ ii. To each data word, zero bits $0^{(m)}=(0_1^{(m)}, 0_2^{(m)}, \ldots, 0_{336}^{(m)})$ and parity bits $p^{(m)}=(p_1^{(m)}, p_2^{(m)}, \ldots, p_{336}^{(m)})$ are added to create the codeword $c^{(m)}=(b^{(m)}, 0^{(m)}, p^{(m)})$, $m \leq N_{CW\ i_{user}\ i_{ch}}$ such that $H \cdot (c_{(m)})^T=0$
  iii. Finally, the zero bits are replaced with word $b^{(m)}$ repetition XORed by PN sequence that is generated from the LF SR used for MCS 1 scrambling. The LFSR is initialized to all ones initial seed value and reinitialized to the same seed after every codeword.

f. If $\rho=1$ and $L_{CW}=504$, R=2/3:
  i. The output stream of scrambler is broken into the blocks of length 336 bits such that the m-th data word is $b^{(m)}=(b_1^{(m)}, b_2^{(m)}, \ldots, b_{336}^{(m)}), m \leq N_{CW\ i_{user}\ i_{ch}}$ ii. To each data word, zero bits $0^{(m)}=(0_1^{(m)}, 0_2^{(m)}, \ldots, 0_{168}^{(m)})$ and parity bits $p^{(m)}=(p_1^{(m)}, p_2^{(m)}, \ldots, p_{168}^{(m)})$ are added to create the codeword $c^{(m)}=(b^{(m)}, 0^{(m)}, p^{(m)})$, $m \leq N_{CW\ i_{user}\ i_{ch}}$ such that $H \cdot (c_{(m)})^T=0$, parity bits are computed applying $L_{CW}=672$, R=3/4 LDPC matrix
  iii. Finally, the zero bits are discarded to create the output codeword $c^{(m)}=(b^{(m)}, p^{(m)})$, $m \leq N_{CW\ i_{user}\ i_{ch}}$ g. If $\rho=1$ and $L_{CW}=1008$, R=2/3:
  i. The output stream of scrambler is broken into the blocks of length 672 bits such that the m-th data word is $b^{(m)}=(b_1^{(m)}, b_2^{(m)}, \ldots, b_{672}^{(m)}), m \leq N_{CW\ i_{user}\ i_{ch}}$ ii. To each data word, zero bits $0^{(m)}=(0_1^{(m)}, 0_2^{(m)}, \ldots, 0_{336}^{(m)})$ and parity bits $p^{(m)}=(p_1^{(m)}, p_2^{(m)}, \ldots, p_{336}^{(m)})$ are added to create the codeword $c^{(m)}=(b^{(m)}, 0^{(m)}, p^{(m)})$, $m \leq N_{CW\ i_{user}\ i_{ch}}$ such that $H \cdot (c_{(m)})^T=0$, parity bits are computed applying $L_{CW}=1344$, R=3/4 LDPC matrix
  iii. Finally, the zero bits are discarded to create the output codeword $c^{(m)}=(b^{(m)}, p^{(m)})$, $m \leq N_{CW\ i_{user}\ i_{ch}}$ h. If $\rho=1$ and $L_{CW}=504$, R=5/6:
  i. The output stream of scrambler is broken into the blocks of length 420 bits such that the m-th data word is $b^{(m)}=(b_1^{(m)}, b_2^{(m)}, \ldots, b_{420}^{(m)}), m \leq N_{CW\ i_{user}\ i_{ch}}$ ii. To each data word, zero bits $0^{(m)}=(0_1^{(m)}, 0_2^{(m)}, \ldots, 0_{168}^{(m)})$ and parity bits $p^{(m)}=(p_1^{(m)}, p_2^{(m)}, \ldots, p_{84}^{(m)})$ are added to create the codeword $c^{(m)}=(b^{(m)}, 0^{(m)}, p^{(m)})$, $m \leq N_{CW\ i_{user}\ i_{ch}}$ such that $H \cdot (c_{(m)})^T=0$, parity bits are computed applying for $L_{CW}=672$, R=7/8 LDPC matrix
  iii. Finally, the zero bits are discarded to create the output codeword $c^{(m)}=(b^{(m)}, p^{(m)})$, $m \leq N_{CW\ i_{user}\ i_{ch}}$ i. If $\rho=1$ and $L_{CW}=1008$, R=5/6:
  i. The output stream of scrambler is broken into the blocks of length 840 bits such that the m-th data word is $b^{(m)}=(b_1^{(m)}, b_2^{(m)}, \ldots, b_{840}^{(m)}), m \leq N_{CW\ i_{user}\ i_{ch}}$ ii. To each data word, zero bits $0^{(m)}=(0_1^{(m)}, 0_2^{(m)}, \ldots, 0_{336}^{(m)})$ and parity bits $p^{(m)}=(p_1^{(m)}, p_2^{(m)}, \ldots, p_{168}^{(m)})$ are added to create the codeword $c^{(m)}=(b^{(m)}, 0^{(m)}, p^{(m)})$, $m \leq N_{CW\ i_{user}\ i_{ch}}$ such that $H \cdot (c_{(m)})^T=0$, parity bits are computed applying $L_{CW}=1344$, R=7/8 LDPC matrix
  iii. Finally, the zero bits are discarded to create the output codeword $c^{(m)}=(b^{(m)}, p^{(m)})$, $m \leq N_{CW\ i_{user}\ i_{ch}}$ j. If $\rho=1$ and $L_{CW}=468$, R=5/6:
  i. The output stream of scrambler is broken into the blocks of length 390 bits such that the m-th data word is $b^{(m)}=(b_1^{(m)}, b_2^{(m)}, \ldots, b_{390}^{(m)}), m \leq N_{CW\ i_{user}\ i_{ch}}$ ii. To each data word, zero bits $0^{(m)}=(0_1^{(m)}, 0_2^{(m)}, \ldots, 0_{156}^{(m)})$ and parity bits $p^{(m)}=(p_1^{(m)}, p_2^{(m)}, \ldots, p_{126}^{(m)})$ are added to create the codeword $c^{(m)}=(b^{(m)}, 0^{(m)}, p^{(m)})$, $m \leq N_{CW\ i_{user}\ i_{ch}}$ such that $H \cdot (c_{(m)})^T=0$, parity bits are computed applying $L_{CW}=672$, R=13/16 LDPC matrix iii. Finally, the zero bits are discarded and the first 48 parity bits are discarded (punctured) to create the output codeword $$c^{(m)}=(b_1^{(m)},b_2^{(m)},\ldots,b_{390}^{(m)},p_{49}^{(m)},p_{50}^{(m)},\ldots,p_{126}^{(m)}), m \leq N_{CW\ i_{user}\ i_{ch}}$$

k. If ρ=1 and $L_{CW}$=936, R=5/6:

i. The output stream of scrambler is broken into the blocks of length 780 bits such that the m-th data word is $$b^{(m)}=(b_1^{(m)},b_2^{(m)},\ldots,b_{780}^{(m)}), m \leq N_{CW\ i_{user}\ i_{ch}}$$

ii. To each data word, zero bits $0^{(m)}=(0_1^{(m)}, 0_2^{(m)},\ldots,0_{312}^{(m)})$ and parity bits $p^{(m)}=(p_1^{(m)}, p_2^{(m)},\ldots,p_{252}^{(m)})$ are added to create the codeword $c_{(m)}=(b^{(m)}, 0^{(m)}, p^{(m)})$, $m \leq N_{CW\ i_{user}\ i_{ch}}$ such that $H \cdot (c_{(m)})^T = 0$, parity bits are computed applying $L_{CW}$=1344, R=13/16 LDPC matrix iii. Finally, the zero bits are discarded and the first 96 parity bits are discarded (punctured) to create the output codeword $$c^{(m)}=(b_1^{(m)},b_2^{(m)},\ldots,b_{780}^{(m)},p_{97}^{(m)},p_{98}^{(m)},\ldots,p_{252}^{(m)}), m \leq N_{CW\ i_{user}\ i_{ch}}$$

d) For each $i_{ch}$-th channel concatenate LDPC codewords one after the other to create the coded bits stream $$\left(c_{i_{ch}}^{(1)}, c_{i_{ch}}^{(2)},\ldots,c_{i_{ch}}^{(N_{CW_{i_{user}i_{ch}}})}\right), i_{ch}=1,2.$$

e) Compute the number of coded pad bits for $i_{ch}$-th channel, $$N_{BLK\_PAD i_{user} i_{ch}},$$

using the number of SC symbol blocks, $N_{BLKS\ i_{user}\ i_{ch}}$, e.g., as follows:

For 2.16+2.16 GHz and 4.32+4.32 GHz channel bandwidth configuration, define the number of pad bits and SC symbol blocks, e.g., as follows:

$$N_{BLKS\ i_{user}} = \max_{i_{ch}=1,2}\left(N_{BLKS\ i_{user}\ i_{ch}}\right)$$

$$N_{BLKS\ i_{user}\ i_{ch}} = \left\lceil \frac{N_{CW i_{user} i_{ch}} \cdot L_{CW\ i_{user}\ i_{ch}}}{N_{SPB} \cdot N_{CB} \cdot M_{i_{user}\ i_{ch}}} \right\rceil, i_{ch}=1,2$$

If BRP PPDU and $N_{BLKS\ i_{user}} < N_{BLKSmin}$, then $N_{BLKS\ i_{user}} = N_{BLKSmin}$ $$N_{BLK\_PAD i_{user} i_{ch}} =$$

$$N_{BLKS\ i_{user}} \cdot N_{SPB} \cdot N_{CB} \cdot M_{i_{user}\ i_{ch}} - N_{CW\ i_{user}\ i_{ch}} \cdot L_{CW\ i_{user}\ i_{ch}}, i_{ch}=1,2$$

For 2.16 GHz, 4.32 GHz, 6.48 GHz, and 8.64 GHz channel bandwidth configuration, define the number of pad bits and SC symbol blocks, e.g., as follows:

$$N_{BLKS\ i_{user}} = \left\lceil \frac{N_{CW i_{user}\ i_{ch}=1} \cdot L_{CW\ i_{user}\ i_{ch}=1}}{N_{SPB} \cdot N_{CB} \cdot M_{i_{user}}} \right\rceil$$

$$M_{i_{user}} = \sum_{i_{SS}=1}^{N_{SS\ i_{user}}} N_{CBPS\ i_{user}\ i_{ss}}$$

If BRP PPDU and $N_{BLKS\ i_{user}} < N_{BLKSmin}$, then $N_{BLKS\ i_{user}} = N_{BLKSmin}$ If STBC applied and $N_{BLKS\ i_{user}}$ is odd, then $N_{BLKS\ i_{user}} = N_{BLKS\ i_{user}} + 1$ $$N_{BLK\_PAD i_{user} i_{ch}=1} =$$

$$N_{BLKS\ i_{user}} \cdot N_{SPB} \cdot N_{CB} \cdot M_{i_{user}} - N_{CW\ i_{user}\ i_{ch}=1} \cdot L_{CW\ i_{user}\ i_{ch}=1}$$

f) Concatenate coded bits for $i_{ch}$-th channel with $N_{BLKS i_{user}\ i_{ch}}$ zero bits. They are scrambled using the continuation of the scrambler sequence that scrambled the PSDU bits and data pad bits at the step b). The zero bits for $i_{ch}$=1 channel are scrambled first and the zero bits for $i_{ch}$=2 channel are scrambled second.

g) Distribute the encoded and padded bits over the $N_{SSi_{user}}$ spatial streams on the group basis with the number of $N_{CBPS i_{user}\ i_{SS}}$ bits in the group:

For 2.16+2.16 GHz and 4.32+4.32 GHz channel bandwidth configuration, distribute the bits for $i_{ch}$=1 channel and $i_{ch}$=2 channel, for example, independently, e.g., as follows:

$i_{ch}$=1 channel: The $1^{st}$ group of bits comes to the $1^{st}$ stream, the $2^{nd}$ group of bits comes to the $2^{nd}$ stream and so on. The procedure is repeated when the $N_{SSi_{user}}/2$ spatial streams is reached. The procedure ends up when all PSDU bits including padded bits are distributed over the $N_{SSi_{user}}/2$ spatial streams.

$i_{ch}$=2 channel: The $1^{st}$ group of bits comes to the $(N_{SSi_{user}}/2+1)^{th}$ stream, the $2^{nd}$ group of bits comes to the $(N_{SSi_{user}}/2+2)^{th}$ stream and so on. The procedure is repeated when the $N_{SSi_{user}}$ spatial streams is reached. The procedure ends up when all PSDU bits including padded bits are distributed over the $N_{SSi_{user}}/2$ spatial streams.

For 2.16 GHz, 4.32 GHz, 6.48 GHz, and 8.64 GHz channel bandwidth configuration, distribute the bits, e.g., as follows:

The $1^{st}$ group of bits comes to the $1^{st}$ stream, the $2^{nd}$ group of bits comes to the $2^{nd}$ stream and so on. The procedure is repeated when the $N_{SSi_{user}}$ spatial streams is reached. The procedure ends up when all PSDU bits including padded bits are distributed over the $N_{SSi_{user}}$ spatial streams.

For example, for each user, if STBC coding is applied, then a single spatial stream $N_{SSi_{user}}$=1 is to two space-time streams $N_{SSi_{user}}$=2. Otherwise, a one-to-one mapping of $N_{SSi_{user}}$ spatial streams to $N_{SSi_{user}}$ space-time streams shall be applied.

In some demonstrative embodiments, the value of $N_{BLKSmin}$ may be defined on a per user basis, for example, in a Requested BRP SC Blocks field within a responder's EDMG Capabilities element, and/or in any other message and/or field.

In some demonstrative embodiments, for example, if the Requested BRP SC Blocks field is not included in the EDMG Capabilities element, then $N_{BLKSmin}$ may be set to a predefined value, for example, $N_{BLKSmin}$=aBRPminSCblocks, or any other value.

In some demonstrative embodiments, device 102 may be configured to encode the PSDU bits of a SC EDMG PPDU according to an encoding procedure including some or all of the operations of the LDPC encoding procedure described above and/or one or more additional or alternative operations, parameters, and/or procedures.

In some demonstrative embodiments, devices 102 and/or 140 may be configured to generate, transmit, receive and/or process one or more transmissions of PPDUs, for example, EDMG PPDUs, for example, OFDM PPDUs, e.g., in accordance with an *IEEE 802.11ay Specification* and/or any other specification.

In some demonstrative embodiments, devices 102 and/or 140 may be configured to generate, transmit, receive and/or process one or more transmissions of OFDM PHY PPDUs, for example, EDMG OFDM PHY PPDUs, for example, according to an EDMG transmission mode for OFDM PHY, e.g., as described below.

In some demonstrative embodiments, devices 102 and/or 140 may be configured to generate, transmit, receive and/or process one or more transmissions of the OFDM PPDUs, for example, according to a transmission mode, which may be configured to support transmission of OFDM PPDUs over a 2.16 GHz bandwidth, a 4.32 GHz bandwidth, a 6.48 GHz bandwidth, a 8.64 GHz bandwidth, and/or any other bandwidth, for example, using one or more space-time streams and/or one or more transmit chains and/or antennas.

In some demonstrative embodiments, devices 102 and/or 140 may be configured to implement one or more operations to support OFDM transmission of an EDMG PPDU, for example, according to an OFDM PHY EDMG PPDU transmission mode, which may be configured to support an SU transmission mode and/or an MU transmission mode, e.g., as described below.

In some demonstrative embodiments, devices 102 and/or 140 may be configured to implement one or more operations, functionalities and/or procedures to generate one or more EDMG PPDUs, for example, SU EDMG OFDM PPDUs and/or MU EDMG OFDM PPDUs, for example, by processing a payload including one or more data bits, e.g., as described below.

In some demonstrative embodiments, devices 102 and/or 140 may be configured to generate, transmit, receive and/or process one or more EDMG PPDUs, for example, SU EDMG OFDM PPDUs and/or MU EDMG OFDM PPDUs, for example, according to an encoding procedure and/or scheme, which may be configured in accordance with a vertical MIMO encoding approach, e.g., as described below.

In some demonstrative embodiments, the vertical MIMO encoding approach may be implemented, for example, instead of and/or to replace one or more operations of, a horizontal MIMO encoding approach, e.g., as described below.

In some demonstrative embodiments, devices 102 and/or 140 may be configured to generate, transmit, receive and/or process one or more EDMG PPDUs, for example, SU EDMG OFDM PPDUs and/or MU EDMG OFDM PPDUs, for example, according to an encoding procedure, which may be configured to support and/or enable the generation of EDMG OFDM PPDUs using a vertical approach, e.g., as described below.

For example, according to a horizontal approach, an encoding scheme may be referred to as a horizontal MIMO encoding scheme, for example, if the encoding scheme includes independently encoding different streams, e.g., groups of bits, after a stream parser, for example, by different and/or independent encoders, e.g., LDPC encoders.

In some demonstrative embodiments, devices 102 and/or 140 may be configured to transmit, receive, and/or process EDMG PPDUs, e.g., OFDM EDMG PPDUs, according to a MIMO encoding scheme (also referred to as "a vertical encoding scheme"), e.g., as described below.

In some demonstrative embodiments, the MIMO encoding scheme may be configured to perform encoding, e.g., LDPC encoding, for example, after scrambling and before stream parsing, e.g., as described below.

In some demonstrative embodiments, for example, applying the encoding, e.g., the LDPC encoding, prior to the stream parsing may allow, for example, providing a same code rate for a plurality of streams, e.g., some or all streams, for example, as opposed to the horizontal MIMO encoding which may result in different code rates for each of the different streams.

In some demonstrative embodiments, devices 102 and/or 140 may be configured to implement a vertical encoding procedure, for example, for encoding EDMG OFDM PPDUs, e.g., as described below.

In some demonstrative embodiments, controller 124 may be configured to cause, trigger, and/or control the wireless station implemented by device 102 to generate an LDPC coded bit stream for a user based on data bits of a PSDU for the user in an EDMG OFDM PPDU, the LDPC coded bit stream for the user including a concatenation of a plurality of LDPC codewords, a count of the plurality of LDPC codewords is based at least on a codeword length for the user and on a code rate for the user; generate encoded and padded bits for the user by concatenating the LDPC coded bit stream with a plurality of coded pad zero bits, a count of the coded pad zero bits is based at least on a count of one or more spatial streams for the user and on the count of the plurality of LDPC codewords for the user; distribute the encoded and padded bits for the user to the one or more spatial streams for the user; and transmit the EDMG OFDM PPDU in a transmission over a channel bandwidth in a frequency band above 45 GHz, the transmission based on the one or more spatial streams for the user, e.g., as described below.

In some demonstrative embodiments, controller 124 may be configured to cause, trigger, and/or control the wireless station implemented by device 102 to determine the count of the coded pad zero bits, for example, based on a count of OFDM symbols for the user, e.g., as described below.

In some demonstrative embodiments, the count of OFDM symbols for the user may be based, for example, at least on the count of one or more spatial streams for the user and on the count of the plurality of LDPC codewords for the user, e.g., as described below.

In some demonstrative embodiments, controller 124 may be configured to cause, trigger, and/or control the wireless station implemented by device 102 to determine the count of OFDM symbols for the user, for example, based on a count of data subcarriers, and on a count of coded bits per constellation point per spatial stream for the user, e.g., as described below.

In some demonstrative embodiments, devices 102 and/or 140 may be configured to implement a transmit architecture, which may be configured to support generation of EDMG OFDM PPDUs using a vertical encoding approach, e.g., as describe described.

In some demonstrative embodiments, a transmitter block architecture, e.g., for EDMG OFDM PPDU transmission, may be configured, for example, according to a vertical encoding scheme, e.g., as described below.

In some demonstrative embodiments, EDMG OFDM PPDU transmissions may be generated, processed, transmitted, and/or received, for example, according to a vertical encoding procedure, which may be based on one or more architecture blocks, functionalities, and/or operations, for example, one or more of, e.g., some or all of, the blocks described below.

In some demonstrative embodiments, the vertical encoding procedure may implement a scrambler, which may be configured, for example, to scramble data, e.g., at least to reduce the probability of long sequences of 0s and 1s.

In some demonstrative embodiments, the vertical encoding procedure may implement an encoder, for example, an LDPC encoder, which may be configured to encode the data, for example, to enable error correction. For example, the encoder may be configured to implement bit padding, for example, to achieve an integer number of codewords and OFDM symbols. Some demonstrative embodiments are described herein with respect to an LDPC encoder. In other embodiments, any other alternative encoder may be implemented.

In some demonstrative embodiments, the vertical encoding procedure may implement a stream parser, which may be configured to divide the output of LDPC encoder into groups of bits, which may be, for example, sent to different mappers ("mapping devices"). The sequence of the bits sent to a mapping device may be referred to as a "spatial stream".

In some demonstrative embodiments, the vertical encoding procedure may implement a constellation mapper, which may be configured to map the sequence of bits in each stream to constellation points (e.g., complex numbers).

In some demonstrative embodiments, the vertical encoding procedure may implement an interleaver, which may be configured to perform interleaving, e.g., inside an OFDM symbol.

In some demonstrative embodiments, the vertical encoding procedure may implement an STBC encoder, which may be configured to spread constellation points, for example, from a number of spatial streams, e.g., $N_{SS}$ spatial streams, into a number of space-time streams, e.g., $N_{STS}$ space-time streams, for example, according to a space-time block code.

In one example, an OFDM mode may define a single STBC scheme with $N_{SS}=1$ and $N_{STS}=2$. In other embodiments, any other STBC scheme, any other number of spatial streams, and/or any other number of space-time streams, may be implemented.

In some demonstrative embodiments, the vertical encoding procedure may implement a Preamble builder, which may be configured to build symbols of one or more EDMG preamble fields, for example, EDMG-STF and/or EDMG-CEF fields, for example, in a frequency domain.

In some demonstrative embodiments, the vertical encoding procedure may implement a Training sequence (TRN) builder, which may be configured to build symbols of a TRN field.

In some demonstrative embodiments, the vertical encoding procedure may implement a spatial mapper, which may be configured to map the space-time streams to transmit chains. For example, the spatial mapping may be applied per subcarrier basis.

In some demonstrative embodiments, the spatial mapping may include one of the followings spatial mapping schemes:
a. Direct mapping: constellation points from each space-time stream are mapped directly into the transmit chains.
b. Indirect mapping: constellation points from each space-time stream are mapped to each transmit chain.
c. Digital beamforming: each vector of constellation points from all of the space-time streams is multiplied by a matrix of steering vectors to produce the input to the transmit chains.

In other embodiments, any other additional or alternative spatial mapping scheme may be implemented.

In some demonstrative embodiments, the vertical encoding procedure may implement a Cyclic shift (CSD) insertion mechanism, which may be configured, for example, to mitigate and/or prevent transmission from unintentional beamforming. For example, a cyclic shift may be specified per transmitter chain for a pre-EDMG portion of a PPDU transmission.

In some demonstrative embodiments, the vertical encoding procedure may implement an Inverse Discrete Fourier Transform (IDFT) mechanism, for example, to apply an IDFT to an input block of subcarriers.

In some demonstrative embodiments, the vertical encoding procedure may implement a Guard Interval (GI) insertion and windowing mechanism, for example, to prepend the OFDM symbol with a guard interval. The guard interval may be defined, for example, as a cyclic extension of the OFDM symbol, e.g., in a time domain, and may apply a window function.

In some demonstrative embodiments, device 102 and/or device 140 may be configured to implement a transmit architecture, which may be configured, for example, for processing an EDMG portion of a SU PPDU transmission, e.g., as described below.

Figure 7:
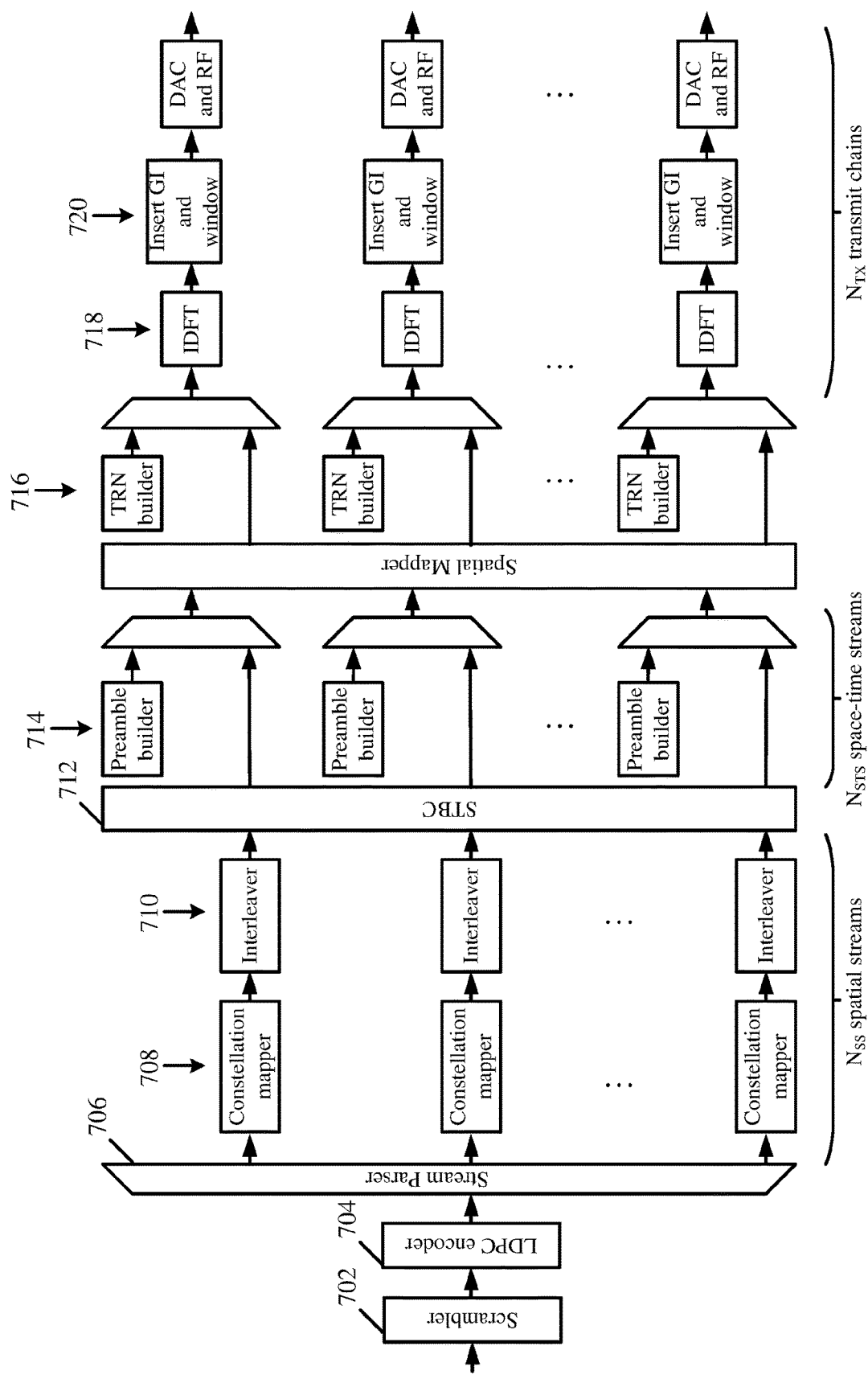
FIG. 7 is a schematic illustration of an SU transmitter architecture according to an encoding scheme, in accordance with some demonstrative embodiments.

Reference is made to FIG. 7, which schematically illustrates an SU transmitter architecture 700 according to an encoding scheme, in accordance with some demonstrative embodiments.

In some demonstrative embodiments, for example, devices 102 and/or 140 (FIG. 1) may be configured implement one or more elements of transmitter architecture 700, for example, to process an EDMG portion of single-user EDMG OFDM PPDUs, e.g., according to a vertical encoding scheme.

For example, transmitter 118 (FIG. 1) may be configured to implement one or more elements and/or functionalities of transmitter architecture 700.

For example, transmitter 118 (FIG. 1) may include circuitry and/or logic configured to perform one or more functionalities and/or operations of one or more elements of transmitter architecture 700.

In some demonstrative embodiments, one or more elements and/or blocks of transmitter architecture 700 may be configured, for example, for SU EDMG OFDM PPDU transmission, e.g., as described below.

In some demonstrative embodiments, one or more blocks of transmitter architecture 700 may be implemented, for example, to generate the EDMG portion of a SU OFDM PPDU transmission.

In some demonstrative embodiments, for example, as shown in FIG. 7, the EDMG-STF and/or EDMG-CEF fields may be generated, for example, using a preamble builder 714, an IDFT 718, and/or GI insertion blocks 720.

In some demonstrative embodiments, for example, as shown in FIG. 7, the TRN field may be generated, for example, using a TRN builder 716, IDFT 718, and/or GI insertion blocks 720.

In some demonstrative embodiments, for example, as shown in FIG. 7, the data part of the PPDU may be generated, for example, using a scrambler 702, an LDPC encoder 704, a constellation mapper 708, an interleaver 710, IDFT 718, and/or GI insertion blocks 720.

In some demonstrative embodiments, for example, as shown in FIG. 7, for example, if an STBC encoder 712 is to be applied, a spatial stream, e.g., a single spatial stream, may be mapped to a plurality of space-time streams, e.g., two space-time streams. For example, the $N_{STS}$ space-time streams may further mapped to $N_{TX}$ transmit chains, e.g., where $N_{STS} \leq N_{TX}$.

In some demonstrative embodiments, as shown in FIG. 7, interleaver 710 may be applied, for example, to one or more Quadrature Amplitude Modulation (QAM) schemes, e.g., only to 16-QAM and/or 64-QAM modulations. In other embodiments, interleaver 710 may or may not be applied for some or all modulations.

Referring back to FIG. 1, in some demonstrative embodiments, device 102 and/or device 140 may be configured to implement a transmit architecture, which may be configured, for example, for processing an EDMG portion of an MU OFDM PPDU transmission, e.g., as described below.

Figure 8:
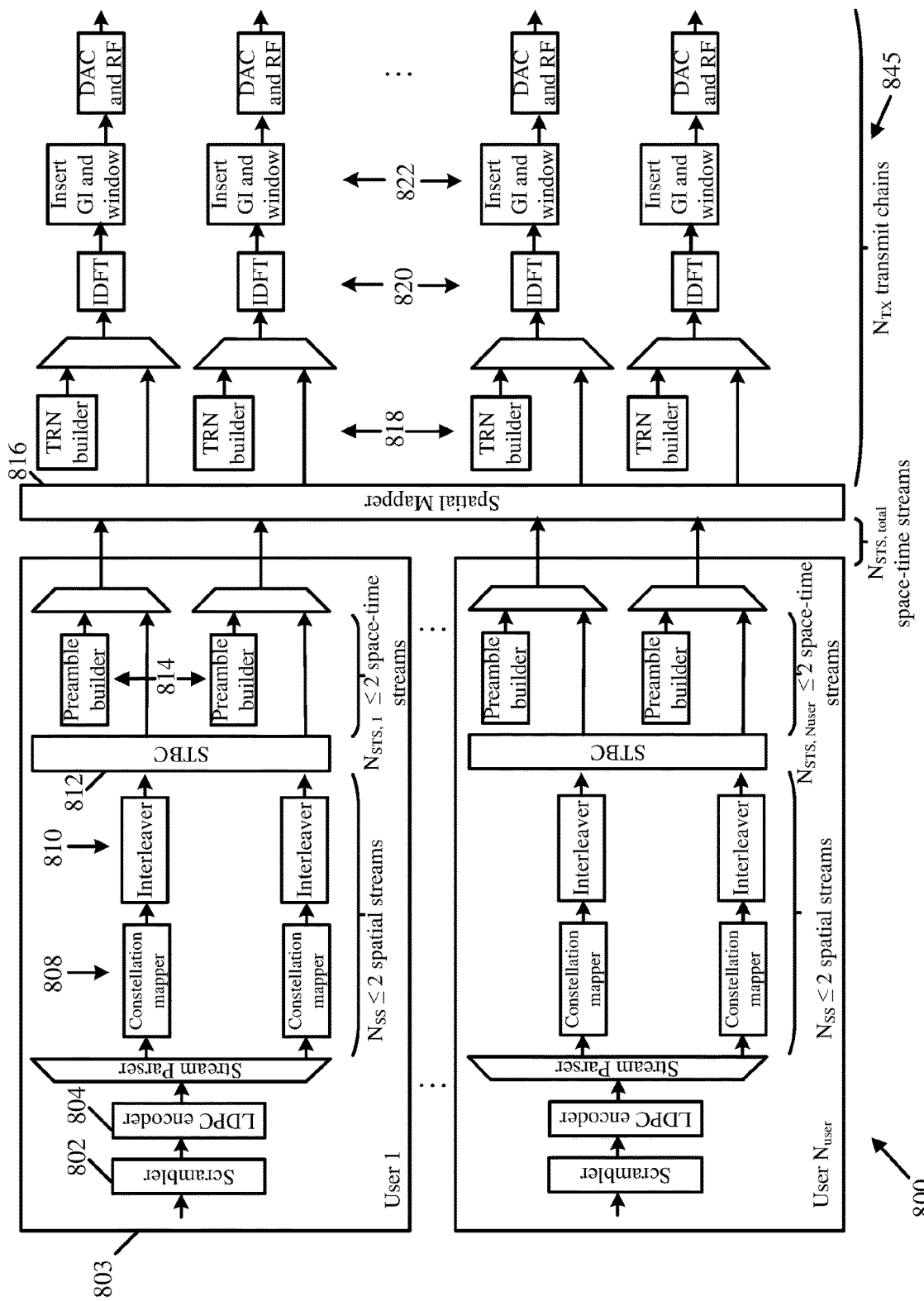
FIG. 8 is a schematic illustration of an MU transmitter architecture according to an encoding scheme, in accordance with some demonstrative embodiments.

Reference is made to FIG. 8, which schematically illustrates an MU transmitter architecture 800 according to an encoding scheme, in accordance with some demonstrative embodiments.

In some demonstrative embodiments, for example, devices 102 and/or 140 (FIG. 1) may be configured implement one or more elements of transmitter architecture 800, for example, to process an EDMG portion of multi-user EDMG OFDM PPDUs, e.g., according to a vertical encoding scheme.

For example, transmitter 118 (FIG. 1) may be configured to implement one or more elements and/or functionalities of transmitter architecture 800.

For example, transmitter 118 (FIG. 1) may include circuitry and/or logic configured to perform one or more functionalities and/or operations of one or more elements of transmitter architecture 800.

In some demonstrative embodiments, one or more elements and/or blocks of transmitter architecture 800 may be configured, for example, for MU EDMG OFDM PPDU transmission, e.g., as described below.

In some demonstrative embodiments, one or more blocks of transmitter architecture 800 may be implemented, for example, to generate the EDMG portion of an MU OFDM PPDU transmission.

For example, as shown in FIG. 8, transmitter architecture 800 may include a plurality of processing modules 803 to process a respective plurality of EDMG PPDU portions to be transmitted to a respective plurality of users.

In some demonstrative embodiments, for example, as shown in FIG. 8, the EDMG-STF and/or EDMG-CEF fields may be generated, for example, using a preamble builder 814, IDFT 820, and/or GI insertion blocks 822.

In some demonstrative embodiments, for example, as shown in FIG. 8, the TRN field may be generated, for example, using a TRN builder 818, IDFT 820, and/or GI insertion blocks 822.

In some demonstrative embodiments, for example, as shown in FIG. 8, an EDMG-Header-B, e.g., EDMG-Header B 216 (FIG. 2), and/or data part of the PPDU, e.g., data field 218 (FIG. 2), may be generated, for example, using a scrambler 802, an LDPC encoder 804, a constellation mapper 808, an interleaver 810, IDFT 820, and/or GI insertion blocks 822.

In some demonstrative embodiments, for example, the PPDU encoding may use a seed value defined in the EDMG-Header-B, and may have, for example, an independent flow per user. However, a transmitter, e.g., implemented according to transmitter architecture 800, may keep a common space-time stream numeration over all users.

In some demonstrative embodiments, for example, as shown in FIG. 8, for example, if an STBC encoder 812 is to be applied, a spatial stream, e.g., a single spatial stream, may be mapped to a plurality of space-time streams, e.g., two space-time streams. For example, the $N_{STS}$ space-time streams may further mapped to $N_{TX}$ transmit chains, e.g., where $N_{STS} \leq N_{TX}$.

In some demonstrative embodiments, as shown in FIG. 8, interleaver 810 may be applied, for example, to one or more QAM schemes, e.g., only to 16-QAM and/or 64-QAM modulations. In other embodiments, interleaver 810 may or may not be applied for some or all modulations.

In some demonstrative embodiments, as shown in FIG. 8, transmitter architecture 800 may include a spatial mapper 816 to map outputs of the plurality processing modules 803 to a plurality of transmit chains 845.

In some demonstrative embodiments, transmitter architecture 800 may include some or all of the elements shown in FIG. 8 and/or one or more elements may be optional and/or implemented in some configurations. For example, the STBC encoder may optionally be included, for example, when STBC is to be supported, e.g., as described above. For example, the interleaver may be included, for example, for one or more modulation schemes, e.g., as described above.

Referring back to FIG. 1, in some demonstrative embodiments, an LDPC encoder, e.g., LDPC encoder 704 (FIG. 7) and/or LDPC encoder 804 (FIG. 8), may be configured to encode an EDMG OFDM PSDU, for example, by a systematic LDPC block code, e.g., as described below.

In some demonstrative embodiments, processing and/or communication of the EDMG OFDM PHY PPDU may be defined and/or performed based on one or more of the following parameters, and/or one or more additional or alternative parameters:

TABLE 3

| Symbol | Explanation |
| --- | --- |
| $i_{SS}$ | Spatial stream number |
| $N_{SS\ i_{user}}$ | Total number of spatial streams for $i_{user}$-th user |
| $i_{user}$ | User number |
| $N_{user}$ | Total number of users in a multi user transmission |
| $i_{STS\ i_{user}}$ | Space-time stream number for $i_{user}$-th user |
| $N_{STS\ i_{user}}$ | Total number of space-time streams for $i_{user}$-th user |
| $i_{STS}$ | Space-time stream number over all users |

TABLE 3-continued

| Symbol | Explanation |
|---|---|
| $N_{STS}$ | Total number of space-time streams over all users |
| $Length_{i_{user}}$ | PSDU length in octets for $i_{user}$-th user |
| $L_{CW}$ | LDPC codeword length in bits, it can be equal to 624, 672, 1248, and/or 1344, and/or any other value |
| $L_{CW\,i_{user}}$ | LDPC codeword length or $i_{user}$-th |
| $L_{CWD}$ | Number of systematic data bits per LDPC codeword |
| $L_{CWP}$ | Number of parity bits per LDPC codeword |
| $R_{i_{user}}$ | LDPC code rate for $i_{user}$-th user, and can be equal to ½, 5/8, ¾, 13/16, 7/8, and/or any other value |
| $N_{CW\,i_{user}}$ | Total number of LDPC codewords for $i_{user}$-th user |
| $N_{DATA\_PAD\,i_{user}}$ | Number of pad bits for the $i_{user}$-th user to reach an integer number of LDPC codewords |
| $N_{SYMS\,i_{user}}$ | Total number of OFDM symbols for $i_{user}$-th user |
| $N_{SYMS\,min}$ | Minimum number of total OFDM symbols for BRP PPDU transmission |
| $N_{SYM\_PAD\,i_{user}}$ | Number of pad bits for the $i_{user}$-th user to get integer number of OFDM symbols |
| $N_{BPSC\,i_{user}i_{SS}}$ | Number of coded bits per constellation point for the $i_{user}$-th user and $i_{SS}$-th spatial stream |
| $N_{SYMS\,max}$ | Maximum number of OFDM symbols over all users |
| $N_{PAD\_SYMS\,i_{user}}$ | The number of pad OFDM symbols for the $i_{user}$-th user required to align PPDUs over different users in time |

In some demonstrative embodiments, some or all of the parameters of Table 3 may be implemented, one or more parameters may be defined in a different manner, and/or one or more additional or alternative parameters may be implemented.

In some demonstrative embodiments, for example, a data word, e.g., each data word, of $L_{CWD}$ information bits may be concatenated with $L_{CWP}$ parity bits to create a codeword of length $L_{CW}=L_{CWD}+L_{CWP}$ bits.

In some demonstrative embodiments, the EDMG LDPC encoding may be configured to employ codeword lengths of $L_{CW}=624$, 672, 1248, and/or 1344, and/or code rates of R=1/2, 5/8, 3/4, 13/16, and/or 7/8, and/or any other codeword length.

In one example, the EDMG LDPC encoding may be configured to support one or more of the following code rates:

TABLE 4

| | Codeword length - $L_{CW}$ | | Number of data bits- $L_{CWD}$ | |
|---|---|---|---|---|
| Code rate | Short | Long | Short | Long |
| ½ | 672 | 1344 | 336 | 672 |
| 5/8 | 672 | 1344 | 420 | 840 |
| ¾ | 672 | 1344 | 504 | 1008 |
| 13/16 | 672 | 1344 | 546 | 1092 |
| 7/8 | 624 or 672 | 1248 or 1344 | 546 or 588 | 1092 or 1176 |

In some demonstrative embodiments, for example, the LDPC encoding with codeword length $L_{CW}=672$ and/or 1344 may be performed by solving the linear system of equations $H \cdot (c_{(m)})^T=0$ defined by the parity matrix H of size $L_{CWP}$ by $L_{CW}$, where $c^{(m)}=(b^{(m)}, p^{(m)})$ defines the m-th LDPC codeword, $b^{(m)}=(b_1^{(m)}, b_2^{(m)}, \ldots, b_{L_{CWD}}^{(m)})$ defines the m-th data word, and $p^{(m)}=(p_1^{(m)}, p_2^{(m)}, \ldots, p_{L_{CWP}}^{(m)})$ defines parity bits for m-th LDPC codeword.

In some demonstrative embodiments, for example, the LDPC encoding with codeword length $L_{CW}=624$ and/or 1248 may employ the original matrices H with $L_{CW}=672$ and 1344 for code rate R=13/16, and may then apply a puncturing procedure to get a desired code rate R=7/8. For example, for $L_{CW}=624$, the first 48 parity bits may be discarded, and/or for $L_{CW}=1248$, the first 96 parity bits are discarded.

In other embodiments, any other additional and/or alternative encoding configurations, codeword lengths and/or code rates may be implemented.

In some demonstrative embodiments, devices 102 and/or 140 may be configured to implement one or more operations and/or functionalities of an encoding procedure, which may support and/or enable the generation of EDMG OFDM PPDUs using a vertical encoding scheme, for example, according to the scheme of FIG. 7 and/or FIG. 8, e.g., as described below.

In some demonstrative embodiments, the encoding procedure may be configured for an OFDM mode EDMG SU PSDU and/or an OFDM mode EDMG MU PSDU, e.g., per user basis encoding.

In some demonstrative embodiments, an EDMG LDPC encoding, which may be configured to employ codeword lengths of $L_{CW}=624$, 672, 1248, and/or 1344, and/or code rates of R=1/2, 5/8, 3/4, 13/16, and/or 7/8, may be implemented, e.g., as described below. In other embodiments, any other additional or alternative encoding configurations, codeword lengths and/or code rates may be implemented.

In some demonstrative embodiments, devices 102 and/or 140 may be configured to generate, transmit, receive, and/or process one or more EDMG PPDUs, e.g., EDMG OFDM PPDUs, according to an encoding scheme, e.g., a vertical encoding scheme, which may include encoding data bits, for example, scrambled data bits, e.g., scrambled PSDU bits, for example, prior to stream parsing, e.g., as described below.

In some demonstrative embodiments, device 102 may be configured to generate a sequence of scrambled bits based on data bits for a user, e.g., as described below.

In some demonstrative embodiments, the sequence of scrambled bits may include scrambled data bits and scrambled data padding bits, e.g., as described below.

In some demonstrative embodiments, the number of data padding bits may be determined, for example, prior to stream parsing, e.g., based on the length of the data bits, e.g., for a user, the number of codewords, e.g., for the user, the codeword length, e.g., for the user, and/or the code rate, e.g., for the user, e.g., as described below.

In some demonstrative embodiments, device 102 may be configured to encode the sequence of scrambled bits into codewords, e.g., into LDPC codewords, e.g., as described below.

In some demonstrative embodiments, device 102 may be configured to generate a coded bit stream based on the codewords, e.g., by concatenating the LDPC codewords, e.g., as described below.

In some demonstrative embodiments, device 102 may be configured to generate a sequence of encoded padded bits based on the coded bit stream and coded pad bits, e.g., as described below.

In some demonstrative embodiments, device 102 may be configured to determine a number of the coded pad bits, for example, based on a number of OFDM symbols, e.g., for the user, e.g., as described below.

In some demonstrative embodiments, device 102 may be configured to determine a number of the coded pad bits, for example, based on a number of spatial streams to be implemented, e.g., for the user, e.g., as described below.

In some demonstrative embodiments, device 102 may be configured to determine the number of coded pad bits, for example, based on a number of codewords to be implemented, e.g., for the user, e.g., as described below.

In some demonstrative embodiments, device 102 may be configured to determine the number of coded pad bits, for example, based on a sum of a plurality of numbers of coded bits per constellation point corresponding to a plurality of spatial streams, e.g., to be implemented for the user, e.g., as described below.

In some demonstrative embodiments, device 102 may be configured to distribute the sequence of encoded and padded bits over the spatial streams, e.g., as described below.

In some demonstrative embodiments, device 102 may be configured to transmit an OFDM transmission based on the spatial streams, e.g. over a channel bandwidth in a frequency band above 45 GHz.

In some demonstrative embodiments, device 102 may be configured to implement an EDMG LDPC encoding process, for example, to encode data bits for a user, e.g., as described below.

In some demonstrative embodiments, an EDMG LDPC encoding process for an $i_{user}$-th user may include one or more operations, e.g., as follows:

a) Compute the number of data pad bits $$N_{DATA\_PAD_{i_{user}}},$$

using the number of bits in the group $Ng_{i_{user},i_{SS}}$ and the number of LDPC codewords $N_{CW\ i_{user},i_{SS}}$, e.g., as follows:

$$N_{CW_{i_{user}}} = \left\lceil \frac{Length_{i_{user}} \cdot 8}{L_{CW_{i_{user}}} \cdot R_{i_{user}}} \right\rceil$$

$$N_{DATA\_PAD_{i_{user}}} = N_{CW_{i_{user}}} \cdot L_{CW\ i_{user}} \cdot R_{i_{user}} - Length_{i_{user}} \cdot 8$$

The scrambled PSDU is concatenated with $$N_{DATA\_PAD_{i_{user}}}$$

zero bits. They are scrambled using the continuation of the scrambler sequence that scrambled the PSDU input bits.

b) Convert the scrambled PSDU bits to LDPC codewords, e.g., as follows:
  a. If $L_{CW}$=672, 1344:
    i. The output stream of scrambler is broken into the blocks of length $L_{CWD}=L_{CW} \times R$ bits such that the m-th data word is $$b^{(m)}=(b_1^{(m)}, b_2^{(m)}, \ldots, b_{L_{CWD}}^{(m)}), m \leq N_{CW\ i_{user}}$$

ii. To each data word, parity bits $p^{(m)}=(p_1^{(m)}, p_2^{(m)}, \ldots, p_{L_{CWP}}^{(m)})$, $L_{CWP}=L_{CW}-L_{CWD}$, are added to create the codeword $c^{(m)}=(b^{(m)}, p^{(m)})$, $m \leq N_{CW\ i_{user}}$ such that $H \cdot (c_{(m)})^T = 0$
  b. If $L_{CW}$=624, R=7/8:
    i. The output stream of scrambler is broken into the blocks of length 546 bits such that the m-th data word is $$b^{(m)}=(b_1^{(m)}, b_2^{(m)}, \ldots, b_{546}^{(m)}), m \leq N_{CW\ i_{user}}$$

ii. To each data word, parity bits $p^{(m)}=(p_1^{(m)}, p_2^{(m)}, \ldots, p_{L_{126}}^{(m)})$ are added to create the codeword $c^{(m)}=(b^{(m)}, p^{(m)})$, $m<N$ such that $H \cdot (c_{(m)})^T = 0$, parity bits are computed applying $L_{CW}$=672, R=13/16 LDPC matrix
    iii. Finally, the first 48 parity bits are discarded (punctured) to create the output codeword $$c^{(m)}=(b_1^{(m)}, b_2^{(m)}, \ldots, b_{546}^{(m)}, p_{49}^{(m)}, p_{50}^{(m)}, \ldots, p_{126}^{(m)}), m \leq N_{CW\ i_{user}}$$

c. If $L_{CW}$=1248, R=7/8:
    i. The output stream of scrambler is broken into the blocks of length 1092 bits such that the m-th data word is $$b^{(m)}=(b_1^{(m)}, b_2^{(m)}, \ldots, b_{1092}^{(m)}), m \leq N_{CW\ i_{user}}$$

ii. To each data word, parity bits $p^{(m)}=(p_1^{(m)}, p_2^{(m)}, \ldots, p_{L_{252}}^{(m)})$ are added to create the codeword $c^{(m)}=(b^{(m)}, p^{(m)})$, $m \leq N_{CW\ i_{user}}$ such that $H \cdot (c_{(m)})^T = 0$, parity bits are computed applying $L_{CW}$=1344, R=13/16 LDPC matrix
    iii. Finally, the first 96 parity bits are discarded (punctured) to create the output codeword $$c^{(m)}=(b_1^{(m)}, b_2^{(m)}, \ldots, b_{1092}^{(m)}, p_{97}^{(m)}, p_{98}^{(m)}, \ldots, p_{252}^{(m)}), m \leq N_{CW\ i_{user}}$$

c) Concatenate LDPC codewords one after the other to create the coded bits stream $$\left(c^{(1)}, c^{(2)}, \ldots, c^{(N_{CW_{i_{user}}})}\right).$$

d) Compute the number of coded pad bits $$N_{SYM\_PAD_{i_{user}}},$$

using the number of OFDM symbols, $N_{SYMS i_{user}}$, e.g., as follows:

$$N_{SYMS i_{user}} = \left\lceil \frac{N_{CW i_{user}} \cdot L_{CW i_{user}}}{N_{SD} \cdot \sum_{i_{SS}=1}^{N_{SS i_{user}}} N_{BPSC i_{user} i_{SS}}} \right\rceil$$

If BRP PPDU and $N_{SYMS i_{user}} < N_{SYMS min}$, then $N_{SYMS i_{user}} = N_{SYMS min}$ If STBC applied and $N_{SYMS i_{user}}$ is odd, then $N_{SYMS i_{user}} = N_{SYMS i_{user}} + 1$ $$N_{SYM\_PAD i_{user}} =$$

$$N_{SYMS i_{user}} \cdot N_{SD} \cdot \sum_{i_{SS}=1}^{N_{SS i_{user}}} N_{BPSC i_{user} i_{SS}} - N_{CW i_{user}} \cdot L_{CW i_{user}}$$

Concatenate coded bits with $$N_{SYM\_PAD i_{user}}$$

zero bits. They are scrambled using the continuation of the scrambler sequence that scrambled the PSDU bits and data pad bits at the step a).

e) Distribute the encoded and padded bits over the $N_{SSi_{user}}$ spatial streams on the group basis with the number of $N_{CBPSi_{user} i_{SS}}$ bits in the group. The first group of bits comes to the first spatial stream, the second group of bits comes to the second spatial stream, and so on. The procedure may be repeated, for example, when the maximum number of spatial streams $N_{SSi_{user}}$ is reached. The procedure end, for example, when all PSDU encoded bits including $$N_{SYM\_PAD i_{user}}$$

pad bits are distributed over the $N_{SSi_{user}}$ spatial streams. For example, for each user, if STBC coding is applied, then a single spatial stream $N_{SSi_{user}}=1$ is mapped to two space-time streams $N_{SSi_{user}}=2$. Otherwise, a one-to-one mapping of $N_{SSi_{user}}$ spatial streams to $N_{SSi_{user}}$ space-time streams shall be applied.

In some demonstrative embodiments, the value of $N_{SYMSmin}$ may be defined, for example, per user basis, for example, as $N_{SYMSmin}$=aBRPminOFDMblocks. In other definition may be implemented.

In some demonstrative embodiments, device 102 may be configured to encode an OFDM EDMG SU PPDU according to an encoding procedure including some or all of the operations of the EDMG LDPC encoding procedure described above and/or one or more additional or alternative operations, parameters, and/or procedures.

In some demonstrative embodiments, device 102 may be configured to implement an EDMG LDPC encoding process, for example, to encode an OFDM EDMG MU PPDU, e.g., as described below.

In some demonstrative embodiments, an EDMG LDPC encoding process for an OFDM EDMG MU PPDU may include, for example, MU-PPDU padding and/or space-time streams mapping, e.g., as described below.

In some demonstrative embodiments, for example, for MU PPDU transmission, all user PPDUs shall be aligned in time.

In some demonstrative embodiments, one or more operations and/or procedure may be implemented, for example, if necessary to achieve this time alignment, e.g., as described below.

In some demonstrative embodiments, for example, if necessary, user PSDUs shall be padded, e.g., as follows:

a) Compute the maximum number of OFDM symbols over all users $$N_{SYMS max} = \max_{i_{user}}(N_{SYMS i_{user}}) \text{ for } i_{user} = 1, 2, \ldots, N_{user}.$$

b) Update the number of OFDM symbols at step e) as $N_{SYMS i_{user}}=N_{SYMS max}$ for $i_{user}=1, 2, \ldots, N_{user}$. Update the number of pad bits for $i_{user}$-th user accordingly.

c) The number of pad OFDM symbols for MU PPDU transmission for $i_{user}$-th user is defined as $$N_{PAD\_SYMS i_{user}} = N_{SYMS max} - N_{SYMS i_{user}}.$$

The number of pad symbols $N_{PAD\_SYMS i_{user}}$ takes into account MU PPDU padding only and does not include the regular padding.

In other embodiments, any other additional or alternative padding operations may be implemented, for example, to achieve time alignment between the user PPDUs.

In some demonstrative embodiments, a receiver of a PPDU in the MU PPDU transmission, e.g., device 140, may be configured to compute the number of pad OFDM symbols $$N_{PAD\_SYMS i_{user}},$$

for example, using an overall PPDU time duration.

In some demonstrative embodiments, for example, the PPDU time duration may be computed, for example, using an MCS and/or a PSDU Length, which may be defined in the L-Header; an MCS and/or PSDU Length, which may be defined, for example, in the EDMG-Header-B; and/or a TRN field duration, which may be defined in the EDMG-Header-A.

In some demonstrative embodiments, for example, in case of a non-zero spoofing error and if spoofing error duration is shorter than one OFDM symbol duration ($T_{OFDM-SYM}=T_{DFT}+T_{GI}$), the fractional part of OFDM symbol may be discarded.

In some demonstrative embodiments, for example, in case of a non-zero spoofing error and if spoofing error duration is longer than or equal to OFDM symbol duration, the one OFDM symbol and possible fractional part of OFDM symbol may be discarded. This second case may be, for example, signaled by a Spoofing error indicator bit defined in the EDMG-Header-B.

In some demonstrative embodiments, this described procedure may allow the receiver to unambiguously find the beginning of the TRN field, e.g., if one is appended to the MU PPDU.

In other embodiments, any other parameters, mechanism and/or calculation may be implemented to determine the PPDU time duration.

In some demonstrative embodiments, the space-time stream index per user $i_{STS\,i_{user}}$ may be mapped to the space-time stream index over all users $i_{STS}$, e.g., as follows:

$$i_{STS}(i_{user}, i_{STSi_{user}}) = \sum_{m=0}^{i_{user}-1} Num_m + i_{STSi_{user}},$$

$$1 \leq i_{STSi_{user}} \leq N_{STSi_{user}},$$

$$1 \leq i_{user} \leq N_{user}$$

$$Num_m = N_{STSm} \text{ for } m > 0 \text{ and } Num_m = 0 \text{ otherwise}$$

For example, the index $i_{STS}$ may be a function of the $i_{user}$ and $i_{STS\,i_{user}}$ indices. However, to simplify notations this dependence is not indicated explicitly in other equations.

In some demonstrative embodiments, one or more EDMG header fields of the EDMG PPDU may be configured to support superimposed codes, e.g., as described below.

In some demonstrative embodiments, the EDMG Header-A field and/or the EDMG Header-B field may be configured to support superimposed codes, e.g., as described below.

In some demonstrative embodiments, a "Superimposed Code Applied" field may be included in the EDMG-Header-A and/or the EDMG-Header-B, for example, if necessary to indicate a codeword length, e.g., for the 7/8 LDPC code.

In some demonstrative embodiments, the EDMG Header A field may be configured to include the "Superimposed Code Applied" field, e.g., as follows:

TABLE 5

EDMG-Header-A field structure and definition for a SU PPDU

| Field | Number of bits | Start bit | Description |
|---|---|---|---|
| Superimposed Code Applied | 1 | 15 | Set to 1 to indicate superimposed code with codeword length 672 or 1344 application for LDPC code with rate ⅞. Set to 0 to indicate puncturing code with codeword length 624 or 1248 application for LDPC code with rate ⅞. |

In some demonstrative embodiments, the EDMG Header B field may be configured to include the "Superimposed Code Applied" field, e.g., as follows:

TABLE 6

EDMG-Header-B field structure and definition

| Field | Number of bits | Start bit | Description |
|---|---|---|---|
| Superimposed Code Applied | 1 | 35 | Set to 1 to indicate superimposed code with codeword length 672 or 1344 application for LDPC code with rate ⅞. |

TABLE 6-continued

EDMG-Header-B field structure and definition

| Field | Number of bits | Start bit | Description |
|---|---|---|---|
| | | | Set to 0 to indicate puncturing code with codeword length 624 or 1248 application for LDPC code with rate ⅞. |

In some demonstrative embodiments, one or more header fields, for example, one or more EDMG header fields, of the EDMG PPDU may be configured to provide Modulation and Coding Scheme (MCS) related information, for example, which may be configured to support the encoding of the PPDU, e.g., according to the vertical encoding approach.

In some demonstrative embodiments, an EDMG-Header-A, e.g., EDMG-Header-A 208 (FIG. 2), and/or an EDMG-Header-B, e.g., EDMG-Header-B 216 (FIG. 2), of the EDMG PPDU may be configured to include one or more MCS-related subfields, which may be configured and/or defined to support the vertical encoding approach, e.g., as described below.

In some demonstrative embodiments, controller 124 may be configured to cause, trigger, and/or control the wireless station implemented by device 102 to generate an EDMG Header field of an EDMG PPDU, for example, EDMG PPDU 200 (FIG. 2), e.g., as described below.

In some demonstrative embodiments, the EDMG Header field may include a base MCS subfield to indicate a base MCS, and one or more differential MCS subfields corresponding to one or more spatial streams, e.g., as described below.

In some demonstrative embodiments, the base MCS may include a lowest index MCS, and a differential MCS subfield corresponding to a spatial stream is to indicate an MCS of the spatial stream relative to the base MCS, e.g., as described below.

In some demonstrative embodiments, the base MCS subfield may include 5 bits, and a differential MCS subfield may include two bits, e.g., as described below.

In other embodiments, the base MCS subfield and the differential MCS subfield may include any other number of bits.

In some demonstrative embodiments, controller 124 may be configured to cause, trigger, and/or control the wireless station implemented by device 102 to include the base MCS subfield and the one or more differential MCS subfields in an EDMG Header A, e.g., EDMG-Header-A 208 (FIG. 2), of the EDMG PPDU, for example, when the EDMG PPDU includes an EDMG SU PPDU, e.g., as described below.

In some demonstrative embodiments, the EDMG Header A may include up to eight differential MCS subfields corresponding to up to eight respective spatial streams, e.g., as described below. In other embodiments, any other number of differential MCS subfields may be supported.

In some demonstrative embodiments, controller 124 may be configured to cause, trigger, and/or control the wireless station implemented by device 102 to include the base MCS subfield and the one or more differential MCS subfields in an EDMG Header B, e.g., EDMG-Header-B 216 (FIG. 2), for a user, for example, when the EDMG PPDU includes an EDMG MU PPDU, e.g., as described below.

In some demonstrative embodiments, one or more new subfield definitions may be implemented for the EDMG-Header-A and/or EDMG-Header-B of EDMG PPDUs, for example, to support the use of a vertical MIMO encoding procedure, e.g., as described below.

In some demonstrative embodiments, in case of channel aggregation is used, one or more fields of the EDMG-Header-A and/or EDMG-Header-B may be configured to support a case in which streams transmitted in different aggregated channels may have different coding rates, e.g., as described below.

In some demonstrative embodiments, it may not be advantageous to implement the following definition for an EDMG-MCS subfield within the EDMG-Header-A field of a single-user (SU) EDMG PPDU:

TABLE 7

| EDMG-MCS | 21 | 41 | If the number of SSs, as indicated by the Number of SS field, is 4 or less, the EDMG-MSC field is as defined in Table 25. Otherwise, the EDMG-MCS field is as defined in Table 26. |
|---|---|---|---| wherein "Table 25" and "Table 26" are defined as:

TABLE 8

"Table 25-EDMG-MCS field destination when the number of spatial streams is 4 or less"

| Subfield | Number of bits | Start bit | Description |
|---|---|---|---|
| EDMG-MCS1 | 5 | 0 | Indicates the modulation and coding scheme for the first spatial stream. |
| EDMG-MCS2 | 5 | 5 | Indicates the modulation and coding scheme for the second spatial stream. This field is reserved if the number of spatial streams is 1. |
| EDMG-MCS3 | 5 | 10 | Indicates the modulation and coding scheme for the third spatial stream. This field is reserved if the value of the number of spatial streams is 2 or less. |
| EDMG-MCS4 | 5 | 15 | Indicates the modulation and coding scheme for the fourth spatial scheme. This field is reserved if the value of the number of spatial streams is 3 or less. |
| Reserved | 1 | 20 | Set to 0 by the transmitter and ignored by the receiver. |

TABLE 9

"Table 26-EDMG-MCS field definition when the number of spatial streams is 5 or greater"

| Subfield | Number of bits | Start bit | Description |
|---|---|---|---|
| Base MCS | 5 | 0 | Indicates the lowest index of the modulation and coding scheme that is used to define the modulation and coding scheme of the spatial streams. |
| Differential EDMG-MCS1 | 2 | 5 | Each of these differential MCS subfields is set as follows: 0: indicates the same MCS as the |
| Differential EDMG-MCS2 | 2 | 7 | Base MCS subfield with the same code rate |
| Differential EDMG-MCS3 | 2 | 9 | 1: indicates one higher order modulation than the Base MSC subfield with the same code rate |
| Differential EDMG-MCS4 | 2 | 11 | 2: indicates two higher order modulation than the Base MSC subfield with the same code rate |
| Differential EDMG-MCS5 | 2 | 13 | 3: indicates three higher order modulation than the Base MSC subfield with the same code rate The Differential EDMG-MCS6 |
| Differential EDMG-MCS6 | 2 | 15 | subfield is reserved if the number of spatial streams is 5. The Differential EDMG-MCS subfield |
| Differential EDMG-MCS7 | 2 | 17 | is reserved if the value of the number of spatial streams is 6 or less. The Differential |
| Differential EDMG-MCS8 | 2 | 19 | EDMG-MCS6 subfield is reserved if the number of spatial streams is 7 or less. If the MCS indicated by the value of the Base MCS subfield has a code rate of ½, then a code rate of ⅝ shall be used for any differential MCS that indicates 64-QAM modulation. |

For example, a signaling according to the above definition may not be adequate to support a case in which a plurality of streams, e.g., some streams or even all streams, use the same code rate, e.g., in vertical MIMO.

In some demonstrative embodiments, an EDMG-Header-A signaling scheme may be configured according to a signaling approach, which may be suitable to support a case in which a plurality of streams, e.g., some streams or even all streams, use the same code rate, e.g., in vertical MIMO, as described below.

In some demonstrative embodiments, a "Base MCS" may be defined as the MCS with a lowest index among the ones used in all spatial streams.

In some demonstrative embodiments, the Base MCS may be signaled using 5 bits, e.g., as described below. In other embodiments, any other number of bits may be used.

In some demonstrative embodiments, a differential MCS signaling may be implemented to indicate the MCS of each spatial stream, for example, with respect to the Base MCS.

In some demonstrative embodiments, a 2-bit differential MCS signaling is used to indicate the MCS of each spatial stream with respect to the Base MCS, e.g., as described below. In other embodiments, any other number of bits may be used.

In some demonstrative embodiments, the differential MCS may be configured according to the following encoding:

0: indicates the same MCS as the Base MCS subfield

1: indicates one higher order modulation than the Base MCS subfield with the same code rate;

2: indicates two higher order modulation than the Base MCS subfield with the same code rate;

3: indicates three higher order modulation than the Base MCS subfield with the same code rate.

In other embodiments, the differential MCS may be encoded according to any other encoding scheme.

In some demonstrative embodiments, according to an EDMG-Header-A signaling scheme, the EDMG-MCS subfield within the EDMG-Header-A field of a single-user (SU) EDMG PPDU may be defined, e.g., as follows:

TABLE 10

"Table 24-EDMG-Header-A field structure and definition for a SU PPDU"

| Field | Number of bits | Start bit | Description |
|---|---|---|---|
| EDMG-MCS | 21 | 41 | The EDMG-MCS field is as defined in Table 26. | where "Table 26" may be defined, e.g., as:

TABLE 11

"Table 26-EDMG-MCS field definition"

| Field | Number of bits | Start bit | Description |
|---|---|---|---|
| Base MCS | 5 | 0 | Indicates the lowest index of the modulation and coding scheme that is used to define the modulation and coding scheme of the spatial streams. |
| Differential EDMG-MCS1 | 2 | 5 | Each of these differential MCS subfields is set as follows: |
| Differential EDMG-MCS2 | 2 | 7 | 0: indicates the same MCS as the Base MCS subfield |
| Differential EDMG-MCS3 | 2 | 9 | 1: indicates one higher order modulation than the Base MCS subfield with the same code rate |
| Differential EDMG-MCS4 | 2 | 11 | 2: indicates two higher order modulation than the Base MCS subfield with the same code rate |
| Differential EDMG-MCS5 | 2 | 13 | 3: indicates three higher order modulation than the Base MCS subfield with the same code rate |
| Differential EDMG-MCS6 | 2 | 15 | If the MCS indicated by the value of the Base MCS subfield has a code rate of ½, then a code rate of ⅝ shall be used for any differential MCS that indicates 64-QAM modulation. |
| Differential EDMG-MCS7 | 2 | 17 | |
| Differential EDMG-MCS8 | 2 | 19 | |

For example, the Table 8 (also referred as "Table 25") listed above may not be needed according to this signaling scheme.

In some demonstrative embodiments, it may not be advantageous to implement the following definition for EDMG-MCS subfields within the EDMG-Header-B field of an MU EDMG PPDU:

TABLE 12

| Field | Number of bits | Start bit | Description |
|---|---|---|---|
| EDMG-MCS1 | 5 | 29 | Indicates the modulation and coding scheme for the first spatial stream. If the IsSCPSDU field in the L-Header is equal to 1, this field contains a SC MCS index. If the IsSCPSDU field in the L-Header is equal to 0, this field contains an OFDM MCS index. |
| EDMG-MCS2 | 5 | 34 | Indicates the modulation and coding scheme for the second spatial stream and is reserved if the number of spatial streams is 1. If the IsSCPSDU field in the L-Header is equal to 1, this field contains a SC MCS index. If the |

TABLE 12-continued

| Field | Number of bits | Start bit | Description |
|---|---|---|---|
| | | | IsSCPSDU field in the L-Header is equal to 0, this field contains an OFDM MCS index. |

In some demonstrative embodiments, an EDMG-Header-B signaling scheme may be configured according to a signaling approach, which may be suitable to support a case in which a plurality of streams for a user, e.g., some streams or even all streams, use the same code rate, e.g., in vertical MIMO, as described below.

In some demonstrative embodiments, according to an EDMG-Header-B signaling scheme, the definition of the MC S-related subfields within the EDMG-Header-B field may be configured, for example, to support a vertical MIMO encoding scheme, e.g., as follows:

TABLE 13

"Table 31-EDMG-Header-B field structure and definition"

| Field | Number of bits | Start bit | Description |
|---|---|---|---|
| Base MCS | 5 | 29 | Indicates the lowest index of the modulation and coding scheme that is used to define the modulation and coding scheme of the spatial streams. |
| Differential EDMG-MCS1 | 2 | 34 | Each of the differential MCS subfields is set as follows: 0: indicates the same MCS as the |
| Differential EDMG-MCS2 | 2 | 36 | Base MCS subfield 1: indicates one higher order modulation than the Base MCS subfield with the same code rate 2: indicates two higher order modulation than the Base MCS subfield with the same code rate 3: indicates three higher order modulation than the Base MCS subfield with the same code rate If the MCS indicated by the value of the Base MCS subfield has a code rate of ½, then a code rate of ⅝ shall be used for any differential MCS that indicates 64-QAM modulation. |

In some demonstrative embodiments, devices 102 and/or 140 may be configured to communicate EDMG PPDUs according to a carrier aggregation scheme, for example, by communicating the EDMG PPDU over an aggregated channel bandwidth including an aggregation of channels, for example, a 2.16+2.16 GHz channel, a 4.32+4.32 GHz channel, and/or any other aggregated channel bandwidth.

In some demonstrative embodiments, the subfields of the EDMG-Header-A and/or the EDMG-Header-B, e.g., as described above, may be implemented to also support a case in which channel aggregation is used, for example, such that the spatial streams transmitted over different aggregated channels have the same code rate.

In some demonstrative embodiments, the subfields of the EDMG-Header-A and/or the EDMG-Header-B subfields may be configured, e.g., as described below, for example, to support a case of an encoding scheme in which the streams transmitted in different channels may have different coding rates, among other possible schemes.

In some demonstrative embodiments, for example, in a case of a channel aggregation encoding scheme where streams transmitted in different channels may have different coding rates and/or in any other encoding scheme, the EDMG-Header-A may be configured, e.g., as follows:

TABLE 14

"Table 24.B-EDMG-Header-A field structure and definition for a SU PPDU"

| Field | Number of bits | Start bit | Description |
|---|---|---|---|
| EDMG-MCS | 22 | 41 | The EDMG-MCS field is as defined in Table 26.B. |

TABLE 15

"Table 26.B-EDMG-MCS field definition"

| Field | Number of bits | Start bit | Description |
|---|---|---|---|
| Code Rate, channel contains primary 2.16 GHz channel | 3 | 0 | Indicates the code rate of spatial streams that are transmitted in the channel that contains the primary 2.16 GHz channel. The subfield is set as follows: 0: ½ 1: ⅝ 2: ¾ 3: ¹³⁄₁₆ 4: ⅞ 5: Reserved 6: Reserved 7: Reserved |
| Code Rate, channel contains only secondary 2.16 GHz channel(s) | 3 | 3 | Indicates the code rate of spatial streams that are transmitted in the channel only contain secondary 2.16 GHz channel(s). The subfield is set as follows: 0: ½ 1: ⅝ 2: ¾ 3: ¹³⁄₁₆ 4: ⅞ 5: Reserved 6: Reserved 7: Reserved |
| Modulation Stream 1 | 2 | 6 | Indicates the modulation scheme of each spatial stream. Each of these subfields is set as follows: 0: π/2-BPSK 1: π/2-QPSK 2: π/2-16-QAM 3: π/2-64-QAM/64NUC |
| Modulation Stream 2 | 2 | 8 | |
| Modulation Stream 3 | 2 | 10 | |
| Modulation Stream 4 | 2 | 12 | |
| Modulation Stream 5 | 2 | 14 | |
| Modulation Stream 6 | 2 | 16 | |
| Modulation Stream 7 | 2 | 18 | |
| Modulation Stream 8 | 2 | 20 | |

In some demonstrative embodiments, for example, in a case of a channel aggregation encoding scheme where streams transmitted in different channels may have different coding rates and/or in any other encoding scheme, the EDMG-Header-B may be configured, e.g., as follows:

TABLE 16

"Table 31.B-EDMG-Header-B field structure and definition"

| Field | Number of bits | Start bit | Description |
|---|---|---|---|
| Code Rate, channel contains primary 2.16 GHz channel | 3 | 29 | Indicates the code rate of spatial streams that are transmitted in the channel that contains the primary 2.16 GHz channel. The subfield is set as follows: 0: ½ 1: ⅝ 2: ¾ 3: ¹³⁄₁₆ 4: ⅞ 5: Reserved 6: Reserved 7: Reserved |
| Code Rate, channel contains only secondary 2.16 GHz channel(s) | 3 | 32 | Indicates the code rate of spatial streams that are transmitted in the channel only contain secondary 2.16 GHz channel(s). The subfield is set as follows: 0: ½ 1: ⅝ 2: ¾ 3: ¹³⁄₁₆ 4: ⅞ 5: Reserved 6: Reserved 7: Reserved |
| Modulation Stream 1 | 2 | 35 | Indicates the modulation scheme of each spatial stream. Each of these subfields is set as follows: 0: π/2-BPSK 1: π/2-QPSK 2: π/2-16-QAM 3: π/2-64-QAM/64NUC |
| Modulation Stream 2 | 2 | 37 | |

Figure 9:
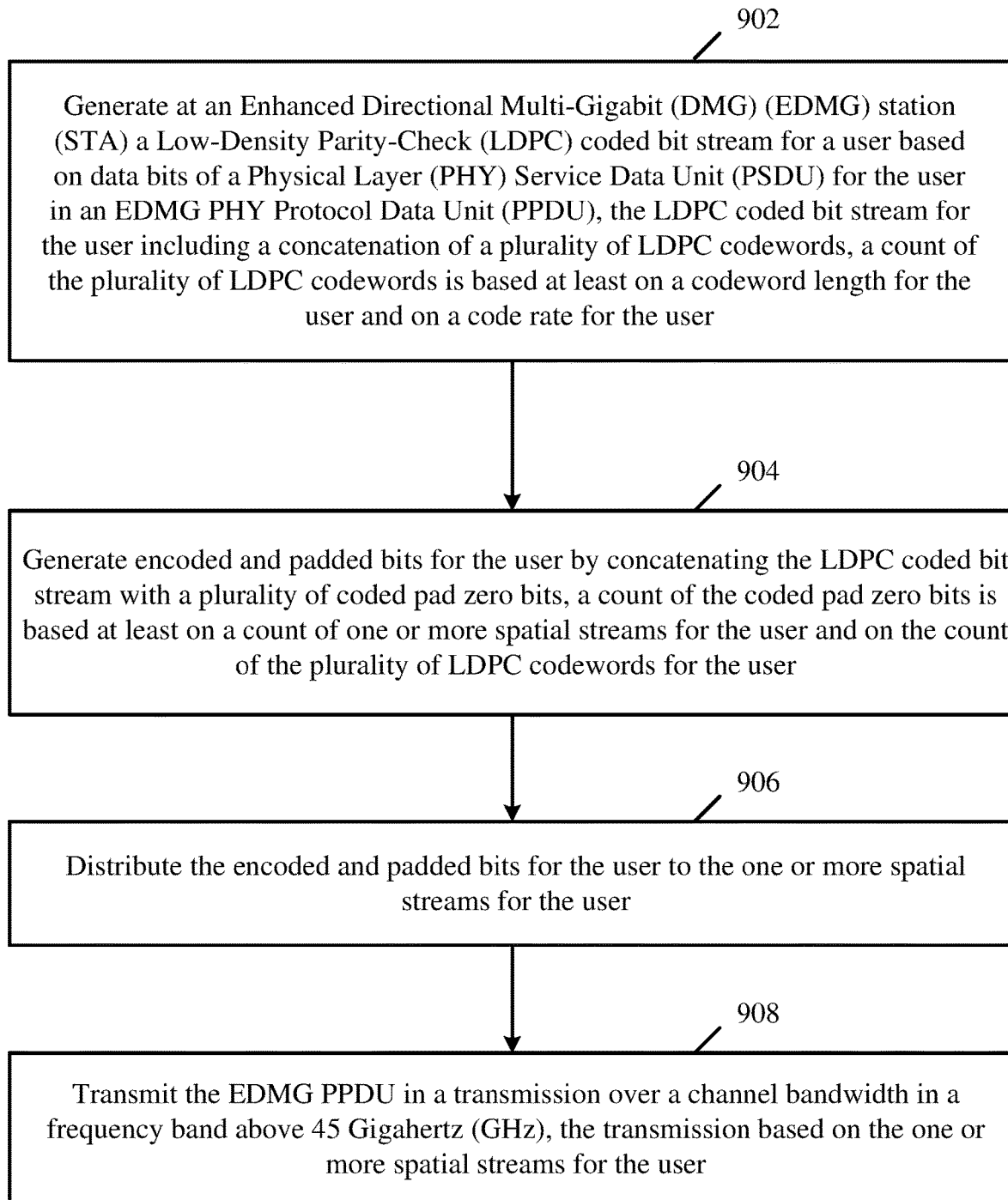
FIG. 9 is a schematic flow-chart illustration of a method of communicating a PPDU, in accordance with some demonstrative embodiments.

Reference is made to FIG. 9, which schematically illustrates a method of communicating a PPDU, in accordance with some demonstrative embodiments. For example, one or more of the operations of the method of FIG. 9 may be performed by one or more elements of a system, e.g., system 100 (FIG. 1), for example, one or more wireless devices, e.g., device 102 (FIG. 1), and/or device 140 (FIG. 1), a controller, e.g., controller 124 (FIG. 1) and/or controller 154 (FIG. 1), a radio, e.g., radio 114 (FIG. 1) and/or radio 144 (FIG. 1), and/or a message processor, e.g., message processor 128 (FIG. 1) and/or message processor 158 (FIG. 1).

As indicated at block 902, the method may include generating an LDPC coded bit stream for a user based on data bits of a PSDU for the user in an EDMG PPDU, the LDPC coded bit stream for the user including a concatenation of a plurality of LDPC codewords, a count of the plurality of LDPC codewords is based at least on a codeword length for the user and on a code rate for the user. For example, controller 124 (FIG. 1) may be configured to cause, trigger, and/or control device 102 (FIG. 1) to generate the LDPC coded bit stream for the user based on data bits of the PSDU for the user in the EDMG PPDU, e.g., as described above.

As indicated at block 904, the method may include generating encoded and padded bits for the user by concatenating the LDPC coded bit stream with a plurality of coded pad zero bits, a count of the coded pad zero bits is based at least on a count of one or more spatial streams for the user and on the count of the plurality of LDPC codewords for the user. For example, controller 124 (FIG. 1) may be configured to cause, trigger, and/or control device 102 (FIG. 1) to generate the encoded and padded bits for the user by concatenating the LDPC coded bit stream with the plurality of coded pad zero bits, e.g., as described above.

As indicated at block 906, the method may include distributing the encoded and padded bits for the user to the one or more spatial streams for the user. For example, controller 124 (FIG. 1) may be configured to cause, trigger, and/or control device 102 (FIG. 1) to distribute the encoded and padded bits for the user to the one or more spatial streams for the user, e.g., as described above.

As indicated at block 908, the method may include transmitting the EDMG PPDU in a transmission over a channel bandwidth in a frequency band above 45 GHz, the transmission based on the one or more spatial streams for the user. For example, controller 124 (FIG. 1) may be configured to cause, trigger, and/or control device 102 (FIG. 1) to transmit the EDMG PPDU in the transmission over the channel bandwidth in the frequency band above 45 GHz, e.g., as described above.

Figure 10:
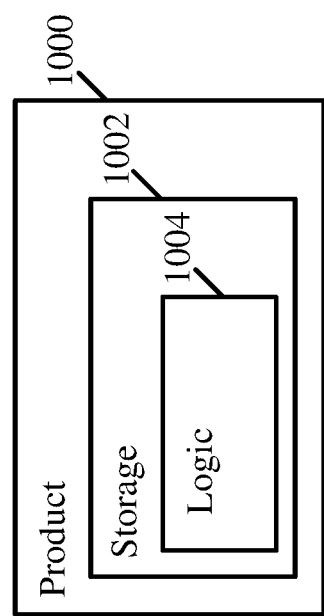
FIG. 10 is a schematic illustration of a product of manufacture, in accordance with some demonstrative embodiments.

Reference is made to FIG. 10, which schematically illustrates a product of manufacture 1000, in accordance with some demonstrative embodiments. Product 1000 may include one or more tangible computer-readable ("machine-readable") non-transitory storage media 1002, which may include computer-executable instructions, e.g., implemented by logic 1004, operable to, when executed by at least one computer processor, enable the at least one computer processor to implement one or more operations at device 102 (FIG. 1), device 140 (FIG. 1), radio 114 (FIG. 1), radio 144 (FIG. 1), transmitter 118 (FIG. 1), transmitter 148 (FIG. 1), receiver 116 (FIG. 1), receiver 146 (FIG. 1), message processor 128 (FIG. 1), message processor 158 (FIG. 1), controller 124 (FIG. 1), and/or controller 154 (FIG. 1), to cause device 102 (FIG. 1), device 140 (FIG. 1), radio 114 (FIG. 1), radio 144 (FIG. 1), transmitter 118 (FIG. 1), transmitter 148 (FIG. 1), receiver 116 (FIG. 1), receiver 146 (FIG. 1), message processor 128 (FIG. 1), message processor 158 (FIG. 1), controller 124 (FIG. 1), and/or controller 154 (FIG. 1) to perform, trigger and/or implement one or more operations and/or functionalities, and/or to perform, trigger and/or implement one or more operations and/or functionalities described with reference to the FIGS. 1, 2, 3, 4, 5, 6, 7, 8, and/or 9, and/or one or more operations described herein. The phrases "non-transitory machine-readable medium" and "computer-readable non-transitory storage media" may be directed to include all machine and/or computer readable media, with the sole exception being a transitory propagating signal.

In some demonstrative embodiments, product 1000 and/or machine readable storage media 1002 may include one or more types of computer-readable storage media capable of storing data, including volatile memory, non-volatile memory, removable or non-removable memory, erasable or non-erasable memory, writeable or re-writeable memory, and the like. For example, machine readable storage media 1002 may include, RAM, DRAM, Double-Data-Rate DRAM (DDR-DRAM), SDRAM, static RAM (SRAM), ROM, programmable ROM (PROM), erasable programmable ROM (EPROM), electrically erasable programmable ROM (EEPROM), Compact Disk ROM (CD-ROM), Compact Disk Recordable (CD-R), Compact Disk Rewriteable (CD-RW), flash memory (e.g., NOR or NAND flash memory), content addressable memory (CAM), polymer memory, phase-change memory, ferroelectric memory, silicon-oxide-nitride-oxide-silicon (SONOS) memory, a disk, a floppy disk, a hard drive, an optical disk, a magnetic disk, a card, a magnetic card, an optical card, a tape, a cassette, and the like. The computer-readable storage media may include any suitable media involved with downloading or transferring a computer program from a remote computer to a requesting computer carried by data signals embodied in a carrier wave or other propagation medium through a communication link, e.g., a modem, radio or network connection.

In some demonstrative embodiments, logic 1004 may include instructions, data, and/or code, which, if executed by a machine, may cause the machine to perform a method, process and/or operations as described herein. The machine may include, for example, any suitable processing platform, computing platform, computing device, processing device, computing system, processing system, computer, processor, or the like, and may be implemented using any suitable combination of hardware, software, firmware, and the like.

In some demonstrative embodiments, logic 1004 may include, or may be implemented as, software, a software module, an application, a program, a subroutine, instructions, an instruction set, computing code, words, values, symbols, and the like. The instructions may include any suitable type of code, such as source code, compiled code, interpreted code, executable code, static code, dynamic code, and the like. The instructions may be implemented according to a predefined computer language, manner or syntax, for instructing a processor to perform a certain function. The instructions may be implemented using any suitable high-level, low-level, object-oriented, visual, compiled and/or interpreted programming language, such as C, C++, Java, BASIC, Matlab, Pascal, Visual BASIC, assembly language, machine code, and the like.

EXAMPLES

The following examples pertain to further embodiments.

Example 1 includes an apparatus comprising logic and circuitry configured to cause an Enhanced Directional Multi-Gigabit (DMG) (EDMG) station (STA) to generate a Low-Density Parity-Check (LDPC) coded bit stream for a user based on data bits of a Physical Layer (PHY) Service Data Unit (PSDU) for the user in an EDMG PHY Protocol Data Unit (PPDU), the LDPC coded bit stream for the user comprising a concatenation of a plurality of LDPC codewords, a count of the plurality of LDPC codewords is based at least on a codeword length for the user and on a code rate for the user; generate encoded and padded bits for the user by concatenating the LDPC coded bit stream with a plurality of coded pad zero bits, a count of the coded pad zero bits is based at least on a count of one or more spatial streams for the user and on the count of the plurality of LDPC codewords for the user; distribute the encoded and padded bits for the user to the one or more spatial streams for the user; and transmit the EDMG PPDU in a transmission over a channel bandwidth in a frequency band above 45 Gigahertz (GHz), the transmission based on the one or more spatial streams for the user.

Example 2 includes the subject matter of Example 1, and optionally, wherein the apparatus is configured to cause the EDMG STA to generate scrambled data bits by scrambling the data bits of the PSDU for the user; generate scrambled PSDU bits for the user by scrambling the scrambled data bits concatenated with a plurality of data pad zero bits for the user, a count of the plurality of data pad zero bits for the user is based at least on the count of the plurality of LDPC codewords for the user; and generate the LDPC coded bit stream for the user by converting the scrambled PSDU bits into the plurality of LDPC codewords according to the codeword length for the user and the code rate for the user.

Example 3 includes the subject matter of Example 2, and optionally, wherein the apparatus is configured to cause the EDMG STA to generate the encoded and padded bits for the user by scrambling the LDPC coded bit stream concatenated with the plurality of coded pad zero bits.

Example 4 includes the subject matter of Example 3, and optionally, wherein the apparatus is configured to cause the EDMG STA to scramble the data bits of the PSDU for the user using a scrambler sequence, to scramble the scrambled data bits concatenated with the plurality of data pad zero bits for the user using a first continuation of the scramble sequence, and to scramble the LDPC coded bit stream concatenated with the plurality of coded pad zero bits using a second continuation of the scrambler sequence.

Example 5 includes the subject matter of any one of Examples 1-4, and optionally, wherein the count of the coded pad zero bits is based on a count of one or more 2.16 Gigahertz (GHz) channels in the channel bandwidth for transmission of the EDMG PPDU.

Example 6 includes the subject matter of any one of Examples 1-5, and optionally, wherein the apparatus is configured to cause the EDMG STA to, when the EDMG PPDU comprises a Single Carrier (SC) PPDU, determine the count of the coded pad zero bits based on a count of SC symbol blocks for the user, the count of SC symbol blocks for the user is based at least on the count of one or more spatial streams for the user and the count of the plurality of LDPC codewords for the user.

Example 7 includes the subject matter of Example 6, and optionally, wherein the apparatus is configured to cause the EDMG STA to determine the count of SC symbol blocks for the user based on a count of symbols per SC symbol block, and a count of coded bits per symbol per spatial stream for the user.

Example 8 includes the subject matter of Example 6 or 7, and optionally, wherein the apparatus is configured to cause the EDMG STA to interleave a plurality of symbols in a SC symbol block for a spatial stream of the one or more spatial streams based at least on a count of 2.16 Gigahertz (GHz) channels in the channel bandwidth for transmission of the EDMG PPDU, and on a count of the one or more spatial streams.

Example 9 includes the subject matter of Example 8, and optionally, wherein the apparatus is configured to cause the EDMG STA to generate a permuted SC symbol block by permuting the SC symbol block according to an array of permutation indexes, the array of permutation indexes is based on a first permutation parameter and a second permutation parameter, the first and second permutation parameters are based at least on the count of 2.16 GHz channels in the channel bandwidth, the second permutation parameter is based on the first permutation parameter.

Example 10 includes the subject matter of Example 9, and optionally, wherein the apparatus is configured to cause the EDMG STA to permute the SC symbol block, denoted $d_{in}^{(i_{SS},q)}$, corresponding to a SC symbol block number q in an $i_{SS}$-th spatial stream, into a permuted SC symbol block, denoted $d_{out}^{(i_{SS},q)}$, as follows:

$$d_{out}^{(i_{SS},q)} = (d_{idx(0)}^{(i_{SS},q)}, d_{idx(1)}^{(i_{SS},q)}, \ldots, d_{idx(N_{SPB} \times N_{CB}-1)}^{(i_{SS},q)})$$

wherein:

$$d_{in}^{(i_{SS},q)} = (d_0^{(i_{SS},q)}, d_1^{(i_{SS},q)}, \ldots, d_{N_{SPB} \times N_{CB}-1}^{(i_{SS},q)})$$

wherein $N_{SPB} \times N_{CB}$ denotes a count of symbols per SC symbol block for the count of 2.16 GHz channels in the channel bandwidth, denoted $N_{CB}$, and idx( ) denotes a permutation index in the array of permutation indexes.

Example 11 includes the subject matter of Example 9 or 10, and optionally, wherein the array of permutation indexes, denoted idx, is defined as follows:

$$idx(j \times N_x + i) = N_y \times i + j,$$

where $i = 0, 1, \ldots, N_x - 1$ and $j = 0, 1, \ldots, N_y - 1$ $$x = \left( N_{SPB} \times N_{CB} \times \sum_{i_{SS}=1}^{N_{SSi_{user}}} N_{CBPSi_{user}i_{SS}} \right) / L_{CWi_{user}}$$

wherein:

$x \leq 3 \times N_{CB} : N_x = 2 \times N_{CB}$ $3 \times N_{CB} < x \leq 6 \times N_{CB} : N_x = 4 \times N_{CB}$ $6 \times N_{CB} < x \leq 12 \times N_{CB} : N_x = 8 \times N_{CB}$ $12 \times N_{CB} < x \leq 24 \times N_{CB} : N_x = 16 \times N_{CB}$ $x > 24 \times N_{CB} : N_x = 32 \times N_{CB}$ wherein:

$N_y = (N_{SPB} \times N_{CB})/N_x$ wherein $N_{SPB} \times N_{CB}$ denotes a count of symbols per SC symbol block for the count of 2.16 GHz channels in the channel bandwidth, denoted $N_{CB}$, $N_{SSi_{user}}$ denotes a count of spatial streams for an $i_{user}$-th user, $N_{CBPSi_{user}i_{SS}}$ denotes a count of coded bits per symbol for the $i_{user}$-th user and an $i_{SS}$-th spatial stream, and $L_{CWi_{user}}$ denotes an LDPC codeword length for the $i_{user}$-th user.

Example 12 includes the subject matter of any one of Examples 8-11, and optionally, wherein the SC symbol block comprises 16 Quadrature Amplitude Modulation (QAM) symbols or 64-QAM symbols.

Example 13 includes the subject matter of any one of Examples 1-5, and optionally, wherein the apparatus is configured to cause the EDMG STA to, when the EDMG PPDU comprises an Orthogonal Frequency Divisional Multiplexing (OFDM) PPDU, determine the count of the coded pad zero bits based on a count of OFDM symbols for the user, the count of OFDM symbols for the user is based at least on the count of one or more spatial streams for the user and on the count of the plurality of LDPC codewords for the user.

Example 14 includes the subject matter of Example 13, and optionally, wherein the apparatus is configured to cause the EDMG STA to determine the count of OFDM symbols for the user based on a count of data subcarriers, and on a count of coded bits per constellation point per spatial stream for the user.

Example 15 includes the subject matter of any one of Examples 1-14, and optionally, wherein the apparatus is configured to cause the EDMG STA to map the one or more spatial streams for the user to one or more space-time streams.

Example 16 includes the subject matter of any one of Examples 1-15, and optionally, wherein the apparatus is configured to cause the EDMG STA to generate an EDMG Header field of the EDMG PPDU, the EDMG Header field comprising a base Modulation and Coding Scheme (MCS)

subfield to indicate a base MCS, and one or more differential MCS subfields corresponding to the one or more spatial streams.

Example 17 includes the subject matter of Example 16, and optionally, wherein the base MCS comprises a lowest index MCS, and a differential MCS subfield corresponding to a spatial stream is to indicate an MCS of the spatial stream relative to the base MCS.

Example 18 includes the subject matter of Example 16 or 17, and optionally, wherein the base MCS subfield comprises 5 bits, and a differential MCS subfield comprises two bits.

Example 19 includes the subject matter of any one of Examples 16-18, and optionally, wherein the apparatus is configured to cause the EDMG STA to include the base MCS subfield and the one or more differential MCS subfields in an EDMG
Header A of the EDMG PPDU, when the EDMG PPDU comprises an EDMG Single User (SU) PPDU.

Example 20 includes the subject matter of Example 19, and optionally, wherein the EDMG Header A comprises up to eight differential MCS subfields corresponding to up to eight respective spatial streams.

Example 21 includes the subject matter of any one of Examples 16-18, and optionally, wherein the apparatus is configured to cause the EDMG STA to include the base MCS subfield and the one or more differential MCS subfields in an EDMG Header B for the user, when the EDMG PPDU comprises an EDMG Multi User (MU) PPDU.

Example 22 includes the subject matter of any one of Examples 1-21, and optionally, wherein the codeword length is 672, 1344, 624, or 1248, 504, 1008, 468, or 936.

Example 23 includes the subject matter of any one of Examples 1-22, and optionally, wherein the code rate is 7/8, 1/2, 2/3 or 5/6.

Example 24 includes the subject matter of any one of Examples 1-23, and optionally, wherein the EDMG PPDU comprises an EDMG Single User (SU) PPDU.

Example 25 includes the subject matter of any one of Examples 1-23, and optionally, wherein the EDMG PPDU comprises an EDMG Multi User (MU) PPDU comprising a plurality user PPDUs to a respective plurality of users.

Example 26 includes the subject matter of any one of Examples 1-25, and optionally, comprising a radio.

Example 27 includes the subject matter of any one of Examples 1-26, and optionally, comprising one or more antennas, a memory and a processor.

Example 28 includes a system of wireless communication comprising an Enhanced Directional Multi-Gigabit (DMG) (EDMG) wireless communication station (STA), the EDMG STA comprising a radio; a memory; a processor; one or more antennas; and a controller configured to cause the EDMG STA to generate a Low-Density Parity-Check (LDPC) coded bit stream for a user based on data bits of a Physical Layer (PHY) Service Data Unit (PSDU) for the user in an EDMG PHY Protocol Data Unit (PPDU), the LDPC coded bit stream for the user comprising a concatenation of a plurality of LDPC codewords, a count of the plurality of LDPC codewords is based at least on a codeword length for the user and on a code rate for the user; generate encoded and padded bits for the user by concatenating the LDPC coded bit stream with a plurality of coded pad zero bits, a count of the coded pad zero bits is based at least on a count of one or more spatial streams for the user and on the count of the plurality of LDPC codewords for the user; distribute the encoded and padded bits for the user to the one or more spatial streams for the user; and transmit the EDMG PPDU in a transmission over a channel bandwidth in a frequency band above 45 Gigahertz (GHz), the transmission based on the one or more spatial streams for the user.

Example 29 includes the subject matter of Example 28, and optionally, wherein the controller is configured to cause the EDMG STA to generate scrambled data bits by scrambling the data bits of the PSDU for the user; generate scrambled PSDU bits for the user by scrambling the scrambled data bits concatenated with a plurality of data pad zero bits for the user, a count of the plurality of data pad zero bits for the user is based at least on the count of the plurality of LDPC codewords for the user; and generate the LDPC coded bit stream for the user by converting the scrambled PSDU bits into the plurality of LDPC codewords according to the codeword length for the user and the code rate for the user.

Example 30 includes the subject matter of Example 29, and optionally, wherein the controller is configured to cause the EDMG STA to generate the encoded and padded bits for the user by scrambling the LDPC coded bit stream concatenated with the plurality of coded pad zero bits.

Example 31 includes the subject matter of Example 30, and optionally, wherein the controller is configured to cause the EDMG STA to scramble the data bits of the PSDU for the user using a scrambler sequence, to scramble the scrambled data bits concatenated with the plurality of data pad zero bits for the user using a first continuation of the scramble sequence, and to scramble the LDPC coded bit stream concatenated with the plurality of coded pad zero bits using a second continuation of the scrambler sequence.

Example 32 includes the subject matter of any one of Examples 28-31, and optionally, wherein the count of the coded pad zero bits is based on a count of one or more 2.16 Gigahertz (GHz) channels in the channel bandwidth for transmission of the EDMG PPDU.

Example 33 includes the subject matter of any one of Examples 28-32, and optionally, wherein the controller is configured to cause the EDMG STA to, when the EDMG PPDU comprises a Single Carrier (SC) PPDU, determine the count of the coded pad zero bits based on a count of SC symbol blocks for the user, the count of SC symbol blocks for the user is based at least on the count of one or more spatial streams for the user and the count of the plurality of LDPC codewords for the user.

Example 34 includes the subject matter of Example 33, and optionally, wherein the controller is configured to cause the EDMG STA to determine the count of SC symbol blocks for the user based on a count of symbols per SC symbol block, and a count of coded bits per symbol per spatial stream for the user.

Example 35 includes the subject matter of Example 33 or 34, and optionally, wherein the controller is configured to cause the EDMG STA to interleave a plurality of symbols in a SC symbol block for a spatial stream of the one or more spatial streams based at least on a count of 2.16 Gigahertz (GHz) channels in the channel bandwidth for transmission of the EDMG PPDU, and on a count of the one or more spatial streams.

Example 36 includes the subject matter of Example 35, and optionally, wherein the controller is configured to cause the EDMG STA to generate a permuted SC symbol block by permuting the SC symbol block according to an array of permutation indexes, the array of permutation indexes is based on a first permutation parameter and a second permutation parameter, the first and second permutation parameters are based at least on the count of 2.16 GHz channels in the channel bandwidth, the second permutation parameter is based on the first permutation parameter.

Example 37 includes the subject matter of Example 36, and optionally, wherein the controller is configured to cause the EDMG STA to permute the SC symbol block, denoted $d_{in}^{(iSS,q)}$, corresponding to a SC symbol block number q in an $i_{SS}$-th spatial stream, into a permuted SC symbol block, denoted $d_{out}^{(iSS,q)}$, as follows:

$$d_{out}^{(iSS,q)} = (d_{idx(0)}^{(iSS,q)}, d_{idx(1)}^{(iSS,q)}, \ldots, d_{idx(N_{SPB} \times N_{CB}-1)}^{(iSS,q)})$$

wherein:

$$d_{in}^{(iSS,q)} = (d_0^{(iSS,q)}, d_1^{(iSS,q)}, \ldots, d_{N_{SPB} \times N_{CB}-1}^{(iSS,q)})$$

wherein $N_{SPB} \times N_{CB}$ denotes a count of symbols per SC symbol block for the count of 2.16 GHz channels in the channel bandwidth, denoted $N_{CB}$, and idx( ) denotes a permutation index in the array of permutation indexes.

Example 38 includes the subject matter of Example 36 or 37, and optionally, wherein the array of permutation indexes, denoted idx, is defined as follows:

$$idx(j \times N_x + i) = N_y \times i + j,$$

where $i = 0, 1, \ldots, N_x - 1$ and $j = 0, 1, \ldots, N_y - 1$ $$x = \left(N_{SPB} \times N_{CB} \times \sum_{i_{SS}=1}^{N_{SSi_{user}}} N_{CBPSi_{user}i_{SS}}\right) / L_{CWi_{user}}$$

wherein:

$x \le 3 \times N_{CB} : N_x = 2 \times N_{CB}$ $3 \times N_{CB} < x \le 6 \times N_{CB} : N_x = 4 \times N_{CB}$ $6 \times N_{CB} < x \le 12 \times N_{CB} : N_x = 8 \times N_{CB}$ $12 \times N_{CB} < x \le 24 \times N_{CB} : N_x = 16 \times N_{CB}$ $x > 24 \times N_{CB} : N_x = 32 \times N_{CB}$ wherein:

$N_y = (N_{SPB} \times N_{CB}) / N_x$ wherein $N_{SPB} \times N_{CB}$ denotes a count of symbols per SC symbol block for the count of 2.16 GHz channels in the channel bandwidth, denoted $N_{CB}$, $N_{SSi_{user}}$ denotes a count of spatial streams for an $i_{user}$-th user, $N_{CBPSi_{user}i_{SS}}$ denotes a count of coded bits per symbol for the $i_{user}$-th user and an $i_{SS}$-th spatial stream, and $L_{CWi_{user}}$ denotes an LDPC codeword length for the $i_{user}$-th user.

Example 39 includes the subject matter of any one of Examples 35-38, and optionally, wherein the SC symbol block comprises 16 Quadrature Amplitude Modulation (QAM) symbols or 64-QAM symbols.

Example 40 includes the subject matter of any one of Examples 28-32, and optionally, wherein the controller is configured to cause the EDMG STA to, when the EDMG PPDU comprises an Orthogonal Frequency Divisional Multiplexing (OFDM) PPDU, determine the count of the coded pad zero bits based on a count of OFDM symbols for the user, the count of OFDM symbols for the user is based at least on the count of one or more spatial streams for the user and on the count of the plurality of LDPC codewords for the user.

Example 41 includes the subject matter of Example 40, and optionally, wherein the controller is configured to cause the EDMG STA to determine the count of OFDM symbols for the user based on a count of data subcarriers, and on a count of coded bits per constellation point per spatial stream for the user.

Example 42 includes the subject matter of any one of Examples 28-41, and optionally, wherein the controller is configured to cause the EDMG STA to map the one or more spatial streams for the user to one or more space-time streams.

Example 43 includes the subject matter of any one of Examples 28-42, and optionally, wherein the controller is configured to cause the EDMG STA to generate an EDMG Header field of the EDMG PPDU, the EDMG Header field comprising a base Modulation and Coding Scheme (MCS) subfield to indicate a base MCS, and one or more differential MCS subfields corresponding to the one or more spatial streams.

Example 44 includes the subject matter of Example 43, and optionally, wherein the base MCS comprises a lowest index MCS, and a differential MCS subfield corresponding to a spatial stream is to indicate an MCS of the spatial stream relative to the base MCS.

Example 45 includes the subject matter of Example 43 or 44, and optionally, wherein the base MCS subfield comprises 5 bits, and a differential MCS subfield comprises two bits.

Example 46 includes the subject matter of any one of Examples 43-45, and optionally, wherein the controller is configured to cause the EDMG STA to include the base MCS subfield and the one or more differential MCS subfields in an EDMG Header A of the EDMG PPDU, when the EDMG PPDU comprises an EDMG Single User (SU) PPDU.

Example 47 includes the subject matter of Example 46, and optionally, wherein the EDMG Header A comprises up to eight differential MCS subfields corresponding to up to eight respective spatial streams.

Example 48 includes the subject matter of any one of Examples 43-45, and optionally, wherein the controller is configured to cause the EDMG STA to include the base MCS subfield and the one or more differential MCS subfields in an EDMG Header B for the user, when the EDMG PPDU comprises an EDMG Multi User (MU) PPDU.

Example 49 includes the subject matter of any one of Examples 28-48, and optionally, wherein the codeword length is 672, 1344, 624, or 1248, 504, 1008, 468, or 936.

Example 50 includes the subject matter of any one of Examples 28-49, and optionally, wherein the code rate is 7/8, 1/2, 2/3 or 5/6.

Example 51 includes the subject matter of any one of Examples 28-50, and optionally, wherein the EDMG PPDU comprises an EDMG Single User (SU) PPDU.

Example 52 includes the subject matter of any one of Examples 28-50, and optionally, wherein the EDMG PPDU comprises an EDMG Multi User (MU) PPDU comprising a plurality user PPDUs to a respective plurality of users.

Example 53 includes a method to be performed at an Enhanced Directional Multi-Gigabit (DMG) (EDMG) wireless communication station (STA), the method comprising generating a Low-Density Parity-Check (LDPC) coded bit stream for a user based on data bits of a Physical Layer (PHY) Service Data Unit (PSDU) for the user in an EDMG PHY Protocol Data Unit (PPDU), the LDPC coded bit stream for the user comprising a concatenation of a plurality of LDPC codewords, a count of the plurality of LDPC codewords is based at least on a codeword length for the user and on a code rate for the user; generating encoded and padded bits for the user by concatenating the LDPC coded bit stream with a plurality of coded pad zero bits, a count of the coded pad zero bits is based at least on a count of one or more spatial streams for the user and on the count of the plurality of LDPC codewords for the user; distributing the encoded and padded bits for the user to the one or more spatial streams for the user; and transmitting the EDMG PPDU in a transmission over a channel bandwidth in a frequency band above 45 Gigahertz (GHz), the transmission based on the one or more spatial streams for the user.

Example 54 includes the subject matter of Example 53, and optionally, comprising generating scrambled data bits by scrambling the data bits of the PSDU for the user; generating scrambled PSDU bits for the user by scrambling the scrambled data bits concatenated with a plurality of data pad zero bits for the user, a count of the plurality of data pad zero bits for the user is based at least on the count of the plurality of LDPC codewords for the user; and generating the LDPC coded bit stream for the user by converting the scrambled PSDU bits into the plurality of LDPC codewords according to the codeword length for the user and the code rate for the user.

Example 55 includes the subject matter of Example 54, and optionally, comprising generating the encoded and padded bits for the user by scrambling the LDPC coded bit stream concatenated with the plurality of coded pad zero bits.

Example 56 includes the subject matter of Example 55, and optionally, comprising scrambling the data bits of the PSDU for the user using a scrambler sequence, scrambling the scrambled data bits concatenated with a plurality of data pad zero bits for the user using a first continuation of the scramble sequence, and scrambling the LDPC coded bit stream concatenated with the plurality of coded pad zero bits using a second continuation of the scrambler sequence.

Example 57 includes the subject matter of any one of Examples 53-56, and optionally, wherein the count of the coded pad zero bits is based on a count of one or more 2.16 Gigahertz (GHz) channels in the channel bandwidth for transmission of the EDMG PPDU.

Example 58 includes the subject matter of any one of Examples 53-57, and optionally, comprising, when the EDMG PPDU comprises a Single Carrier (SC) PPDU, determining the count of the coded pad zero bits based on a count of SC symbol blocks for the user, the count of SC symbol blocks for the user is based at least on the count of one or more spatial streams for the user and the count of the plurality of LDPC codewords for the user.

Example 59 includes the subject matter of Example 58, and optionally, comprising determining the count of SC symbol blocks for the user based on a count of symbols per SC symbol block, and a count of coded bits per symbol per spatial stream for the user.

Example 60 includes the subject matter of Example 58 or 59, and optionally, comprising interleaving a plurality of symbols in a SC symbol block for a spatial stream of the one or more spatial streams based at least on a count of 2.16 Gigahertz (GHz) channels in the channel bandwidth for transmission of the EDMG PPDU, and on a count of the one or more spatial streams.

Example 61 includes the subject matter of Example 60, and optionally, comprising generating a permuted SC symbol block by permuting the SC symbol block according to an array of permutation indexes, the array of permutation indexes is based on a first permutation parameter and a second permutation parameter, the first and second permutation parameters are based at least on the count of 2.16 GHz channels in the channel bandwidth, the second permutation parameter is based on the first permutation parameter.

Example 62 includes the subject matter of Example 61, and optionally, comprising permuting the SC symbol block, denoted $d_{in}^{(iSS,q)}$, corresponding to a SC symbol block number q in an $i_{SS}$-th spatial stream, into a permuted SC symbol block, denoted $d_{out}^{(iSS,q)}$, as follows:

$$d_{out}^{(iSS,q)} = (d_{idx(0)}^{(iSS,q)}, d_{idx(1)}^{(iSS,q)}, \ldots, d_{idx(N_{SPB} \times N_{CB}-1)}^{(iSS,q)})$$

wherein:

$$d_{in}^{(iSS,q)} = (d_0^{(iSS,q)}, d_1^{(iSS,q)}, \ldots, d_{N_{SPB} \times N_{CB}-1}^{(iSS,q)})$$

wherein $N_{SPB} \times N_{CB}$ denotes a count of symbols per SC symbol block for the count of 2.16 GHz channels in the channel bandwidth, denoted $N_{CB}$, and idx( ) denotes a permutation index in the array of permutation indexes.

Example 63 includes the subject matter of Example 61 or 62, and optionally, wherein the array of permutation indexes, denoted idx, is defined as follows:

$$idx(j \times N_x + i) = N_y \times i + j,$$

where $i = 0, 1, \ldots, N_x - 1$ and $j = 0, 1, \ldots, N_y - 1$ $$x = \left(N_{SPB} \times N_{CB} \times \sum_{i_{SS}=1}^{N_{SSi_{user}}} N_{CBPSi_{user} i_{SS}}\right) / L_{CW i_{user}}$$

wherein:

$x \leq 3 \times N_{CB} : N_x = 2 \times N_{CB}$ $3 \times N_{CB} < x \leq 6 \times N_{CB} : N_x = 4 \times N_{CB}$ $6 \times N_{CB} < x \leq 12 \times N_{CB} : N_x = 8 \times N_{CB}$ $12 \times N_{CB} < x \leq 24 \times N_{CB} : N_x = 16 \times N_{CB}$ $x > 24 \times N_{CB} : N_x = 32 \times N_{CB}$ wherein:

$N_y = (N_{SPB} \times N_{CB}) / N_x$ wherein $N_{SPB} \times N_{CB}$ denotes a count of symbols per SC symbol block for the count of 2.16 GHz channels in the channel bandwidth, denoted $N_{CB}$, $N_{SSi_{user}}$ denotes a count of spatial streams for an $i_{user}$-th user, $N_{CBPSi_{user} i_{SS}}$ denotes a count of coded bits per symbol for the $i_{user}$-th user and an $i_{SS}$-th spatial stream, and $L_{CW i_{user}}$ denotes an LDPC codeword length for the $i_{user}$-th user.

Example 64 includes the subject matter of any one of Examples 60-63, and optionally, wherein the SC symbol block comprises 16 Quadrature Amplitude Modulation (QAM) symbols or 64-QAM symbols.

Example 65 includes the subject matter of any one of Examples 53-57, and optionally, comprising, when the EDMG PPDU comprises an Orthogonal Frequency Divisional Multiplexing (OFDM) PPDU, determining the count of the coded pad zero bits based on a count of OFDM symbols for the user, the count of OFDM symbols for the user is based at least on the count of one or more spatial streams for the user and on the count of the plurality of LDPC codewords for the user.

Example 66 includes the subject matter of Example 65, and optionally, comprising determining the count of OFDM symbols for the user based on a count of data subcarriers, and on a count of coded bits per constellation point per spatial stream for the user.

Example 67 includes the subject matter of any one of Examples 53-66, and optionally, comprising mapping the one or more spatial streams for the user to one or more space-time streams.

Example 68 includes the subject matter of any one of Examples 53-67, and optionally, comprising generating an EDMG Header field of the EDMG PPDU, the EDMG Header field comprising a base Modulation and Coding Scheme (MCS) subfield to indicate a base MCS, and one or more differential MCS subfields corresponding to the one or more spatial streams.

Example 69 includes the subject matter of Example 68, and optionally, wherein the base MCS comprises a lowest index MCS, and a differential MCS subfield corresponding to a spatial stream is to indicate an MCS of the spatial stream relative to the base MCS.

Example 70 includes the subject matter of Example 68 or 69, and optionally, wherein the base MCS subfield comprises 5 bits, and a differential MCS subfield comprises two bits.

Example 71 includes the subject matter of any one of Examples 68-70, and optionally, comprising causing the EDMG STA to include the base MCS subfield and the one or more differential MCS subfields in an EDMG Header A of the EDMG PPDU, when the EDMG PPDU comprises an EDMG Single User (SU) PPDU.

Example 72 includes the subject matter of Example 71, and optionally, wherein the EDMG Header A comprises up to eight differential MCS subfields corresponding to up to eight respective spatial streams.

Example 73 includes the subject matter of any one of Examples 68-70, and optionally, comprising causing the EDMG STA to include the base MCS subfield and the one or more differential MCS subfields in an EDMG Header B for the user, when the EDMG PPDU comprises an EDMG Multi User (MU) PPDU.

Example 74 includes the subject matter of any one of Examples 53-73, and optionally, wherein the codeword length is 672, 1344, 624, or 1248, 504, 1008, 468, or 936.

Example 75 includes the subject matter of any one of Examples 53-74, and optionally, wherein the code rate is 7/8, 1/2, 2/3 or 5/6.

Example 76 includes the subject matter of any one of Examples 53-75, and optionally, wherein the EDMG PPDU comprises an EDMG Single User (SU) PPDU.

Example 77 includes the subject matter of any one of Examples 53-75, and optionally, wherein the EDMG PPDU comprises an EDMG Multi User (MU) PPDU comprising a plurality user PPDUs to a respective plurality of users.

Example 78 includes a product comprising one or more tangible computer-readable non-transitory storage media comprising computer-executable instructions operable to, when executed by at least one processor, enable the at least one processor to cause an Enhanced Directional Multi-Gigabit (DMG) (EDMG) wireless communication station (STA) to generate a Low-Density Parity-Check (LDPC) coded bit stream for a user based on data bits of a Physical Layer (PHY) Service Data Unit (PSDU) for the user in an EDMG PHY Protocol Data Unit (PPDU), the LDPC coded bit stream for the user comprising a concatenation of a plurality of LDPC codewords, a count of the plurality of LDPC codewords is based at least on a codeword length for the user and on a code rate for the user; generate encoded and padded bits for the user by concatenating the LDPC coded bit stream with a plurality of coded pad zero bits, a count of the coded pad zero bits is based at least on a count of one or more spatial streams for the user and on the count of the plurality of LDPC codewords for the user;

distribute the encoded and padded bits for the user to the one or more spatial streams for the user; and transmit the EDMG PPDU in a transmission over a channel bandwidth in a frequency band above 45 Gigahertz (GHz), the transmission based on the one or more spatial streams for the user.

Example 79 includes the subject matter of Example 78, and optionally, wherein the instructions, when executed, cause the EDMG STA to generate scrambled data bits by scrambling the data bits of the PSDU for the user; generate scrambled PSDU bits for the user by scrambling the scrambled data bits concatenated with a plurality of data pad zero bits for the user, a count of the plurality of data pad zero bits for the user is based at least on the count of the plurality of LDPC codewords for the user; and generate the LDPC coded bit stream for the user by converting the scrambled PSDU bits into the plurality of LDPC codewords according to the codeword length for the user and the code rate for the user.

Example 80 includes the subject matter of Example 79, and optionally, wherein the instructions, when executed, cause the EDMG STA to generate the encoded and padded bits for the user by scrambling the LDPC coded bit stream concatenated with the plurality of coded pad zero bits.

Example 81 includes the subject matter of Example 80, and optionally, wherein the instructions, when executed, cause the EDMG STA to scramble the data bits of the PSDU for the user using a scrambler sequence, to scramble the scrambled data bits concatenated with the plurality of data pad zero bits for the user using a first continuation of the scramble sequence, and to scramble the LDPC coded bit stream concatenated with the plurality of coded pad zero bits using a second continuation of the scrambler sequence.

Example 82 includes the subject matter of any one of Examples 78-81, and optionally, wherein the count of the coded pad zero bits is based on a count of one or more 2.16 Gigahertz (GHz) channels in the channel bandwidth for transmission of the EDMG PPDU.

Example 83 includes the subject matter of any one of Examples 78-82, and optionally, wherein the instructions, when executed, cause the EDMG STA to, when the EDMG PPDU comprises a Single Carrier (SC) PPDU, determine the count of the coded pad zero bits based on a count of SC symbol blocks for the user, the count of SC symbol blocks for the user is based at least on the count of one or more spatial streams for the user and the count of the plurality of LDPC codewords for the user.

Example 84 includes the subject matter of Example 83, and optionally, wherein the instructions, when executed, cause the EDMG STA to determine the count of SC symbol blocks for the user based on a count of symbols per SC symbol block, and a count of coded bits per symbol per spatial stream for the user.

Example 85 includes the subject matter of Example 83 or 84, and optionally, wherein the instructions, when executed, cause the EDMG STA to interleave a plurality of symbols in a SC symbol block for a spatial stream of the one or more spatial streams based at least on a count of 2.16 Gigahertz (GHz) channels in the channel bandwidth for transmission of the EDMG PPDU, and on a count of the one or more spatial streams.

Example 86 includes the subject matter of Example 85, and optionally, wherein the instructions, when executed, cause the EDMG STA to generate a permuted SC symbol block by permuting the SC symbol block according to an array of permutation indexes, the array of permutation indexes is based on a first permutation parameter and a second permutation parameter, the first and second permutation parameters are based at least on the count of 2.16 GHz channels in the channel bandwidth, the second permutation parameter is based on the first permutation parameter.

Example 87 includes the subject matter of Example 86, and optionally, wherein the instructions, when executed, cause the EDMG STA to permute the SC symbol block, denoted $d_{in}^{(iSS,q)}$, corresponding to a SC symbol block number q in an $i_{SS}$-th spatial stream, into a permuted SC symbol block, denoted $d_{out}^{(iSS,q)}$, as follows:

$$d_{out}^{(iSS,q)} = (d_{idx(0)}^{(iSS,q)}, d_{idx(1)}^{(iSS,q)}, \ldots, d_{idx(N_{SPB} \times N_{CB}-1)}^{(iSS,q)})$$

wherein:

$$d_{in}^{(iSS,q)} = (d_0^{(iSS,q)}, d_1^{(iSS,q)}, \ldots, d_{N_{SPB} \times N_{CB}-1}^{(iSS,q)})$$

wherein $N_{SPB} \times N_{CB}$ denotes a count of symbols per SC symbol block for the count of 2.16 GHz channels in the channel bandwidth, denoted $N_{CB}$, and idx( ) denotes a permutation index in the array of permutation indexes.

Example 88 includes the subject matter of Example 86 or 87, and optionally, wherein the array of permutation indexes, denoted idx, is defined as follows:

$$idx(j \times N_x + i) = N_y \times i + j,$$

where $i = 0, 1, \ldots, N_x - 1$ and $j = 0, 1, \ldots, N_y - 1$ $$x = \left(N_{SPB} \times N_{CB} \times \sum_{i_{SS}=1}^{N_{SSi_{user}}} N_{CBPSi_{user}i_{SS}}\right) / L_{CWi_{user}}$$

wherein:

$x \leq 3 \times N_{CB}: N_x = 2 \times N_{CB}$ $3 \times N_{CB} < x \leq 6 \times N_{CB}: N_x = 4 \times N_{CB}$ $6 \times N_{CB} < x \leq 12 \times N_{CB}: N_x = 8 \times N_{CB}$ $12 \times N_{CB} < x \leq 24 \times N_{CB}: N_x = 16 \times N_{CB}$ $x > 24 \times N_{CB}: N_x = 32 \times N_{CB}$ wherein:

$N_y = (N_{SPB} \times N_{CB}) / N_x$ wherein $N_{SPB} \times N_{CB}$ denotes a count of symbols per SC symbol block for the count of 2.16 GHz channels in the channel bandwidth, denoted $N_{CB}$, $N_{SSi_{user}}$ denotes a count of spatial streams for an $i_{user}$-th user, $N_{CBPSi_{user}i_{SS}}$ denotes a count of coded bits per symbol for the $i_{user}$-th user and an $i_{SS}$-th spatial stream, and $L_{CWi_{user}}$ denotes an LDPC codeword length for the $i_{user}$-th user.

Example 89 includes the subject matter of any one of Examples 85-88, and optionally, wherein the SC symbol block comprises 16 Quadrature Amplitude Modulation (QAM) symbols or 64-QAM symbols.

Example 90 includes the subject matter of any one of Examples 78-82, and optionally, wherein the instructions, when executed, cause the EDMG STA to, when the EDMG PPDU comprises an Orthogonal Frequency Divisional Multiplexing (OFDM) PPDU, determine the count of the coded pad zero bits based on a count of OFDM symbols for the user, the count of OFDM symbols for the user is based at least on the count of one or more spatial streams for the user and on the count of the plurality of LDPC codewords for the user.

Example 91 includes the subject matter of Example 90, and optionally, wherein the instructions, when executed, cause the EDMG STA to determine the count of OFDM symbols for the user based on a count of data subcarriers, and on a count of coded bits per constellation point per spatial stream for the user.

Example 92 includes the subject matter of any one of Examples 78-91, and optionally, wherein the instructions, when executed, cause the EDMG STA to map the one or more spatial streams for the user to one or more space-time streams.

Example 93 includes the subject matter of any one of Examples 78-92, and optionally, wherein the instructions, when executed, cause the EDMG STA to generate an EDMG Header field of the EDMG PPDU, the EDMG Header field comprising a base Modulation and Coding Scheme (MCS) subfield to indicate a base MCS, and one or more differential MCS subfields corresponding to the one or more spatial streams.

Example 94 includes the subject matter of Example 93, and optionally, wherein the base MCS comprises a lowest index MCS, and a differential MCS subfield corresponding to a spatial stream is to indicate an MCS of the spatial stream relative to the base MCS.

Example 95 includes the subject matter of Example 93 or 94, and optionally, wherein the base MCS subfield comprises 5 bits, and a differential MCS subfield comprises two bits.

Example 96 includes the subject matter of any one of Examples 93-95, and optionally, wherein the instructions, when executed, cause the EDMG STA to include the base MCS subfield and the one or more differential MCS subfields in an EDMG Header A of the EDMG PPDU, when the EDMG PPDU comprises an EDMG Single User (SU) PPDU.

Example 97 includes the subject matter of Example 96, and optionally, wherein the EDMG Header A comprises up to eight differential MCS subfields corresponding to up to eight respective spatial streams.

Example 98 includes the subject matter of any one of Examples 93-95, and optionally, wherein the instructions, when executed, cause the EDMG STA to include the base MCS subfield and the one or more differential MCS subfields in an EDMG Header B for the user, when the EDMG PPDU comprises an EDMG Multi User (MU) PPDU.

Example 99 includes the subject matter of any one of Examples 78-98, and optionally, wherein the codeword length is 672, 1344, 624, or 1248, 504, 1008, 468, or 936.

Example 100 includes the subject matter of any one of Examples 78-99, and optionally, wherein the code rate is 7/8, 1/2, 2/3 or 5/6.

Example 101 includes the subject matter of any one of Examples 78-100, and optionally, wherein the EDMG PPDU comprises an EDMG Single User (SU) PPDU.

Example 102 includes the subject matter of any one of Examples 78-100, and optionally, wherein the EDMG PPDU comprises an EDMG Multi User (MU) PPDU comprising a plurality user PPDUs to a respective plurality of users.

Example 103 includes an apparatus of wireless communication by an Enhanced Directional Multi-Gigabit (DMG) (EDMG) wireless communication station (STA), the apparatus comprising means for generating a Low-Density Parity-Check (LDPC) coded bit stream for a user based on data bits of a Physical Layer (PHY) Service Data Unit (PSDU) for the user in an EDMG PHY Protocol Data Unit (PPDU), the LDPC coded bit stream for the user comprising a concatenation of a plurality of LDPC codewords, a count of the plurality of LDPC codewords is based at least on a codeword length for the user and on a code rate for the user; means for generating encoded and padded bits for the user by concatenating the LDPC coded bit stream with a plurality of coded pad zero bits, a count of the coded pad zero bits is based at least on a count of one or more spatial streams for the user and on the count of the plurality of LDPC codewords for the user; means for distributing the encoded and padded bits for the user to the one or more spatial streams for the user; and means for transmitting the EDMG PPDU in a transmission over a channel bandwidth in a frequency band above 45 Gigahertz (GHz), the transmission based on the one or more spatial streams for the user.

Example 104 includes the subject matter of Example 103, and optionally, comprising means for generating scrambled data bits by scrambling the data bits of the PSDU for the user; means for generating scrambled PSDU bits for the user by scrambling the scrambled data bits concatenated with a plurality of data pad zero bits for the user, a count of the plurality of data pad zero bits for the user is based at least on the count of the plurality of LDPC codewords for the user; and means for generating the LDPC coded bit stream for the user by converting the scrambled PSDU bits into the plurality of LDPC codewords according to the codeword length for the user and the code rate for the user.

Example 105 includes the subject matter of Example 104, and optionally, comprising means for generating the encoded and padded bits for the user by scrambling the LDPC coded bit stream concatenated with the plurality of coded pad zero bits.

Example 106 includes the subject matter of Example 105, and optionally, comprising means for scrambling the data bits of the PSDU for the user using a scrambler sequence, scrambling the scrambled data bits concatenated with the plurality of data pad zero bits for the user using a first continuation of the scramble sequence, and scrambling the LDPC coded bit stream concatenated with the plurality of coded pad zero bits using a second continuation of the scrambler sequence.

Example 107 includes the subject matter of any one of Examples 103-106, and optionally, wherein the count of the coded pad zero bits is based on a count of one or more 2.16 Gigahertz (GHz) channels in the channel bandwidth for transmission of the EDMG PPDU.

Example 108 includes the subject matter of any one of Examples 103-107, and optionally, comprising means for, when the EDMG PPDU comprises a Single Carrier (SC) PPDU, determining the count of the coded pad zero bits based on a count of SC symbol blocks for the user, the count of SC symbol blocks for the user is based at least on the count of one or more spatial streams for the user and the count of the plurality of LDPC codewords for the user.

Example 109 includes the subject matter of Example 108, and optionally, comprising means for determining the count of SC symbol blocks for the user based on a count of symbols per SC symbol block, and a count of coded bits per symbol per spatial stream for the user.

Example 110 includes the subject matter of Example 108 or 109, and optionally, comprising means for interleaving a plurality of symbols in a SC symbol block for a spatial stream of the one or more spatial streams based at least on a count of 2.16 Gigahertz (GHz) channels in the channel bandwidth for transmission of the EDMG PPDU, and on a count of the one or more spatial streams.

Example 111 includes the subject matter of Example 110, and optionally, comprising means for generating a permuted SC symbol block by permuting the SC symbol block according to an array of permutation indexes, the array of permutation indexes is based on a first permutation parameter and a second permutation parameter, the first and second permutation parameters are based at least on the count of 2.16 GHz channels in the channel bandwidth, the second permutation parameter is based on the first permutation parameter.

Example 112 includes the subject matter of Example 111, and optionally, comprising means for permuting the SC symbol block, denoted $d_{in}^{(iSS,q)}$, corresponding to a SC symbol block number q in an $i_{SS}$-th spatial stream, into a permuted SC symbol block, denoted $d_{in}^{(iSS,q)}$, as follows:

$$d_{out}^{(iSS,q)} = (d_{idx(0)}^{(iSS,q)}, d_{idx(1)}^{(iSS,q)}, \ldots, d_{idx(N_{SPB} \times N_{CB}-1)}^{(iSS,q)})$$

wherein:

$$d_{in}^{(iSS,q)} = (d_0^{(iSS,q)}, d_1^{(iSS,q)}, \ldots, d_{N_{SPB} \times N_{CB}-1}^{(iSS,q)})$$

wherein $N_{SPB} \times N_{CB}$ denotes a count of symbols per SC symbol block for the count of 2.16 GHz channels in the channel bandwidth, denoted $N_{CB}$, and idx( ) denotes a permutation index in the array of permutation indexes.

Example 113 includes the subject matter of Example 111 or 112, and optionally, wherein the array of permutation indexes, denoted idx, is defined as follows:

$$idx(j \times N_x + i) = N_y \times i + j,$$

where $i = 0, 1, \ldots, N_x - 1$ and $j = 0, 1, \ldots, N_y - 1$ $$x = \left(N_{SPB} \times N_{CB} \times \sum_{i_{SS}=1}^{N_{SSi_{user}}} N_{CBPSi_{user}i_{SS}}\right) / L_{CW_{i_{user}}}$$

wherein:

$x \le 3 \times N_{CB} : N_x = 2 \times N_{CB}$ $3 \times N_{CB} < x \le 6 \times N_{CB} : N_x = 4 \times N_{CB}$ $6 \times N_{CB} < x \le 12 \times N_{CB} : N_x = 8 \times N_{CB}$ $12 \times N_{CB} < x \le 24 \times N_{CB} : N_x = 16 \times N_{CB}$ $x > 24 \times N_{CB} : N_x = 32 \times N_{CB}$ wherein:

$N_y = (N_{SPB} \times N_{CB}) / N_x$ wherein $N_{SPB} \times N_{CB}$ denotes a count of symbols per SC symbol block for the count of 2.16 GHz channels in the channel bandwidth, denoted $N_{CB}$, $N_{SSi_{user}}$ denotes a count of spatial streams for an $i_{user}$-th user, $N_{CBPSi_{user} i_{SS}}$ denotes a count of coded bits per symbol for the $i_{user}$-th user and an $i_{SS}$-th spatial stream, and $L_{CW_{i_{user}}}$ denotes an LDPC codeword length for the $i_{user}$-th user.

Example 114 includes the subject matter of any one of Examples 110-113, and optionally, wherein the SC symbol block comprises 16 Quadrature Amplitude Modulation (QAM) symbols or 64-QAM symbols.

Example 115 includes the subject matter of any one of Examples 103-107, and optionally, comprising means for, when the EDMG PPDU comprises an Orthogonal Frequency Divisional Multiplexing (OFDM) PPDU, determining the count of the coded pad zero bits based on a count of OFDM symbols for the user, the count of OFDM symbols for the user is based at least on the count of one or more spatial streams for the user and on the count of the plurality of LDPC codewords for the user.

Example 116 includes the subject matter of Example 115, and optionally, comprising means for determining the count of OFDM symbols for the user based on a count of data subcarriers, and on a count of coded bits per constellation point per spatial stream for the user.

Example 117 includes the subject matter of any one of Examples 103-116, and optionally, comprising means for mapping the one or more spatial streams for the user to one or more space-time streams.

Example 118 includes the subject matter of any one of Examples 103-117, and optionally, comprising means for generating an EDMG Header field of the EDMG PPDU, the EDMG Header field comprising a base Modulation and Coding Scheme (MCS) subfield to indicate a base MCS, and one or more differential MCS subfields corresponding to the one or more spatial streams.

Example 119 includes the subject matter of Example 118, and optionally, wherein the base MCS comprises a lowest index MCS, and a differential MCS subfield corresponding to a spatial stream is to indicate an MCS of the spatial stream relative to the base MCS.

Example 120 includes the subject matter of Example 118 or 119, and optionally, wherein the base MCS subfield comprises 5 bits, and a differential MCS subfield comprises two bits.

Example 121 includes the subject matter of any one of Examples 118-120, and optionally, comprising means for causing the EDMG STA to include the base MCS subfield and the one or more differential MCS subfields in an EDMG Header A of the EDMG PPDU, when the EDMG PPDU comprises an EDMG Single User (SU) PPDU.

Example 122 includes the subject matter of Example 121, and optionally, wherein the EDMG Header A comprises up to eight differential MCS subfields corresponding to up to eight respective spatial streams.

Example 123 includes the subject matter of any one of Examples 118-120, and optionally, comprising means for causing the EDMG STA to include the base MCS subfield and the one or more differential MCS subfields in an EDMG Header B for the user, when the EDMG PPDU comprises an EDMG Multi User (MU) PPDU.

Example 124 includes the subject matter of any one of Examples 103-123, and optionally, wherein the codeword length is 672, 1344, 624, or 1248, 504, 1008, 468, or 936.

Example 125 includes the subject matter of any one of Examples 103-124, and optionally, wherein the code rate is 7/8, 1/2, 2/3 or 5/6.

Example 126 includes the subject matter of any one of Examples 103-125, and optionally, wherein the EDMG PPDU comprises an EDMG Single User (SU) PPDU.

Example 127 includes the subject matter of any one of Examples 103-125, and optionally, wherein the EDMG PPDU comprises an EDMG Multi User (MU) PPDU comprising a plurality user PPDUs to a respective plurality of users.

Functions, operations, components and/or features described herein with reference to one or more embodiments, may be combined with, or may be utilized in combination with, one or more other functions, operations, components and/or features described herein with reference to one or more other embodiments, or vice versa.

While certain features have been illustrated and described herein, many modifications, substitutions, changes, and equivalents may occur to those skilled in the art. It is, therefore, to be understood that the appended claims are intended to cover all such modifications and changes as fall within the true spirit of the disclosure.

What is claimed is:

1. An apparatus comprising:
a processor comprising logic and circuitry configured to cause an Enhanced Directional Multi-Gigabit (DMG) (EDMG) wireless communication station (STA) to:
determine a count of data pad bits for a user based on a count of Low-Density Parity-Check (LDPC) codewords for the user, an LDPC codeword length for the user, an LDPC code rate for the user, and a length of a Physical Layer (PHY) Service Data Unit (PSDU) for the user;
determine scrambled PSDU bits for the user based on a concatenation of a scrambled PSDU for the user concatenated with a first plurality of zero bits, a count of zero bits in the first plurality of zero bits is equal to the count of data pad bits for the user;
convert the scrambled PSDU bits for the user into a plurality of LDPC codewords for the user;
generate a coded bitstream for the user based on the plurality of LDPC codewords for the user;
determine a count of coded pad bits for the user based on a count of Orthogonal Frequency Division Multiplexing (OFDM) symbols for the user, the count of LDPC codewords for the user, and the LDPC codeword length for the user;
generate encoded padded bits for the user based on a concatenation of bits of the coded bitstream for the user concatenated with a second plurality of zero bits, a count of zero bits in the second plurality of zero bits is equal to the count of coded pad bits for the user;
distribute the encoded padded bits for the user to one or more spatial streams for the user based on a count of coded bits per constellation point per spatial stream for the user; and
transmit an EDMG OFDM PHY Protocol Data Unit (PPDU) based on the one or more spatial streams for the user; and
a memory to store information processed by the processor.

2. The apparatus of claim 1 configured to distribute the encoded padded bits for the user to the one or more spatial streams for the user on a group basis according to the count of coded bits per constellation point per spatial stream for the user.

3. The apparatus of claim 1 configured to distribute a plurality of groups of the encoded padded bits for the user to a plurality of spatial streams for the user by distributing a first group of encoded padded bits to a first spatial steam and distributing a second group of encoded padded bits to a second spatial steam; and repeating the distributing of the plurality of groups of the encoded padded bits for the user to the plurality of spatial streams for the user until all the encoded padded bits for the user are distributed over the plurality of spatial streams for the user.

4. The apparatus of claim 1 configured to determine the count of coded pad bits for an $i_{user}$-th user, denoted $$N_{SYM\_PAD_{i_{user}}},$$

as follows:

$$N_{SYM\_PAD_{i_{user}}} = N_{SYMS_{i_{user}}} \cdot N_{SD} \cdot \sum_{i_{SS}=1}^{N_{SS_{i_{user}}}} N_{BPSC_{i_{user}i_{SS}}} - N_{CW_{i_{user}}} \cdot L_{CW_{i_{user}}}$$

wherein $N_{SYMS_{i_{user}}}$ denotes the count of OFDM symbols for the $i_{user}$-th user, $N_{SD}$ denotes a count of data subcarriers, $N_{SS_{i_{user}}}$ denotes a count of spatial streams for the $i_{user}$-th user, $N_{CBPS_{i_{user}i_{SS}}}$ denotes a count of coded bits per constellation point for the $i_{user}$-th user and an $i_{SS}$-th spatial stream, $N_{CW\ i_{user}}$ denotes the count of LDPC codewords for the $i_{user}$-th user, and $L_{CW\ i_{user}}$ denotes the LDPC codeword length for the $i_{user}$-th user.

5. The apparatus of claim 1 configured to determine the count of OFDM symbols for an $i_{user}$-th user $N_{SYMS_{i_{user}}}$, denoted as follows:

$$N_{SYMS_{i_{user}}} = \left\lceil \frac{N_{CW_{i_{user}}} \cdot L_{CW_{i_{user}}}}{N_{SD} \cdot \sum_{i_{SS}=1}^{N_{SS_{i_{user}}}} N_{BPSC_{i_{user}i_{SS}}}} \right\rceil$$

wherein $N_{CW\ i_{user}}$ denotes the count of LDPC codewords for the $i_{user}$-th user, $L_{CW\ i_{user}}$ denotes the LDPC codeword length for the $i_{user}$-th user, $N_{SD}$ denotes a count of data subcarriers, $N_{SS_{i_{user}}}$ denotes a count of spatial streams for the $i_{user}$-th user, and $N_{BPSC_{user}\ i_{SS}}$ denotes a count of coded bits per constellation point for the $i_{user}$-th user and an $i_{SS}$-th spatial stream.

6. The apparatus of claim 1 configured to cause the EDMG STA to set the count of OFDM symbols for the user to be equal to a sum of a determined count of OFDM symbols for the user and a value of one, when the determined count of OFDM symbols for the user is odd and Space Time Block Coding (STBC) is to be applied for the EDMG OFDM PPDU.

7. The apparatus of claim 1 configured to cause the EDMG STA to determine the count of data pad bits for an $i_{user}$-th user, denoted $$N_{DATA\_PAD_{i_{user}}},$$

as follows:

$$N_{DATA\_PAD_{i_{user}}} = N_{CW_{i_{user}}} \cdot L_{CW_{i_{user}}} \cdot R_{i_{user}} - Length_{i_{user}} \cdot 8$$

wherein $N_{CW\ i_{user}}$ denotes the count of LDPC codewords for the $i_{user}$-th user, $L_{CW\ i_{user}}$ denotes the LDPC codeword length for the $i_{user}$-th user, $R_{i_{user}}$ denotes the LDPC code Length rate for the $i_{user}$-th user, and $Length_{i_{user}}$ denotes the length of the PSDU for the $i_{user}$-th user.

8. The apparatus of claim 1 configured to cause the EDMG STA to determine the count of LDPC codewords for the user based on the length of the PSDU for the user, the LDPC codeword length for the user, and the LDPC code rate for the user.

9. The apparatus of claim 1 configured to cause the EDMG STA to determine the count of LDPC codewords for an $i_{user}$-th user $N_{CW\ i_{user}\ i_{SS}}$, denoted as follows:

$$N_{CW_{i_{user}}} = \left\lceil \frac{Length_{i_{user}} \cdot 8}{L_{CW_{i_{user}}} \cdot R_{i_{user}}} \right\rceil$$

wherein $Length_{i_{user}}$ denotes the length of the PSDU for the $i_{user}$-th user, $L_{CW\ i_{user}}$ denotes the LDPC codeword length for the $i_{user}$-th user, and $R_{i_{user}}$ denotes the LDPC code rate for the $i_{user}$-th user.

10. The apparatus of claim 1 configured to cause the EDMG STA to transmit the EDMG OFDM PPDU comprising an EDMG OFDM Multi User (MU) PPDU comprising a plurality of user PPDUs for a respective plurality of users, and to align all of the plurality of user PPDUs in time.

11. The apparatus of claim 10 configured to cause the EDMG STA to determine a maximum number of OFDM symbols over all users, and to set the count of OFDM symbols for the user based on the maximum number of OFDM symbols over all users.

12. The apparatus of claim 11 configured to cause the EDMG STA to determine a count of pad OFDM symbols for the user by subtracting the count of OFDM symbols for the user from the maximum number of OFDM symbols.

13. The apparatus of claim 1 configured to cause the EDMG STA to convert the scrambled PSDU bits for the user into the plurality of LDPC codewords for the user based on the LDPC codeword length for the user, and the LDPC code rate for the user.

14. The apparatus of claim 1 configured to cause the EDMG STA to transmit the EDMG OFDM PPDU over a channel bandwidth of at least 2.16 Gigahertz (GHz) in a frequency band above 45 GHz.

15. The apparatus of claim 14 configured to cause the EDMG STA to transmit the EDMG OFDM PPDU over a channel bandwidth of 4.32 GHz, 6.48 GHz, or 8.64 GHz.

16. The apparatus of claim 1 comprising a radio, the processor configured to cause the radio to transmit the EDMG OFDM PPDU.

17. The apparatus of claim 16 comprising one or more antennas connected to the radio, and another processor to execute instructions of an operating system.

18. A product comprising one or more tangible computer-readable non-transitory storage media comprising computer-executable instructions operable to, when executed by at least one processor, enable the at least one processor to cause an Enhanced Directional Multi-Gigabit (DMG) (EDMG) wireless communication station (STA) to:

determine a count of data pad bits for a user based on a count of Low-Density Parity-Check (LDPC) codewords for the user, an LDPC codeword length for the user, an LDPC code rate for the user, and a length of a Physical Layer (PHY) Service Data Unit (PSDU) for the user;

determine scrambled PSDU bits for the user based on a concatenation of a scrambled PSDU for the user concatenated with a first plurality of zero bits, a count of zero bits in the first plurality of zero bits is equal to the count of data pad bits for the user;

convert the scrambled PSDU bits for the user into a plurality of LDPC codewords for the user;

generate a coded bitstream for the user based on the plurality of LDPC codewords for the user;

determine a count of coded pad bits for the user based on a count of Orthogonal Frequency Division Multiplexing (OFDM) symbols for the user, the count of LDPC codewords for the user, and the LDPC codeword length for the user;

generate encoded padded bits for the user based on a concatenation of bits of the coded bitstream for the user concatenated with a second plurality of zero bits, a count of zero bits in the second plurality of zero bits is equal to the count of coded pad bits for the user;

distribute the encoded padded bits for the user to one or more spatial streams for the user based on a count of coded bits per constellation point per spatial stream for the user; and transmit an EDMG OFDM PHY Protocol Data Unit (PPDU) based on the one or more spatial streams for the user.

19. The product of claim 18, wherein the instructions, when executed, cause the EDMG STA to distribute a plurality of groups of the encoded padded bits for the user to a plurality of spatial streams for the user by distributing a first group of encoded padded bits to a first spatial steam and distributing a second group of encoded padded bits to a second spatial steam; and repeating the distributing of the plurality of groups of the encoded padded bits for the user to the plurality of spatial streams for the user until all the encoded padded bits for the user are distributed over the plurality of spatial streams for the user.

20. The product of claim 18, wherein the instructions, when executed, cause the EDMG STA to determine the count of coded pad bits for an $i_{user}$-th user, denoted $$N_{SYM\_PADi_{user}},$$

as follows:

$$N_{SYM\_PADi_{user}} = N_{SYMSi_{user}} \cdot N_{SD} \cdot \sum_{i_{SS}=1}^{N_{SSi_{user}}} N_{BPSCi_{user}i_{SS}} - N_{CWi_{user}} \cdot L_{CWi_{user}}$$

wherein $N_{SYMSi_{user}}$ denotes the count of OFDM symbols for the $i_{user}$-th user, $N_{SD}$ denotes a count of data subcarriers, $N_{SSi_{user}}$ denotes a count of spatial streams for the $i_{user}$-th user, $N_{BPSCi_{user}i_{SS}}$ denotes a count of coded bits per constellation point for the $i_{user}$-th user and an $i_{SS}$-th spatial stream, $N_{CW\ i_{user}}$ denotes the count of LDPC codewords for the $i_{user}$-th user, and $L_{CW\ i_{user}}$ denotes the LDPC codeword length for the $i_{user}$-th user.

21. The product of claim 18, wherein the instructions, when executed, cause the EDMG STA to determine the count of OFDM symbols for an $i_{user}$-th user, denoted $N_{SYMSi_{user}}$, as follows:

$$N_{SYMSi_{user}} = \left\lceil \frac{N_{CWi_{user}} \cdot L_{CWi_{user}}}{N_{SD} \cdot \sum_{i_{SS}=1}^{N_{SSi_{user}}} N_{BPSCi_{user}i_{SS}}} \right\rceil$$

wherein $N_{CW\ i_{user}}$ denotes the count of LDPC codewords for the $i_{user}$-th user, $L_{CW\ i_{user}}$ denotes the LDPC codeword length for the $i_{user}$-th user, $N_{SD}$ denotes a count of data subcarriers, $N_{SSi_{user}}$ denotes a count of spatial streams for the $i_{user}$-th user, and $N_{BPSCi_{user}i_{SS}}$ denotes a count of coded bits per constellation point for the $i_{user}$-th user and an $i_{SS}$-th spatial stream.

22. The product of claim 18, wherein the instructions, when executed, cause the EDMG STA to transmit the EDMG OFDM PPDU comprising an EDMG OFDM Multi User (MU) PPDU comprising a plurality of user PPDUs for a respective plurality of users, and to align all of the plurality of user PPDUs in time.

23. An apparatus comprising:

means for causing an Enhanced Directional Multi-Gigabit (DMG) (EDMG) wireless communication station (STA) to generate encoded padded bits for a user by:

determining a count of data pad bits for a user based on a count of Low-Density Parity-Check (LDPC) codewords for the user, an LDPC codeword length for the user, an LDPC code rate for the user, and a length of a Physical Layer (PHY) Service Data Unit (PSDU) for the user;

determining scrambled PSDU bits for the user based on a concatenation of a scrambled PSDU for the user concatenated with a first plurality of zero bits, a count of zero bits in the first plurality of zero bits is equal to the count of data pad bits for the user;

converting the scrambled PSDU bits for the user into a plurality of LDPC codewords for the user;

generating a coded bitstream for the user based on the plurality of LDPC codewords for the user;

determining a count of coded pad bits for the user based on a count of Orthogonal Frequency Division Multiplexing (OFDM) symbols for the user, the count of LDPC codewords for the user, and the LDPC codeword length for the user; and generating the encoded padded bits for the user based on a concatenation of bits of the coded bitstream for the user concatenated with a second plurality of zero bits, a count of zero bits in the second plurality of zero bits is equal to the count of coded pad bits for the user;

means for causing the EDMG STA to distribute the encoded padded bits for the user to one or more spatial streams for the user based on a count of coded bits per constellation point per spatial stream for the user; and means for causing the EDMG STA to transmit an EDMG OFDM PHY Protocol Data Unit (PPDU) based on the one or more spatial streams for the user.

24. The apparatus of claim 23 comprising means for distributing a plurality of groups of the encoded padded bits for the user to a plurality of spatial streams for the user by distributing a first group of encoded padded bits to a first spatial steam and distributing a second group of encoded padded bits to a second spatial steam; and repeating the distributing of the plurality of groups of the encoded padded bits for the user to the plurality of spatial streams for the user until all the encoded padded bits for the user are distributed over the plurality of spatial streams for the user.

\* \* \* \* \*

UNITED STATES PATENT AND TRADEMARK OFFICE
CERTIFICATE OF CORRECTION

| | | |
|---|---|---|
| PATENT NO. | : 11,533,087 B2 | Page 1 of 1 |
| APPLICATION NO. | : 17/028309 | |
| DATED | : December 20, 2022 | |
| INVENTOR(S) | : Artyom Lomayev et al. | |

It is certified that error appears in the above-identified patent and that said Letters Patent is hereby corrected as shown below:

On the Title Page

Item (71), delete "INTEL IP CORPORATION, Santa Clara, CA (US)" and insert -- INTEL CORPORATION, Santa Clara, CA (US) --, therefor Signed and Sealed this
Twenty-fourth Day of January, 2023

Katherine Kelly Vidal
*Director of the United States Patent and Trademark Office*